United States Patent
Wheeler et al.

(10) Patent No.: US 10,360,147 B2
(45) Date of Patent: *Jul. 23, 2019

(54) DATA STORAGE LAYOUT

(71) Applicant: Micron Technology, Inc., Boise, ID (US)

(72) Inventors: Kyle B. Wheeler, Meridian, ID (US); Timothy P. Finkbeiner, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 132 days.

This patent is subject to a terminal disclaimer.

(21) Appl. No.: 15/692,274

(22) Filed: Aug. 31, 2017

(65) Prior Publication Data

US 2017/0364439 A1    Dec. 21, 2017

Related U.S. Application Data

(63) Continuation of application No. 14/714,999, filed on May 18, 2015, now Pat. No. 9,779,019.

(Continued)

(51) Int. Cl.
*G06F 12/06* (2006.01)
*G06F 12/02* (2006.01)
(Continued)

(52) U.S. Cl.
CPC ........ *G06F 12/0638* (2013.01); *G06F 12/023* (2013.01); *G06F 13/16* (2013.01);
(Continued)

(58) Field of Classification Search
CPC ......... G06F 13/1652; G06F 2212/1044; G06F 15/00; G06F 12/06; G06F 12/0893;
(Continued)

(56) References Cited

U.S. PATENT DOCUMENTS 4,380,046 A    4/1983  Fung
4,435,792 A    3/1984  Bechtolsheim
(Continued)

FOREIGN PATENT DOCUMENTS

CN    102141905    8/2011
EP    0214718      3/1987
(Continued)

OTHER PUBLICATIONS

Boyd et al., "On the General Applicability of Instruction-Set Randomization", Jul.-Sep. 2010, (14 pgs.), vol. 7, Issue 3, IEEE Transactions on Dependable and Secure Computing.
(Continued)

*Primary Examiner* — Mano Padmanabhan
*Assistant Examiner* — Jean C Edouard
(74) *Attorney, Agent, or Firm* — Brooks, Cameron & Huebsch, PLLC

(57) ABSTRACT

Examples of the present disclosure provide apparatuses and methods for determining a data storage layout. An example apparatus comprising a first address space of a memory array comprising a first number of memory cells coupled to a plurality of sense lines and to a first select line. The first address space is configured to store a logical representation of a first portion of a value. The example apparatus also comprising a second address space of the memory array comprising a second number of memory cells coupled to the plurality of sense lines and to a second select line. The second address space is configured to store a logical representation of a second portion of the value. The example apparatus also comprising sensing circuitry configured to receive the first value and perform a logical operation using the value without performing a sense line address access.

20 Claims, 16 Drawing Sheets

Related U.S. Application Data

(60) Provisional application No. 62/008,016, filed on Jun. 5, 2014.

(51) Int. Cl.
| | |
|---|---|
| *G11C 7/06* | (2006.01) |
| *G11C 7/08* | (2006.01) |
| *G11C 7/10* | (2006.01) |
| *G11C 11/4091* | (2006.01) |
| *G06F 13/16* | (2006.01) |

(52) U.S. Cl.
CPC ............... *G11C 7/065* (2013.01); *G11C 7/08* (2013.01); *G11C 7/1006* (2013.01); *G11C 11/4091* (2013.01); *G06F 2212/1044* (2013.01); *G06F 2212/205* (2013.01)

(58) Field of Classification Search
CPC ......... G06F 2212/2022; G06F 12/0638; G06F 2212/205; G06F 12/023; Y02B 60/1228; G11C 7/065; G11C 7/08; G11C 7/1006; G11C 11/5642; G11C 16/26; G11C 2211/5642; G11C 7/1039; G11C 16/0433; G11C 2207/2245
USPC ........................................................ 711/170
See application file for complete search history.

(56) References Cited

U.S. PATENT DOCUMENTS

| | | |
|---|---|---|
| 4,435,793 A | 3/1984 | Ochii |
| 4,727,474 A | 2/1988 | Batcher |
| 4,843,264 A | 6/1989 | Galbraith |
| 4,958,378 A | 9/1990 | Bell |
| 4,977,542 A | 12/1990 | Matsuda et al. |
| 5,023,838 A | 6/1991 | Herbert |
| 5,034,636 A | 7/1991 | Reis et al. |
| 5,201,039 A | 4/1993 | Sakamura |
| 5,210,850 A | 5/1993 | Kelly et al. |
| 5,253,308 A | 10/1993 | Johnson |
| 5,276,643 A | 1/1994 | Hoffman et al. |
| 5,325,500 A * | 6/1994 | Bell .................. G06F 9/38 711/157 |
| 5,325,519 A | 6/1994 | Long et al. |
| 5,367,488 A | 11/1994 | An |
| 5,379,257 A | 1/1995 | Matsumura et al. |
| 5,386,379 A | 1/1995 | Ali-Yahia et al. |
| 5,398,213 A | 3/1995 | Yeon et al. |
| 5,440,482 A | 8/1995 | Davis |
| 5,446,690 A | 8/1995 | Tanaka et al. |
| 5,473,576 A | 12/1995 | Matsui |
| 5,481,500 A | 1/1996 | Reohr et al. |
| 5,485,373 A | 1/1996 | Davis et al. |
| 5,506,811 A | 4/1996 | McLaury |
| 5,615,404 A | 3/1997 | Knoll et al. |
| 5,638,128 A | 6/1997 | Hoogenboom |
| 5,638,317 A | 6/1997 | Tran |
| 5,654,936 A | 8/1997 | Cho |
| 5,678,021 A | 10/1997 | Pawate et al. |
| 5,680,404 A | 10/1997 | Gray |
| 5,724,291 A | 3/1998 | Matano |
| 5,724,366 A | 3/1998 | Furutani |
| 5,751,987 A * | 5/1998 | Mahant-Shetti ...... G06F 9/3879 365/230.04 |
| 5,787,458 A | 7/1998 | Miwa |
| 5,854,636 A | 12/1998 | Watanabe et al. |
| 5,867,429 A | 2/1999 | Chen et al. |
| 5,870,504 A | 2/1999 | Nemoto et al. |
| 5,915,084 A | 6/1999 | Wendell |
| 5,935,263 A | 8/1999 | Keeth et al. |
| 5,986,942 A | 11/1999 | Sugibayashi |
| 5,991,209 A | 11/1999 | Chow |
| 5,991,785 A | 11/1999 | Alidina et al. |
| 6,005,799 A | 12/1999 | Rao |
| 6,009,020 A | 12/1999 | Nagata |
| 6,092,186 A | 7/2000 | Betker et al. |
| 6,122,211 A | 9/2000 | Morgan et al. |
| 6,125,071 A | 9/2000 | Kohno et al. |
| 6,134,164 A | 10/2000 | Lattimore et al. |
| 6,147,514 A | 11/2000 | Shiratake |
| 6,151,244 A | 11/2000 | Fujino et al. |
| 6,157,578 A | 12/2000 | Brady |
| 6,163,862 A | 12/2000 | Adams et al. |
| 6,166,942 A | 12/2000 | Vo et al. |
| 6,172,918 B1 | 1/2001 | Hidaka |
| 6,175,514 B1 | 1/2001 | Henderson |
| 6,181,698 B1 | 1/2001 | Hariguchi |
| 6,208,544 B1 | 3/2001 | Beadle et al. |
| 6,226,215 B1 | 5/2001 | Yoon |
| 6,301,153 B1 | 10/2001 | Takeuchi et al. |
| 6,301,164 B1 | 10/2001 | Manning et al. |
| 6,304,477 B1 | 10/2001 | Naji |
| 6,389,507 B1 | 5/2002 | Sherman |
| 6,418,498 B1 | 7/2002 | Martwick |
| 6,466,499 B1 | 10/2002 | Blodgett |
| 6,510,098 B1 | 1/2003 | Taylor |
| 6,563,754 B1 | 5/2003 | Lien et al. |
| 6,578,058 B1 | 6/2003 | Nygaard |
| 6,731,542 B1 | 5/2004 | Le et al. |
| 6,754,746 B1 | 6/2004 | Leung et al. |
| 6,768,679 B1 | 7/2004 | Le et al. |
| 6,807,614 B2 | 10/2004 | Chung |
| 6,816,422 B2 | 11/2004 | Harnade et al. |
| 6,819,612 B1 | 11/2004 | Achter |
| 6,894,549 B2 | 5/2005 | Eliason |
| 6,943,579 B1 | 9/2005 | Hazarichuk et al. |
| 6,948,056 B1 | 9/2005 | Roth |
| 6,950,771 B1 | 9/2005 | Fan et al. |
| 6,950,898 B2 | 9/2005 | Merritt et al. |
| 6,956,770 B2 | 10/2005 | Khalid et al. |
| 6,961,272 B2 | 11/2005 | Schreck |
| 6,965,648 B1 | 11/2005 | Smith et al. |
| 6,985,394 B2 | 1/2006 | Kim |
| 6,987,693 B2 | 1/2006 | Cernea et al. |
| 7,020,017 B2 | 3/2006 | Chen et al. |
| 7,028,170 B2 | 4/2006 | Saulsbury |
| 7,045,834 B2 | 5/2006 | Tran et al. |
| 7,051,309 B1 | 5/2006 | Crosetto |
| 7,054,178 B1 | 5/2006 | Shiah et al. |
| 7,061,817 B2 | 6/2006 | Raad et al. |
| 7,079,407 B1 | 7/2006 | Dimitrelis |
| 7,173,857 B2 | 2/2007 | Kato et al. |
| 7,187,585 B2 | 3/2007 | Li et al. |
| 7,196,928 B2 | 3/2007 | Chen |
| 7,260,565 B2 | 8/2007 | Lee et al. |
| 7,260,672 B2 | 8/2007 | Garney |
| 7,372,715 B2 | 5/2008 | Han |
| 7,400,532 B2 | 7/2008 | Aritome |
| 7,406,494 B2 | 7/2008 | Magee |
| 7,447,720 B2 | 11/2008 | Beaumont |
| 7,454,451 B2 | 11/2008 | Beaumont |
| 7,457,181 B2 | 11/2008 | Lee et al. |
| 7,535,769 B2 | 5/2009 | Cernea |
| 7,546,438 B2 | 6/2009 | Chung |
| 7,562,198 B2 | 7/2009 | Noda et al. |
| 7,574,466 B2 | 8/2009 | Beaumont |
| 7,602,647 B2 | 10/2009 | Li et al. |
| 7,663,928 B2 | 2/2010 | Tsai et al. |
| 7,685,365 B2 | 3/2010 | Rajwar et al. |
| 7,692,466 B2 | 4/2010 | Ahmadi |
| 7,752,417 B2 | 7/2010 | Manczak et al. |
| 7,791,962 B2 | 9/2010 | Noda et al. |
| 7,796,453 B2 | 9/2010 | Riho et al. |
| 7,805,587 B1 | 9/2010 | Van Dyke et al. |
| 7,808,854 B2 | 10/2010 | Takase |
| 7,827,372 B2 | 11/2010 | Bink et al. |
| 7,869,273 B2 | 1/2011 | Lee et al. |
| 7,898,864 B2 | 3/2011 | Dong |
| 7,924,628 B2 | 4/2011 | Danon et al. |
| 7,937,535 B2 | 5/2011 | Ozer et al. |
| 7,957,206 B2 | 6/2011 | Bauser |
| 7,979,667 B2 | 7/2011 | Allen et al. |
| 7,996,749 B2 | 8/2011 | Ding et al. |

(56) References Cited

U.S. PATENT DOCUMENTS

| | | | |
|---|---|---|---|
| 8,042,082 B2 | 10/2011 | Solomon | |
| 8,045,391 B2 | 10/2011 | Mohklesi | |
| 8,059,438 B2 | 11/2011 | Chang et al. | |
| 8,095,825 B2 | 1/2012 | Hirotsu et al. | |
| 8,117,462 B2 | 2/2012 | Snapp et al. | |
| 8,164,942 B2 | 4/2012 | Gebara et al. | |
| 8,208,328 B2 | 6/2012 | Hong | |
| 8,213,248 B2 | 7/2012 | Moon et al. | |
| 8,223,568 B2 | 7/2012 | Seo | |
| 8,238,173 B2 | 8/2012 | Akerib et al. | |
| 8,274,841 B2 | 9/2012 | Shimano et al. | |
| 8,279,683 B2 | 10/2012 | Klein | |
| 8,310,884 B2 | 11/2012 | Iwai et al. | |
| 8,332,367 B2 | 12/2012 | Bhattacherjee et al. | |
| 8,339,824 B2 | 12/2012 | Cooke | |
| 8,339,883 B2 | 12/2012 | Yu et al. | |
| 8,347,154 B2 | 1/2013 | Bahali et al. | |
| 8,351,292 B2 | 1/2013 | Matano | |
| 8,356,144 B2 | 1/2013 | Hessel et al. | |
| 8,417,921 B2 | 4/2013 | Gonion et al. | |
| 8,462,532 B1 | 6/2013 | Argyres | |
| 8,484,276 B2 | 7/2013 | Carlson et al. | |
| 8,495,438 B2 | 7/2013 | Roine | |
| 8,503,250 B2 | 8/2013 | Demone | |
| 8,526,239 B2 | 9/2013 | Kim | |
| 8,533,245 B1 | 9/2013 | Cheung | |
| 8,555,037 B2 | 10/2013 | Gonion | |
| 8,599,613 B2 | 12/2013 | Abiko et al. | |
| 8,605,015 B2 | 12/2013 | Guttag et al. | |
| 8,625,376 B2 | 1/2014 | Jung et al. | |
| 8,644,101 B2 | 2/2014 | Jun et al. | |
| 8,650,232 B2 | 2/2014 | Stortz et al. | |
| 8,873,272 B2 | 10/2014 | Lee | |
| 8,964,496 B2 | 2/2015 | Manning | |
| 8,971,124 B1 | 3/2015 | Manning | |
| 9,015,390 B2 | 4/2015 | Klein | |
| 9,047,193 B2 | 6/2015 | Lin et al. | |
| 9,165,023 B2 | 10/2015 | Moskovich et al. | |
| 2001/0007112 A1 | 7/2001 | Porterfield | |
| 2001/0008492 A1 | 7/2001 | Higashiho | |
| 2001/0010057 A1 | 7/2001 | Yamada | |
| 2001/0015909 A1 | 8/2001 | Sato et al. | |
| 2001/0028584 A1 | 10/2001 | Nakayama et al. | |
| 2001/0043089 A1 | 11/2001 | Forbes et al. | |
| 2002/0059355 A1 | 5/2002 | Peleg et al. | |
| 2003/0167426 A1 | 9/2003 | Slobodnik | |
| 2003/0222879 A1 | 12/2003 | Lin et al. | |
| 2004/0027848 A1* | 2/2004 | Wald | G11C 11/005 365/104 |
| 2004/0073592 A1 | 4/2004 | Kim et al. | |
| 2004/0073773 A1 | 4/2004 | Demjanenko | |
| 2004/0085840 A1 | 5/2004 | Vali et al. | |
| 2004/0095826 A1 | 5/2004 | Perner | |
| 2004/0154002 A1 | 8/2004 | Ball et al. | |
| 2004/0205289 A1 | 10/2004 | Srinivasan | |
| 2004/0240251 A1 | 12/2004 | Nozawa et al. | |
| 2005/0015557 A1 | 1/2005 | Wang et al. | |
| 2005/0078514 A1 | 4/2005 | Scheuerlein et al. | |
| 2005/0097417 A1 | 5/2005 | Agrawal et al. | |
| 2006/0047937 A1 | 3/2006 | Selvaggi et al. | |
| 2006/0069849 A1 | 3/2006 | Rudelic | |
| 2006/0146623 A1 | 7/2006 | Mizuno et al. | |
| 2006/0149804 A1 | 7/2006 | Luick et al. | |
| 2006/0181917 A1 | 8/2006 | Kang et al. | |
| 2006/0215432 A1 | 9/2006 | Wickeraad et al. | |
| 2006/0225072 A1 | 10/2006 | Lari et al. | |
| 2006/0291282 A1 | 12/2006 | Liu et al. | |
| 2007/0103986 A1 | 5/2007 | Chen | |
| 2007/0171747 A1 | 7/2007 | Hunter et al. | |
| 2007/0180006 A1* | 8/2007 | Gyoten | G06F 13/1652 708/200 |
| 2007/0180184 A1 | 8/2007 | Sakashita et al. | |
| 2007/0195602 A1 | 8/2007 | Fong et al. | |
| 2007/0214335 A1* | 9/2007 | Bellows | G11C 7/1012 711/167 |
| 2007/0285131 A1 | 12/2007 | Sohn | |
| 2007/0285979 A1 | 12/2007 | Turner | |
| 2007/0291532 A1 | 12/2007 | Tsuji | |
| 2008/0025073 A1 | 1/2008 | Arsovski | |
| 2008/0037333 A1 | 2/2008 | Kim et al. | |
| 2008/0052711 A1 | 2/2008 | Forin et al. | |
| 2008/0137388 A1 | 6/2008 | Krishnan et al. | |
| 2008/0140974 A1* | 6/2008 | Ware | G11C 5/14 711/167 |
| 2008/0165601 A1 | 7/2008 | Matick et al. | |
| 2008/0178053 A1 | 7/2008 | Gorman et al. | |
| 2008/0209141 A1* | 8/2008 | Perego | G06F 13/1684 711/155 |
| 2008/0215937 A1 | 9/2008 | Dreibelbis et al. | |
| 2009/0067218 A1 | 3/2009 | Graber | |
| 2009/0141537 A1 | 6/2009 | Arsovski | |
| 2009/0154238 A1 | 6/2009 | Lee | |
| 2009/0154273 A1 | 6/2009 | Borot et al. | |
| 2009/0254694 A1* | 10/2009 | Ehrman | G11C 7/1006 711/100 |
| 2009/0254697 A1 | 10/2009 | Akerib | |
| 2010/0067296 A1 | 3/2010 | Li | |
| 2010/0080060 A1* | 4/2010 | Chen | G11C 16/34 365/185.12 |
| 2010/0091582 A1 | 4/2010 | Vali et al. | |
| 2010/0106919 A1 | 4/2010 | Manning | |
| 2010/0172190 A1 | 7/2010 | Lavi et al. | |
| 2010/0195399 A1 | 8/2010 | Tanaka | |
| 2010/0210076 A1 | 8/2010 | Gruber et al. | |
| 2010/0226183 A1 | 9/2010 | Kim | |
| 2010/0308858 A1 | 12/2010 | Noda et al. | |
| 2010/0332895 A1 | 12/2010 | Billing et al. | |
| 2011/0051523 A1 | 3/2011 | Manabe et al. | |
| 2011/0063919 A1 | 3/2011 | Chandrasekhar et al. | |
| 2011/0093662 A1 | 4/2011 | Walker et al. | |
| 2011/0103151 A1 | 5/2011 | Kim et al. | |
| 2011/0119467 A1 | 5/2011 | Cadambi et al. | |
| 2011/0122695 A1 | 5/2011 | Li et al. | |
| 2011/0140741 A1 | 6/2011 | Zerbe et al. | |
| 2011/0219260 A1 | 9/2011 | Nobunaga et al. | |
| 2011/0267883 A1 | 11/2011 | Lee et al. | |
| 2011/0317496 A1 | 12/2011 | Bunce et al. | |
| 2012/0005397 A1 | 1/2012 | Lim et al. | |
| 2012/0017039 A1 | 1/2012 | Margetts | |
| 2012/0023281 A1 | 1/2012 | Kawasaki et al. | |
| 2012/0026818 A1 | 2/2012 | Chen et al. | |
| 2012/0120705 A1 | 5/2012 | Mitsubori et al. | |
| 2012/0124341 A1 | 5/2012 | Goodrich | |
| 2012/0131399 A1 | 5/2012 | Henrion et al. | |
| 2012/0134216 A1 | 5/2012 | Singh | |
| 2012/0134225 A1 | 5/2012 | Chow | |
| 2012/0134226 A1 | 5/2012 | Chow | |
| 2012/0140540 A1 | 6/2012 | Agam et al. | |
| 2012/0182798 A1 | 7/2012 | Hosono et al. | |
| 2012/0195146 A1 | 8/2012 | Jun et al. | |
| 2012/0198310 A1 | 8/2012 | Tran et al. | |
| 2012/0246380 A1* | 9/2012 | Akerib | G11C 7/1006 711/5 |
| 2012/0265964 A1 | 10/2012 | Murata et al. | |
| 2012/0281486 A1 | 11/2012 | Rao et al. | |
| 2012/0303627 A1 | 11/2012 | Keeton et al. | |
| 2013/0003467 A1 | 1/2013 | Klein | |
| 2013/0028017 A1 | 1/2013 | Hendrickson | |
| 2013/0051142 A1 | 2/2013 | Sakui et al. | |
| 2013/0061006 A1 | 3/2013 | Hein | |
| 2013/0107623 A1 | 5/2013 | Kavalipurapu et al. | |
| 2013/0117541 A1 | 5/2013 | Choquette et al. | |
| 2013/0124783 A1 | 5/2013 | Yoon et al. | |
| 2013/0132702 A1 | 5/2013 | Patel et al. | |
| 2013/0138646 A1 | 5/2013 | Sirer et al. | |
| 2013/0163362 A1 | 6/2013 | Kim | |
| 2013/0173888 A1 | 7/2013 | Hansen et al. | |
| 2013/0205114 A1* | 8/2013 | Badam | G06F 3/0613 711/207 |
| 2013/0205183 A1* | 8/2013 | Fillingim | G06F 11/1044 714/773 |
| 2013/0219112 A1 | 8/2013 | Okin et al. | |
| 2013/0227361 A1 | 8/2013 | Bowers et al. | |
| 2013/0283122 A1 | 10/2013 | Anholt et al. | |

(56) References Cited

U.S. PATENT DOCUMENTS

| | | |
|---|---|---|
| 2013/0286705 A1 | 10/2013 | Grover et al. |
| 2013/0326154 A1 | 12/2013 | Haswell |
| 2013/0332707 A1 | 12/2013 | Gueron et al. |
| 2014/0185395 A1 | 7/2014 | Seo |
| 2014/0215185 A1 | 7/2014 | Danielsen |
| 2014/0250279 A1 | 9/2014 | Manning |
| 2014/0344934 A1 | 11/2014 | Jorgensen |
| 2015/0134713 A1 | 5/2015 | Wheeler |
| 2015/0324290 A1 | 11/2015 | Leidel |
| 2015/0325272 A1 | 11/2015 | Murphy |

FOREIGN PATENT DOCUMENTS

| | | |
|---|---|---|
| EP | 2026209 | 2/2009 |
| JP | H0831168 | 2/1996 |
| JP | 2009259193 | 3/2015 |
| KR | 10-0211482 | 8/1998 |
| KR | 10-2010-0134235 | 12/2010 |
| KR | 10-2013-0049421 | 5/2013 |
| WO | 2001065359 | 9/2001 |
| WO | 2010079451 | 7/2010 |
| WO | 2013062596 | 5/2013 |
| WO | 2013081588 | 6/2013 |
| WO | 2013095592 | 6/2013 |

OTHER PUBLICATIONS

Stojmenovic, "Multiplicative Circulant Networks Topological Properties and Communication Algorithms", (25 pgs.), Discrete Applied Mathematics 77 (1997) 281-305.

"4.9.3 MINLOC and MAXLOC", Jun. 12, 1995, (5pgs.), Message Passing Interface Forum 1.1, retrieved from http://www.mpi-forum.org/docs/mpi-1.1/mpi-11-html/node79.html.

Derby, et al., "A High-Performance Embedded DSP Core with Novel SIMD Features", Apr. 6-10, 2003, (4 pgs), vol. 2, pp. 301-304, 2003 IEEE International Conference on Accoustics, Speech, and Signal Processing.

Debnath, Biplob, Bloomflash: Bloom Filter on Flash-Based Storage, 2011 31st Annual Conference on Distributed Computing Systems, Jun. 20-24, 2011, 10 pgs.

Pagiamtzis, Kostas, "Content-Addressable Memory Introduction", Jun. 25, 2007, (6 pgs.), retrieved from: http://www.pagiamtzis.com/cam/camintro.

Pagiamtzis, et al., "Content-Addressable Memory (CAM) Circuits and Architectures: A Tutorial and Survey", Mar. 2006, (16 pgs.), vol. 41, No. 3, IEEE Journal of Solid-State Circuits.

International Search Report and Written Opinion for PCT Application No. PCT/US2013/043702, dated Sep. 26, 2013, (11 pgs.).

Elliot, et al., "Computational RAM: Implementing Processors in Memory", Jan.-Mar. 1999, (10 pgs.), vol. 16, Issue 1, IEEE Design and Test of Computers Magazine.

Dybdahl, et al., "Destructive-Read in Embedded DRAM, Impact on Power Consumption," Apr. 2006, (10 pgs.), vol. 2, Issue 2, Journal of Embedded Computing-Issues in embedded single-chip multicore architectures.

Kogge, et al., "Processing in Memory: Chips to Petaflops," May 23, 1997, (8 pgs.), retrieved from: http://www.cs.ucf.edu/courses/cda5106/summer02/papers/kogge97PIM.pdf.

Draper, et al., "The Architecture of the DIVA Processing-In-Memory Chip," Jun. 22-26, 2002, (12 pgs.), ICS '02, retrieved from: http://www.isi.edu/~draper/papers/ics02.pdf.

Adibi, et al., "Processing-In-Memory Technology for Knowledge Discovery Algorithms," Jun. 25, 2006, (10 pgs.), Proceeding of the Second International Workshop on Data Management on New Hardware, retrieved from: http://www.cs.cmu.edu/~damon2006/pdf/adibi06inmemory.pdf.

U.S. Appl. No. 13/449,082, entitled, "Methods and Apparatus for Pattern Matching," filed Apr. 17, 2012, (37 pgs.).

U.S. Appl. No. 13/743,686, entitled, "Weighted Search and Compare in a Memory Device," filed Jan. 17, 2013, (25 pgs.).

U.S. Appl. No. 13/774,636, entitled, "Memory as a Programmable Logic Device," filed Feb. 22, 2013, (30 pgs.).

U.S. Appl. No. 13/774,553, entitled, "Neural Network in a Memory Device," filed Feb. 22, 2013, (63 pgs.).

U.S. Appl. No. 13/796,189, entitled, "Performing Complex Arithmetic Functions in a Memory Device," filed Mar. 12, 2013, (23 pgs.).

* cited by examiner

| | 1544 | 1545 | 1556 | 1570 | 1571 |
|---|---|---|---|---|---|
| | A | B | NOT OPEN | OPEN TRUE | OPEN INVERT |
| | 0 | 0 | 0 | 0 | 1 |
| | 0 | 1 | 0 | 1 | 0 |
| 1575 → ⋈ | | | | | |
| | 1 | 0 | 1 | 0 | 1 |
| | 1 | 1 | 1 | 1 | 0 |

| | | | | | | | | | | |
|---|---|---|---|---|---|---|---|---|---|---|
| FF | 0 | 0 | 0 | 0 | 0 | 0 | 1 | 1 | 1 | ← 1576 |
| FT | 0 | 0 | 0 | 1 | 1 | 1 | 0 | 0 | 0 | ← 1577 |
| TF | 0 | 0 | 1 | 0 | 0 | 1 | 0 | 0 | 1 | ← 1578 |
| TT | 0 | 1 | 0 | 0 | 1 | 0 | 0 | 1 | 0 | ← 1579 |
| A | B | A | A*B | A*B̄ | A+B | B | AXB | A+B̄ | ĀXB | B̄ | ← 1547 |
| 0 | 0 | 0 | 0 | 0 | 0 | 0 | 0 | 1 | 1 | 1 |
| 0 | 1 | 0 | 0 | 0 | 1 | 1 | 1 | 0 | 0 | 0 |
| 1 | 0 | 1 | 0 | 1 | 1 | 0 | 1 | 1 | 0 | 1 |
| 1 | 1 | 1 | 1 | 0 | 1 | 1 | 0 | 1 | 1 | 0 |

1576–1579 grouped as 1580.

*Fig. 15*

DATA STORAGE LAYOUT

PRIORITY INFORMATION

This application is a Continuation of U.S. application Ser. No. 14/714,999, filed May 18, 2015, which claims the benefit of U.S. Provisional Application No. 62/008,016, filed Jun. 5, 2014, the contents of which are incorporated herein by reference.

TECHNICAL FIELD

The present disclosure relates generally to semiconductor memory apparatuses and methods, and more particularly, to apparatuses and methods related to logical operations for memory.

BACKGROUND

Memory devices are typically provided as internal, semiconductor, integrated circuits in computers or other electronic systems. There are many different types of memory including volatile and non-volatile memory. Volatile memory can require power to maintain its data (e.g., host data, error data, etc.) and includes random access memory (RAM), dynamic random access memory (DRAM), static random access memory (SRAM), synchronous dynamic random access memory (SDRAM), and thyristor random access memory (TRAM), among others. Non-volatile memory can provide persistent data by retaining stored data when not powered and can include NAND flash memory, NOR flash memory, and resistance variable memory such as phase change random access memory (PCRAM), resistive random access memory (RRAM), and magnetoresistive random access memory (MRAM), such as spin torque transfer random access memory (STT RAM), among others.

Electronic systems often include a number of processing resources (e.g., one or more processors), which may retrieve and execute instructions and store the results of the executed instructions to a suitable location. A processor can comprise a number of functional units (e.g., herein referred to as functional unit circuitry (FUC)) such as arithmetic logic unit (ALU) circuitry, floating point unit (FPU) circuitry, and/or a combinatorial logic block, for example, which can execute instructions to perform logical operations such as AND, OR, NOT, NAND, NOR, and XOR logical operations on data (e.g., one or more operands).

A number of components in an electronic system may be involved in providing instructions to the functional unit circuitry for execution. The instructions may be generated, for instance, by a processing resource such as a controller and/or host processor. Data (e.g., the operands on which the instructions will be executed to perform the logical operations) may be stored in a memory array that is accessible by the FUC. The instructions and/or data may be retrieved from the memory array and sequenced and/or buffered before the FUC begins to execute instructions on the data. Furthermore, as different types of operations may be executed in one or multiple clock cycles through the FUC, intermediate results of the operations and/or data may also be sequenced and/or buffered.

In many instances, the processing resources (e.g., processor and/or associated FUC) may be external to the memory array, and data can be accessed (e.g., via a bus between the processing resources and the memory array to execute instructions). Data can be moved from the memory array to registers external to the memory array via a bus.

BRIEF DESCRIPTION OF THE DRAWINGS

FIG. 15 is a logic table illustrating selectable logic operation results implemented by a sensing circuitry in accordance with a number of embodiments of the present disclosure.

DETAILED DESCRIPTION

Figure 1:
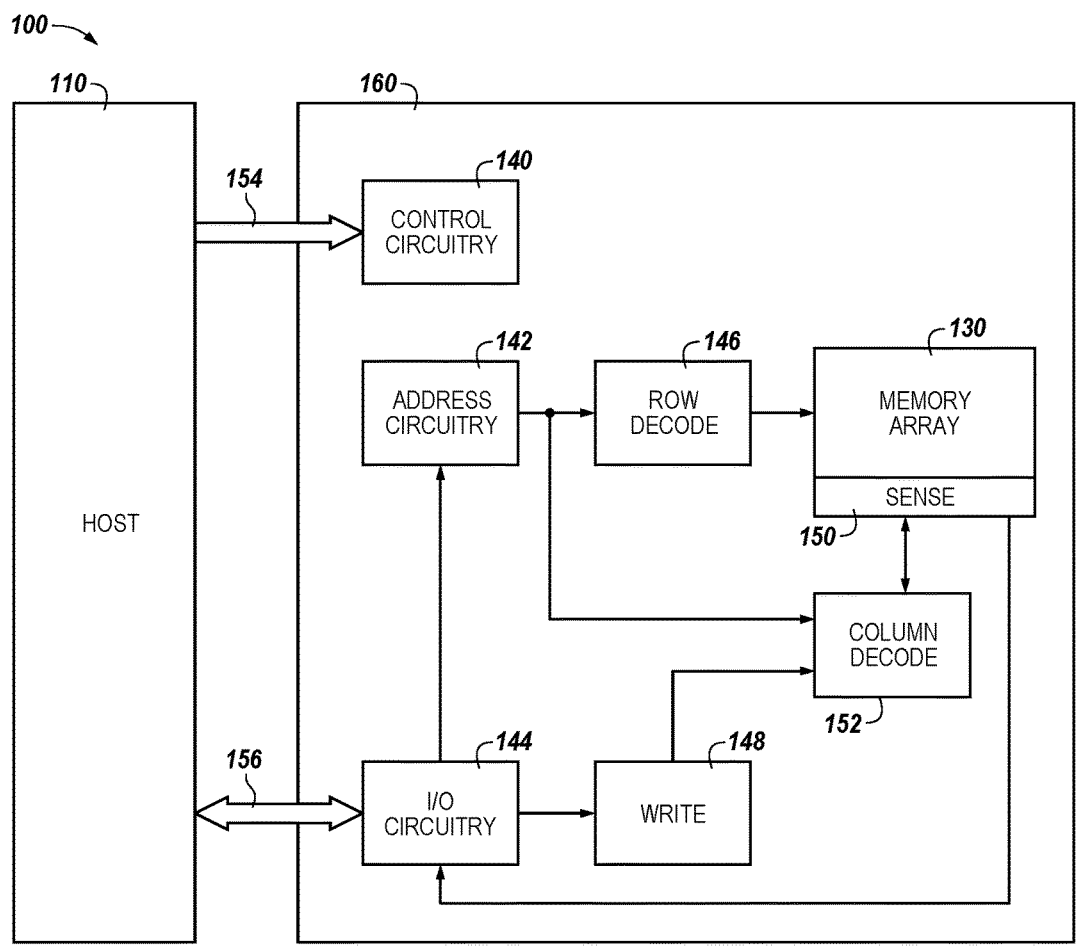
FIG. 1 is a block diagram of an apparatus in the form of a computing system including a memory device in accordance with a number of embodiments of the present disclosure.

The present disclosure includes apparatuses and methods related to storing data in a memory array in accordance with a particular storage layout. A plurality of data elements can be stored in a memory array in accordance with the particular storage layout. The plurality of data elements can have a logical operation performed thereon without performing a sense line address access. In a number of examples, the particular storage layout can be based on a quantity of a plurality of compute components coupled to the memory array, a number of logical operations to be performed in parallel, a quantity of bits that are a logical representation of each of the data elements, and/or a type of logical operation performed on the data elements. In a number of examples, a particular storage layout can include a vertical layout, a horizontal layout, and/or a hybrid layout, among other types of storage layouts.

A data element is a data value that is represented by a number of bits (e.g., N-bits). As used herein, performing a number of logical operations in parallel can include, but is not limited to, performing a same logical operation a number of times in parallel. For example, performing a number of logical operations in parallel can also include performing a number of different logical operations in parallel.

A number of embodiments of the present disclosure can increase operational efficiency and/or decrease a time involved in performing a number of logical operations in parallel using the plurality of compute components by determining a storage layout over previous approaches. Organizing the plurality of data elements in the memory array according to a particular storage layout can reduce the plurality of compute components that are fired but not used to perform the number of logical operations and/or increase the quantity of compute components used to perform the number of logical operations in parallel. For example, a particular storage layout can be selected to maximize compute component use.

One embodiment can perform a logical operation without transferring data out of the memory array and/or sensing circuitry via a bus (e.g., data bus, address bus, control bus, etc.). A logical operation can include a number of different types of operations. In a number of examples, the type of operation performed can also be used to determine a storage layout.

In previous approaches, data (e.g., a first value and a second value) may be transferred from the array and sensing circuitry to a number of registers via a bus comprising input/output (I/O) lines. The number of registers can be used by a processing resource such as a processor, microprocessor, and/or compute engine, which may comprise ALU circuitry and/or other functional unit circuitry configured to perform the appropriate logical operations. However, only a single comparison function can be performed by the ALU circuitry. Transferring data to/from memory from/to registers via a bus can involve significant power consumption and time requirements. Even if the processing resource is located on a same chip as the memory array, significant power can be consumed in moving data out of the array to the compute circuitry, which can involve performing a sense line address access (e.g., firing of a column decode signal) in order to transfer data from sense lines onto I/O lines, moving the data to the array periphery, and providing the data to a register in association with a comparison function, for instance.

Furthermore, in previous approaches, data may be stored in the memory array in accordance with a single storage layout. That is, the same storage layout may be used to store a plurality of data elements regardless of the number of logical operations to be performed in parallel, the quantity of bits in each of the data elements, an operation that is to be performed on the data elements, and/or the quantity of compute components available to be used to perform the operation.

In the following detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure. As used herein, the designators "L," "N," "M," and "P" particularly with respect to reference numerals in the drawings, indicates that a number of the particular feature so designated can be included. As used herein, "a number of" a particular thing can refer to one or more of such things (e.g., a number of memory arrays can refer to one or more memory arrays).

The figures herein follow a numbering convention in which the first digit or digits correspond to the drawing figure number and the remaining digits identify an element or component in the drawing. Similar elements or components between different figures may be identified by the use of similar digits. For example, 204 may reference element "04" in FIG. 2 and a similar element may be referenced as 404 in FIG. 4. As will be appreciated, elements shown in the various embodiments herein can be added, exchanged, and/or eliminated so as to provide a number of additional embodiments of the present disclosure. In addition, as will be appreciated, the proportion and the relative scale of the elements provided in the figures are intended to illustrate certain embodiments of the present invention, and should not be taken in a limiting sense FIG. 1 is a block diagram of an apparatus in the form of a computing system 100 including a memory device 160 in accordance with a number of embodiments of the present disclosure. As used herein, a memory device 160, a memory array 130, and/or sensing circuitry 150 might also be separately considered an "apparatus."

System 100 includes a host 110 coupled to memory device 160, which includes a memory array 130. Host 110 can be a host system such as a personal laptop computer, a desktop computer, a digital camera, a mobile telephone, or a memory card reader, among various other types of hosts. Host 110 can include a system motherboard and/or backplane and can include a number of processing resources (e.g., one or more processors, microprocessors, or some other type of controlling circuitry). The system 100 can include separate integrated circuits or both the host 110 and the memory device 160 can be on the same integrated circuit. The system 100 can be, for instance, a server system and/or a high performance computing (HPC) system and/or a portion thereof Although the example shown in FIG. 1 illustrates a system having a Von Neumann architecture, embodiments of the present disclosure can be implemented in non-Von Neumann architectures (e.g., a Turing machine), which may not include one or more components (e.g., CPU, ALU, etc.) often associated with a Von Neumann architecture.

For clarity, the system 100 has been simplified to focus on features with particular relevance to the present disclosure. The memory array 130 can be a DRAM array, SRAM array, STT RAM array, PCRAM array, TRAM array, RRAM array, NAND flash array, and/or NOR flash array, for instance. The array 130 can comprise memory cells arranged in rows coupled by select lines (which may be referred to herein as word lines or access lines) and columns coupled by sense lines (which may be referred to herein as digit lines or data lines). Although a single array 130 is shown in FIG. 1, embodiments are not so limited. For instance, memory device 160 may include a number of arrays 130 (e.g., a number of banks of DRAM cells). An example DRAM array is described in association with FIG. 2.

The memory device 160 includes address circuitry 142 to latch address signals provided over an I/O bus 156 (e.g., a data bus) through I/O circuitry 144. Address signals are received and decoded by a row decoder 146 and a column decoder 152 to access the memory array 130. In a number of examples, address signals can be decoded by more or fewer row decoders. For example, memory device can include three row decoders. As used herein, a row decoder may be referred to as a select decoder. Data can be read from memory array 130 by sensing voltage and/or current changes on the sense lines using sensing circuitry 150. The sensing circuitry 150 can read and latch a page (e.g., row) of data from the memory array 130. The I/O circuitry 144 can be used for bi-directional data communication with host 110 over the I/O bus 156. The write circuitry 148 is used to write data to the memory array 130.

In a number of examples, the term decoding can include a pre-decoding, final-decoding, and/or any other type of decoding that is carried out in row decoder 146 and/or column decoder 152. In a number of examples, the term pre-decoding includes circuitry implementing pre-decoding process such that addresses are not discretely addressed. The term pre-decoding and decoding can be used herein to differentiate between the terms discretely addressable lines, and/or individually addressable lines.

In a number of examples, a number of select lines and/or sense lines in memory array 130 can be individually addressed and/or decoded independently from the other select lines and/or sense lines of memory array 130. As used herein, a discrete address can be an address that does not require decoding in order to activate a particular select line. For example, address circuitry 142 can receive an address associated with a number of select lines that can be activated without decoding an address associated with the number of select lines. In a number of examples, individually addressed rows and/or discretely addresses rows can be referred to as fully decoded rows. The memory cells associated with memory array 130 can comprise memory cells otherwise used in DRAM arrays, SRAM arrays, STT RAM arrays, PCRAM arrays, TRAM arrays, RRAM arrays, NAND flash arrays, and/or NOR flash arrays, among other memory configurations, for instance.

Control circuitry 140 decodes signals provided by control bus 154 from the host 110. These signals can include chip enable signals, write enable signals, and address latch signals that are used to control operations performed on the memory array 130, including data read, data write, and data erase operations. In various embodiments, the control circuitry 140 is responsible for executing instructions from the host 110. The control circuitry 140 can be a state machine, a sequencer, or some other type of controller.

An example of the sensing circuitry 150 is described further below in association with FIG. 2 and FIG. 3. For instance, in a number of embodiments, the sensing circuitry 150 can comprise a number of sense amplifiers and a number of compute components, which may comprise a latch that can serve as an accumulator and can be used to perform logical operations (e.g., on data associated with complementary sense lines). In a number of embodiments, the sensing circuitry (e.g., 150) can be used to perform logical operations (e.g., a comparison operation) using data stored in array 130 in accordance with a particular storage layout as inputs and store the results of the logical operations back to the array 130 in accordance with a particular storage layout without transferring the result via a sense line address access (e.g., without firing a column decode signal). Memory cells coupled to select lines and sense lines in memory array 130 can serve as temporary storage (e.g., registers) during the performance of the logical operations and/or computations involved in performing the logical operations. As such, a logical operation can be performed using sensing circuitry 150 rather than and/or in addition to being performed by processing resources external to the sensing circuitry (e.g., by a processor associated with host 110 and/or other processing circuitry, such as ALU circuitry, located on device 160 (e.g., on control circuitry 140 or elsewhere)).

In various previous approaches, data associated with a logical operation, for instance, would be read from memory via sensing circuitry and provided to an external ALU (e.g., external to the memory array 160 and the sense circuitry 150). The external ALU circuitry would perform the logical operation and the result could be transferred back to the array via the local I/O lines. In contrast, in a number of embodiments of the present disclosure, sensing circuitry (e.g., 150) is configured to perform a logical operation on data stored in accordance with a particular storage layout in memory cells in memory array 130 and store the result back to the array 130 without enabling a local I/O line coupled to the sensing circuitry.

As such, in a number of embodiments, registers and/or an ALU external to array 130 and sensing circuitry 150 may not be needed to perform the logical operations as the sensing circuitry 150 can perform the appropriate computations involved in performing the logical operation using the address space of memory array 130. Additionally, the logical operation can be performed without the use of an external processing resource.

Figure 2:
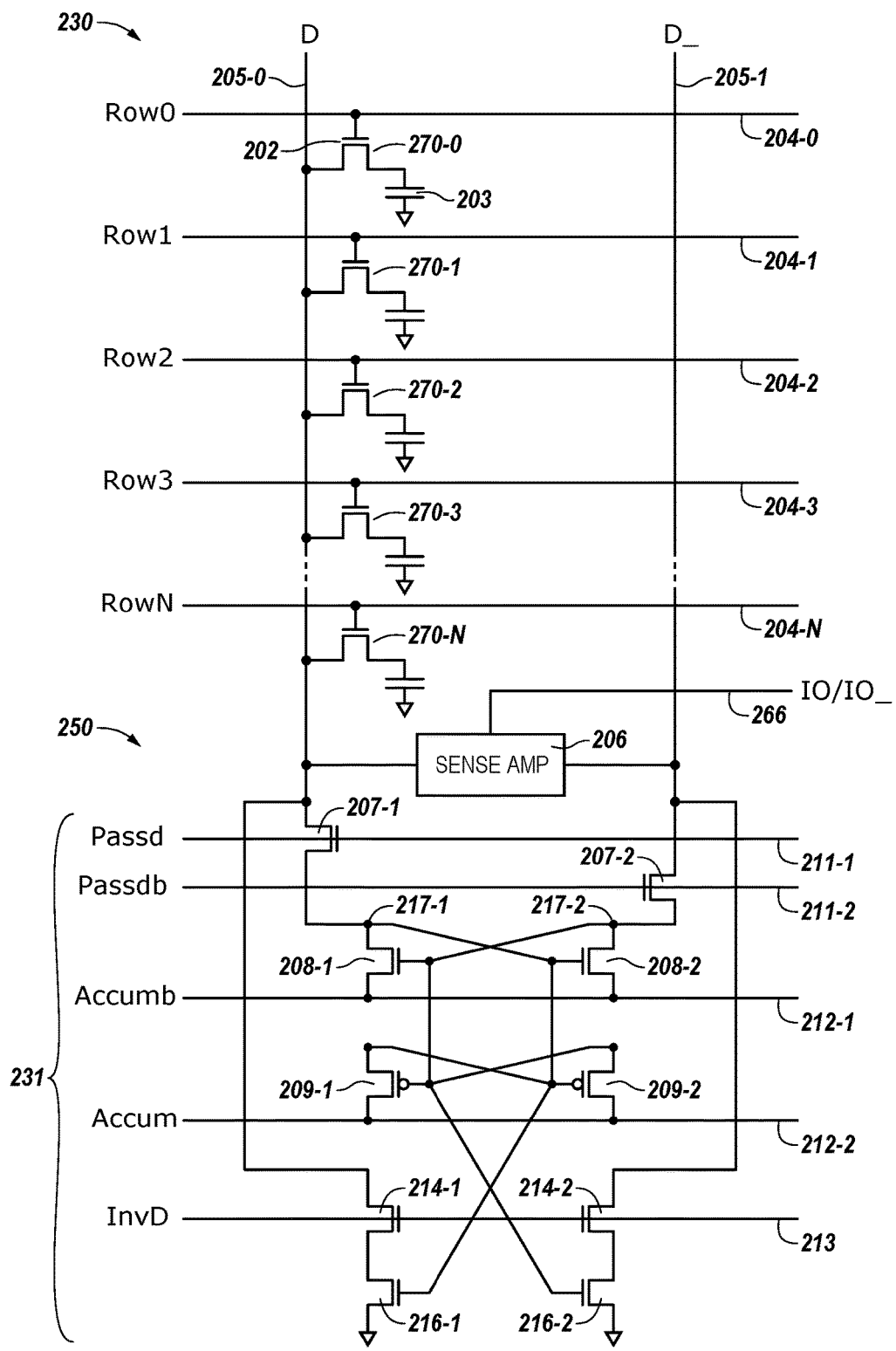
FIG. 2 illustrates a schematic diagram of a portion of a memory array in accordance with a number of embodiments of the present disclosure.

FIG. 2 illustrates a schematic diagram of a portion of a memory array 230 in accordance with a number of embodiments of the present disclosure. In this example, the memory array 230 is a DRAM array of 1T1C (one transistor one capacitor) memory cells 270-0, 270-1, 270-2, 270-3, . . . , 270-N (e.g., referred to collectively as memory cells 270) each comprised of an access device 202 (e.g., transistor) and a storage element 203 (e.g., a capacitor).

In a number of embodiments, the memory cells 270 are destructive read memory cells (e.g., reading the data stored in the cell destroys the data such that the data originally stored in the cell is refreshed after being read). The memory cells 270 are arranged in rows coupled by select lines 204-0 (Row0), 204-1 (Row1), 204-2 (Row2), 204-3 (Row3), . . . , 204-N (RowN) (e.g., referred to collectively as select lines 204) and columns coupled by sense lines (e.g., digit lines) 205-0 (D) and 205-1 (D_) (e.g., referred to collectively as sense lines 205). In a number of embodiments, the array 230 can include address spaces that are coupled to separate circuitry.

In this example, each column of cells is associated with a pair of complementary sense lines 205-0 (D) and 205-1 (D_). The structure illustrated in FIG. 2 may be used to provide many complimentary sense lines 205, select lines 204, and/or memory cells 270. Although only a single column of memory cells 270 is illustrated in FIG. 2, embodiments are not so limited. For instance, a particular array may have a number of columns, a number of cells, and/or a number of sense lines (e.g., 4,096, 8,192, 16,384, etc.). In FIG. 2, memory cells 270 are coupled to sense line 205-0. A gate of a particular cell transistor 202 is coupled to its corresponding select line 204-0 to 204-N (e.g., referred to collectively as select lines 204), a first source/drain region is coupled to its corresponding sense line 205-0, and a second source/drain region of a particular cell transistor is coupled to its corresponding capacitor, e.g., capacitor 203. Although not illustrated in FIG. 2, the sense line 205-1 may also have memory cells coupled thereto.

In a number of examples, memory cells 270 that are coupled to sense line 205-0 can store bits. The bits can represent a logical representation of a data element and/or a plurality of data elements. For example, a first element can be represented by a three bit-vector that can be stored in memory cell 270-0, memory cell 270-1, and memory cell 270-2 along sense line 205-0. In a number of examples, a bit-vector can be represented by more or fewer bits than those discussed in FIG. 2. Other examples are discussed in connection with FIGS. 3, 4, 5, 6, 7. For example, the data element can be represented by a 4-bit vector, an 8 bit-vector, a 16 bit-vector, a 32 bit-vector, and/or a 64 bit-vector, among other bit-vector dimensions. In a number of examples, each bit-vector representation of a data element can be stored in accordance with a horizontal storage layout along select lines 204, a vertical storage layout along sense lines 205, and/or a hybrid storage layout along select lines 204 and sense lines 205.

Each bit-vector logical representation of a data element can be indexed. For example, a bit stored in memory cell 270-0 can be associated with a first index, a bit stored in memory cell 270-1 can be associated with a second index, and a bit stored in memory cell 270-2 can be associated with a third index. As an example, the first index can indicate a most significant bit (MSB) of a stored bit-vector and the third index can indicate a least significant bit (LSB) of the stored bit-vector. In a number of examples, a logical operation can be performed by the logical operation on the bits that represent a logical representation of the first data element and the bits that represent a logical representation of the second data element. The logical operation can be performed by first performing the logical operation using a most significant bit from the logical representation of the first data element and a most significant bit from the logical representation of the second data element. The logical operation can continue by performing the logical operation using a next most significant bit from the logical representation of the first data element and a next most significant bit from the logical representation of the second data element. A next most significant bit can represent a bit that is associated with an index that is decremented every time an iteration of the logical operation is performed.

The indexing used in association with FIG. 2 is demonstrative and not limiting. Other indexing systems and/or orders can be employed in a number of embodiments. For examples, a bit stored in memory 270-2 can be associated with a first index, a bit stored in memory cell 270-1 can be associated with a second index, and a bit stored in memory cell 270-0 can be associated with a third index. Furthermore, the operations described herein can be performed using a number of different layouts and/or memory cell orientations.

In a number of examples, the memory cells coupled to a select line 204-0 and to a number of sense lines (e.g., sense line 205-0 and sense line 205-1) can be activated in parallel. Furthermore, memory cell 270-0, memory cell 270-1, memory cell 270-2, memory cell 270-3 can also be activated in parallel by activating select line 204-0, select line 204-1, select line 204-2, and select line 204-3 in parallel. In a number of examples, independently addressed select lines 204 and/or sense lines 205 can be activated in parallel to activate a number of memory cells in parallel.

The sensing circuitry 250 comprises a sense amplifier 206 and a compute component 231. The sensing circuitry 250 can be sensing circuitry 150 shown in FIG. 1. FIG. 2 also shows sensing circuitry 250 coupled to the memory array 230. The sense amplifier 206 is coupled to the complementary sense lines D, D_ corresponding to a particular column of memory cells. The sense amplifier 206 can be operated to determine a state (e.g., logic data value) stored in a selected cell (e.g., memory cells 270). Embodiments are not limited to a given sense amplifier architecture or type. For instance, sensing circuitry in accordance with a number of embodiments described herein can include current-mode sense amplifiers and/or single-ended sense amplifiers (e.g., sense amplifiers coupled to one sense line).

In a number of embodiments, a compute component 231 can comprise a number of transistors formed on pitch with the transistors of the sense amplifier 206 and/or the memory cells 270 of the array (e.g., 230), which may conform to a particular feature size (e.g., $4F^2$, $6F^2$, etc.). As described further below, the compute component 231 can, in conjunction with the sense amplifier 206, operate to perform a logical operation using data from the memory cells 270 that is stored according to a particular storage layout in the array 230 as input and store the result back to the memory cells 270 in the array 230 without transferring the data via a sense line address access (e.g., without firing a column decode signal such that data is transferred to circuitry external from the array and sensing circuitry via local I/O lines 266). As such, a number of embodiments of the present disclosure can enable storing data element in accordance with a particular storage layout and performing a logical operation therewith while using more compute components to perform the logical operations than various previous approaches. Additionally, since a number of embodiments use more compute components to perform the logical operation as compared to previous approaches, a number of embodiments can enable an increased parallel processing capability using compute components 231 and the memory cells 270 as compared to previous approaches.

In the example illustrated in FIG. 2, the circuitry corresponding to compute component 231 comprises five transistors coupled to each of the sense lines D and D_; however, embodiments are not limited to this example. Transistors 207-1 and 207-2 have a first source/drain region coupled to sense lines D and D_, respectively, and a second source/drain region coupled to a cross coupled latch (e.g., coupled to gates of a pair of cross coupled transistors, such as cross coupled NMOS transistors 208-1 and 208-2 and cross coupled PMOS transistors 209-1 and 209-2). As described further herein, the cross coupled latch comprising transistors 208-1, 208-2, 209-1, and 209-2 can be referred to as a secondary latch (e.g., a cross coupled latch corresponding to sense amplifier 206 can be referred to herein as a primary latch).

The transistors 207-1 and 207-2 can be referred to as pass transistors, which can be enabled via respective signals 211-1 (Passd) and 211-2 (Passdb) in order to pass the voltages or currents on the respective sense lines D and D_ to the inputs of the cross coupled latch comprising transistors 208-1, 208-2, 209-1, and 209-2 (e.g., the input of the secondary latch). In this example, the second source/drain region of transistor 207-1 is coupled to a first source/drain region of transistors 208-1 and 209-1 as well as to the gates of transistors 208-2 and 209-2. Similarly, the second source/ drain region of transistor 207-2 is coupled to a first source/drain region of transistors 208-2 and 209-2 as well as to the gates of transistors 208-1 and 209-1.

A second source/drain region of transistor 208-1 and 208-2 is commonly coupled to a negative control signal 212-1 (Accumb). A second source/drain region of transistors 209-1 and 209-2 is commonly coupled to a positive control signal 212-2 (Accum). The Accum signal 212-2 can be a supply voltage (e.g., Vcc) and the Accumb signal can be a reference voltage (e.g., ground). Enabling signals 212-1 and 212-2 activate the cross coupled latch comprising transistors 208-1, 208-2, 209-1, and 209-2 corresponding to the secondary latch. The activated cross coupled latch operates to amplify a differential voltage between common node 217-1 and common node 217-2 such that node 217-1 is driven to one of the Accum signal voltage and the Accumb signal voltage (e.g., to one of Vcc and ground), and node 217-2 is driven to the other of the Accum signal voltage and the Accumb signal voltage. As described further below, the signals 212-1 and 212-2 are labeled "Accum" and "Accumb" because the secondary latch can serve as an accumulator while being used to perform a logical operation (e.g., a comparison operation). In a number of embodiments, a compute component comprises the cross coupled transistors 208-1, 208-2, 209-1, and 209-2 forming the secondary latch as well as the pass transistors 207-1 and 207-2. As described further herein, in a number of embodiments, a compute component coupled to a sense amplifier can be configured to perform a logical operation that comprises performing an accumulate operation on a data element represented by a signal (e.g., voltage or current) on at least one of a pair of complementary sense lines. For instance, a compute component may comprise one or more latches which can operate as an accumulator. As such a compute component may be referred to herein as an accumulator.

The compute component 231 also includes inverting transistors 214-1 and 214-2 having a first source/drain region coupled to the respective digit lines D and D_. A second source/drain region of the transistors 214-1 and 214-2 is coupled to a first source/drain region of transistors 216-1 and 216-2, respectively. The gates of transistors 214-1 and 214-2 are coupled to a signal 213 (InvD). The gate of transistor 216-1 is coupled to the common node 217-1 to which the gate of transistor 208-2, the gate of transistor 209-2, and the first source/drain regions of transistors 208-1 and 209-1 are also coupled. In a complementary fashion, the gate of transistor 216-2 is coupled to the common node 217-2 to which the gate of transistor 208-1, the gate of transistor 209-1, and the first source/drain regions of transistor 208-2 and 209-2 are also coupled. As such, enabling signal InvD serves to invert the data value stored in the secondary latch and drives the inverted value onto sense lines 205-0 and 205-1.

In a number of examples, a plurality (M) of data elements to be used as at least one input to a number (L) of logical operations to be performed in parallel can be stored in memory cells 270 in accordance with a particular storage layout. A particular storage layout can be determined by a host 110, a control circuitry 140, and/or an I/O circuitry 144 in FIG. 1, among other circuitry components that may determine a particular storage layout. The particular storage layout can, for example, be determined before the data is stored in the memory array 230.

The particular storage layout can be a horizontal storage layout, a vertical storage layout, and/or a hybrid storage layout. A number of logical operations (L) can be performed in parallel on the data elements that are stored in accordance with the particular storage layout using a plurality of compute components 231. In a number of examples, the particular storage layout can be determined based on a quantity of compute components 231 coupled to the memory array 230, a quantity of data elements, the number (L) of logical operations to be performed in parallel, a quantity of bits (e.g., N-bits) in each data element, and/or a type of logical operation performed on the data elements.

The quantity of data elements, the L logical operations to be performed in parallel, and/or the quantity of bits in each data element can be provided before the particular storage layout is determined. For example, the quantity of data elements, the L logical operations to be performed in parallel, and/or the quantity of bits in each data element can be provided by control circuitry 140 in FIG. 1.

In a horizontal storage layout, data elements are stored along the select lines 204. For example, a horizontal storage layout can be used to store a logical representation of a data element in a number of memory cells that are coupled to a select line 204-0 and a plurality of sense lines 205. The M data elements can be stored using a horizontal storage layout if L is less than or equal to the quantity of the plurality of compute components divided by N. For example, if there are 16,384 compute components coupled to the memory array and if each data element is represented using a 64 bit-vector, then the horizontal storage layout might used if the number (L) of logical operations to be performed in parallel is less than or equal to 256. The horizontal storage layout is further described in FIG. 4.

In a vertical storage layout data elements are stored along the sense lines 205. For example, a vertical storage layout can be used to store a logical representation of a data element in a number of memory cells that are coupled to a sense line 205-0 and a number of select lines 204. The M data elements can be stored using the vertical storage layout if L is greater than or equal to the quantity of compute components. For example, if there are 16,384 compute components coupled to the memory array, then a vertical storage layout might be used if the number of logical operations (L) to be performed in parallel is greater than or equal to 16,384. A vertical storage layout is further explained in FIG. 5.

In a hybrid storage layout, data elements are stored along sense lines 205 and select lines 204. For example, the hybrid storage layout can be used to store a logical representation of a data element in a number of memory cells that are coupled to the sense lines 205 and the select lines 204. The M data elements can be stored using the hybrid storage layout if L is greater than the quantity of the plurality of compute components divided by N and if L is less than the quantity of compute components. For example, if there are 16,384 compute components coupled to the memory array, then a hybrid storage layout might be used if the number (L) of logical operations to be performed in parallel is greater than 256 and less than 16,384. A hybrid storage layout is further explained in FIG. 6 and FIG. 7.

A number of other factors can be used to determine whether the data elements are stored in accordance with a horizontal storage layout, a vertical storage layout, and/or a hybrid storage layout. For example, a type of operation can influence the type of storage layout used. A type of logical operation can have particular overhead costs associated with the type of operation that can influence the storage layout used to store data elements. For example, a logical operation that shifts data (e.g., to the right or to the left) such as a shift operation can involve moving bits between compute components if a horizontal storage layout is selected. In a number of examples, moving bits between compute components can incur a higher overhead cost in performing a shift operation than moving bits between memory cells that are coupled to a sense line because moving bits between memory cells that are coupled to a sense line does not require a bit to be moved between compute components. Shifting bits between compute components includes moving bits via an ISO device that includes transistors coupled between compute components and/or sense amplifiers.

Furthermore, there can be additional overhead costs associated with the use of a particular storage layout. For example, if a hybrid storage layout is used to store data elements, then there may be memory cells and/or compute components that are not used.

In a number of examples, performing a number of logical operations in parallel can include performing a same logical operation using a number of data elements as input. For example, shift operation can be performed in parallel to shift the bits of each of a plurality of data elements. Performing a logical operation is further described in FIGS. 4, 5, 6, and 7.

In a number of embodiments, sensing circuitry such as that described in FIG. 2 (e.g., circuitry formed on pitch with the memory cells) can enable performance of numerous logical operations in parallel. For instance, in an array having 16K columns, 16K or fewer logical operations can be performed in parallel, without transferring data from the array and sensing circuitry via a bus and/or without transferring data from the array and sensing circuitry via I/O lines 266.

Also, one of ordinary skill in the art will appreciate that the ability to perform R-input logical operations (e.g., NAND, AND, NOR, OR, etc.) can enable performance of more complex computing functions such as addition, subtraction, multiplication, and division among other primary math functions and/or pattern compare functions. For example, a series of NAND operations can be combined to perform a full adder function. As an example, if a full adder requires 12 NAND gates to add two data values along with a carry in and carry out, a total of 384 NAND operations (12×32) could be performed to add two 32 bit numbers. Embodiments of the present disclosure can also be used to perform logical operations that may be non-Boolean (e.g., copy, compare, etc.).

Additionally, in a number of embodiments, the inputs to a logical operation may not be data values stored in the memory array 130 to which the sensing circuitry (e.g., 150 in FIG. 1) is coupled. For instance, a number of inputs to a logical operation(s) can be sensed by a sense amplifier (e.g., 206 in FIG. 2A) without activating a row of the array (e.g., 230 in FIG. 2A). As an example, the number of inputs can be received by the sense amp 206 via I/O lines 266 coupled thereto. Such inputs may be provided to the sense amp 206 (e.g., via the appropriate I/O lines 266) from a source external to the array 230 such as from a host processor (e.g., host 110) and/or external controller, for instance. As another example, in association with performing a logical operation, the inputs to a particular sense amp (e.g., 206) and its corresponding compute component (e.g., 231) may be received from a different sense amp/compute component pair. For instance, a data value (e.g., logical result) stored in a first compute component coupled to a first column of cells may be transferred to a different (e.g., neighboring) sense amp/compute component pair associated with a different column of cells, which may or may not be located in the same array as the first column.

Embodiments of the present disclosure are not limited to the particular sensing circuitry configuration illustrated in FIG. 2. For instance, different compute component circuitry can be used to perform logical operations in accordance with a number of embodiments described herein. Although not illustrated in FIG. 2, in a number of embodiments, control circuitry can be coupled to array 230, sense amp 206, and/or compute component 231. Such control circuitry may be implemented on a same chip as the array and sensing circuitry 250 and/or on an external processing resource such as an external processor, for instance, and can control enabling/disabling various signals corresponding to the array and sensing circuitry in order to perform logical operations as described herein.

Figure 3A:
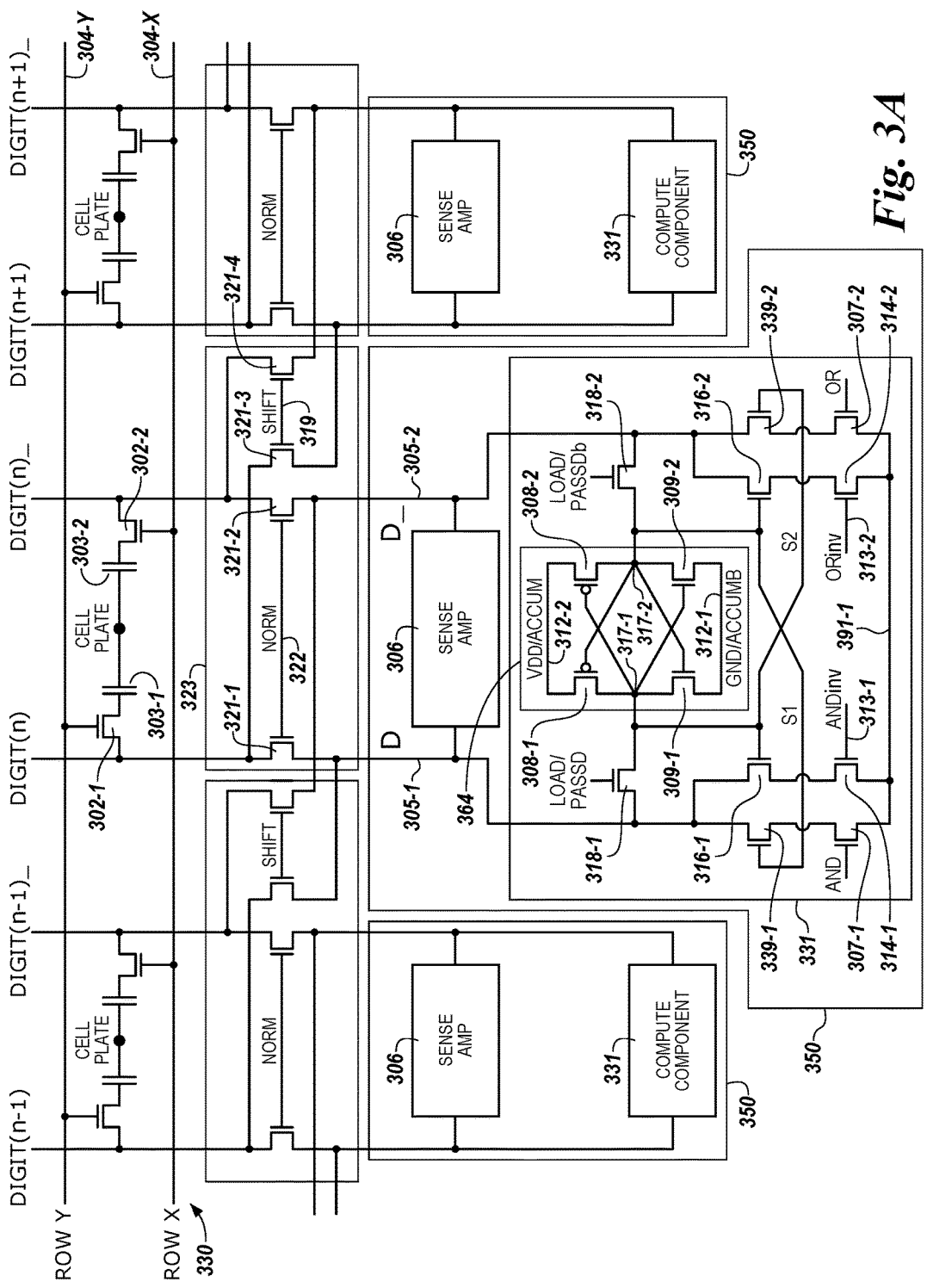
FIG. 3A illustrates a schematic diagram of a portion of a memory array in accordance with a number of embodiments of the present disclosure.

FIG. 3 illustrates a schematic diagram of a portion of a memory array in accordance with a number of embodiments of the present disclosure. A memory cell comprises a storage element (e.g., capacitor) and an access device (e.g., transistor). For instance, transistor 302-1 and capacitor 303-1 comprises a memory cell, and transistor 302-2 and capacitor 303-2 comprises a memory cell, etc. In this example, the memory array 330 is a DRAM array of 1T1C (one transistor one capacitor) memory cells. In a number of embodiments, the memory cells may be destructive read memory cells (e.g., reading the data stored in the cell destroys the data such that the data originally stored in the cell is refreshed after being read). The cells of the memory array 330 are arranged in rows coupled by word lines 304-X (Row X), 304-Y (Row Y), etc., and columns coupled by pairs of complementary data lines DIGIT(n−1)/DIGIT(n−1)_, DIGIT(n)/DIGIT(n)_, DIGIT(n+1)/DIGIT(n+1)_. The individual data lines corresponding to each pair of complementary data lines can also be referred to as data lines 305-1 (D) and 305-2 (D_) respectively. Although only three pair of complementary data lines are shown in FIG. 3A, embodiments of the present disclosure are not so limited, and an array of memory cells can include additional columns of memory cells and/or data lines (e.g., 4,096, 8,192, 16,384, etc.).

Memory cells can be coupled to different data lines and/or word lines. For example, a first source/drain region of a transistor 302-1 can be coupled to data line 305-1 (D), a second source/drain region of transistor 302-1 can be coupled to capacitor 303-1, and a gate of a transistor 302-1 can be coupled to word line 304-X. A first source/drain region of a transistor 302-2 can be coupled to data line 305-2 (D_), a second source/drain region of transistor 302-2 can be coupled to capacitor 303-2, and a gate of a transistor 302-2 can be coupled to word line 304-Y. The cell plate, as shown in FIG. 3A, can be coupled to each of capacitors 303-1 and 303-2. The cell plate can be a common node to which a reference voltage (e.g., ground) can be applied in various memory array configurations.

The memory array 330 is coupled to sensing circuitry 350 in accordance with a number of embodiments of the present disclosure. In this example, the sensing circuitry 350 comprises a sense amplifier 306 and a compute component 331 corresponding to respective columns of memory cells (e.g., coupled to respective pairs of complementary data lines). The sense amplifier 306 can comprise a cross coupled latch, which can be referred to herein as a primary latch. The sense amplifier 306 can be configured, for example, as described with respect to FIG. 3B.

In the example illustrated in FIG. 3A, the circuitry corresponding to compute component 331 comprises a static latch 364 and an additional ten transistors that implement, among other things, a dynamic latch. The dynamic latch and/or static latch of the compute component 331 can be collectively referred to herein as a secondary latch, which can serve as an accumulator. As such, the compute component 331 can operate as and/or be referred to herein as an accumulator. The compute component 331 can be coupled to each of the data lines D 305-1 and D_ 305-2 as shown in FIG. 3A. However, embodiments are not limited to this example. The transistors of compute component 331 can all be n-channel transistors (e.g., NMOS transistors), for example.

In this example, data line D 305-1 can be coupled to a first source/drain region of transistors 316-1 and 339-1, as well as to a first source/drain region of load/pass transistor 318-1. Data line D_ 305-2 can be coupled to a first source/drain region of transistors 316-2 and 339-2, as well as to a first source/drain region of load/pass transistor 318-2.

The gates of load/pass transistor 318-1 and 318-2 can be commonly coupled to a LOAD control signal, or respectively coupled to a PASSD/PASSDB control signal, as discussed further below. A second source/drain region of load/pass transistor 318-1 can be directly coupled to the gates of transistors 316-1 and 339-2. A second source/drain region of load/pass transistor 318-2 can be directly coupled to the gates of transistors 316-2 and 339-1.

A second source/drain region of transistor 316-1 can be directly coupled to a first source/drain region of pull-down transistor 314-1. A second source/drain region of transistor 339-1 can be directly coupled to a first source/drain region of pull-down transistor 307-1. A second source/drain region of transistor 316-2 can be directly coupled to a first source/drain region of pull-down transistor 314-2. A second source/drain region of transistor 339-2 can be directly coupled to a first source/drain region of pull-down transistor 307-2. A second source/drain region of each of pull-down transistors 307-1, 307-2, 314-1, and 314-2 can be commonly coupled together to a reference voltage line 391-1 (e.g., ground (GND)). A gate of pull-down transistor 307-1 can be coupled to an AND control signal line, a gate of pull-down transistor 314-1 can be coupled to an ANDinv control signal line 313-1, a gate of pull-down transistor 314-2 can be coupled to an ORinv control signal line 313-2, and a gate of pull-down transistor 307-2 can be coupled to an OR control signal line.

The gate of transistor 339-1 can be referred to as node S1, and the gate of transistor 339-2 can be referred to as node S2. The circuit shown in FIG. 3A stores accumulator data dynamically on nodes S1 and S2. Activating the LOAD control signal causes load/pass transistors 318-1 and 318-2 to conduct, and thereby load complementary data onto nodes S1 and S2. The LOAD control signal can be elevated to a voltage greater than $V_{DD}$ to pass a full $V_{DD}$ level to S1/S2. However, elevating the LOAD control signal to a voltage greater than $V_{DD}$ is optional, and functionality of the circuit shown in FIG. 3A is not contingent on the LOAD control signal being elevated to a voltage greater than $V_{DD}$.

The configuration of compute component 331 shown in FIG. 3A has the benefit of balancing the sense amplifier for functionality when the pull-down transistors 307-1, 307-2, 314-1, and 314-2 are conducting before the sense amplifier 306 is fired (e.g., during pre-seeding of the sense amplifier 306). As used herein, firing the sense amplifier 306 refers to enabling the sense amplifier 306 to set the primary latch and subsequently disabling the sense amplifier 306 to retain the set primary latch. Performing logical operations after equilibration is disabled (in the sense amp), but before the sense amplifier fires, can save power usage because the latch of the sense amplifier does not have to be "flipped" using full rail voltages (e.g., $V_{DD}$, GND).

Inverting transistors can pull-down a respective data line in performing certain logical operations. For example, transistor 316-1 (having a gate coupled to S2 of the dynamic latch) in series with transistor 314-1 (having a gate coupled to an ANDinv control signal line 313-1) can be operated to pull-down data line 305-1 (D), and transistor 316-2 (having a gate coupled to S1 of the dynamic latch) in series with transistor 314-2 (having a gate coupled to an ANDinv control signal line 313-2) can be operated to pull-down data line 305-2 (D_).

The latch 364 can be controllably enabled by coupling to an active negative control signal line 312-1 (ACCUMB) and an active positive control signal line 312-2 (ACCUM) rather than be configured to be continuously enabled by coupling to ground and $V_{DD}$. In various embodiments, load/pass transistors 308-1 and 308-2 can each having a gate coupled to one of a LOAD control signal or a PASSD/PASSDB control signal.

According to some embodiments, the gates of load/pass transistors 318-1 and 318-2 can be commonly coupled to a LOAD control signal. In the configuration where the gates of load/pass transistors 318-1 and 318-2 are commonly coupled to the LOAD control signal, transistors 318-1 and 318-2 can be load transistors. Activating the LOAD control signal causes the load transistors to conduct, and thereby load complementary data onto nodes S1 and S2. The LOAD control signal can be elevated to a voltage greater than $V_{DD}$ to pass a full $V_{DD}$ level to S1/S2. However, the LOAD control signal need not be elevated to a voltage greater than $V_{DD}$ is optional, and functionality of the circuit shown in FIG. 3A is not contingent on the LOAD control signal being elevated to a voltage greater than $V_{DD}$.

According to some embodiments, the gate of load/pass transistor 318-1 can be coupled to a PASSD control signal, and the gate of load/pass transistor 318-2 can be coupled to a PASSDb control signal. In the configuration where the gates of transistors 318-1 and 318-2 are respectively coupled to one of the PASSD and PASSDb control signals, transistors 318-1 and 318-2 can be pass transistors. Pass transistors can be operated differently (e.g., at different times and/or under different voltage/current conditions) than load transistors. As such, the configuration of pass transistors can be different than the configuration of load transistors.

Load transistors are constructed to handle loading associated with coupling data lines to the local dynamic nodes S1 and S2, for example. Pass transistors are constructed to handle heavier loading associated with coupling data lines to an adjacent accumulator (e.g., through the shift circuitry 323, as shown in FIG. 3A). According to some embodiments, load/pass transistors 318-1 and 318-2 can be configured to accommodate the heavier loading corresponding to a pass transistor but be coupled and operated as a load transistor. Load/pass transistors 318-1 and 318-2 configured as pass transistors can also be utilized as load transistors. However, load/pass transistors 318-1 and 318-2 configured as load transistors may not be capable of being utilized as pass transistors.

In a number of embodiments, the compute component 331, including the latch 364, can comprise a number of transistors formed on pitch with the transistors of the corresponding memory cells of an array (e.g., array 330 shown in FIG. 3A) to which they are coupled, which may conform to a particular feature size (e.g., $4F^2$, $6F^2$, etc.). According to various embodiments, latch 364 includes four transistors 308-1, 308-2, 309-1, and 309-2 coupled to a pair of complementary data lines D 305-1 and D_ 305-2 through load/pass transistors 318-1 and 318-2. However, embodiments are not limited to this configuration. The latch 364 can be a cross coupled latch (e.g., gates of a pair of transistors, such as n-channel transistors (e.g., NMOS transistors) 309-1 and 309-2 are cross coupled with the gates of another pair of transistors, such as p-channel transistors (e.g., PMOS transistors) 308-1 and 308-2). As described further herein, the cross coupled latch 364 can be referred to as a static latch.

The voltages or currents on the respective data lines D and D_ can be provided to the respective latch inputs 317-1 and 317-2 of the cross coupled latch 364 (e.g., the input of the secondary latch). In this example, the latch input 317-1 is coupled to a first source/drain region of transistors 308-1 and 309-1 as well as to the gates of transistors 308-2 and 309-2. Similarly, the latch input 317-2 can be coupled to a first source/drain region of transistors 308-2 and 309-2 as well as to the gates of transistors 308-1 and 309-1.

Figure 3B:
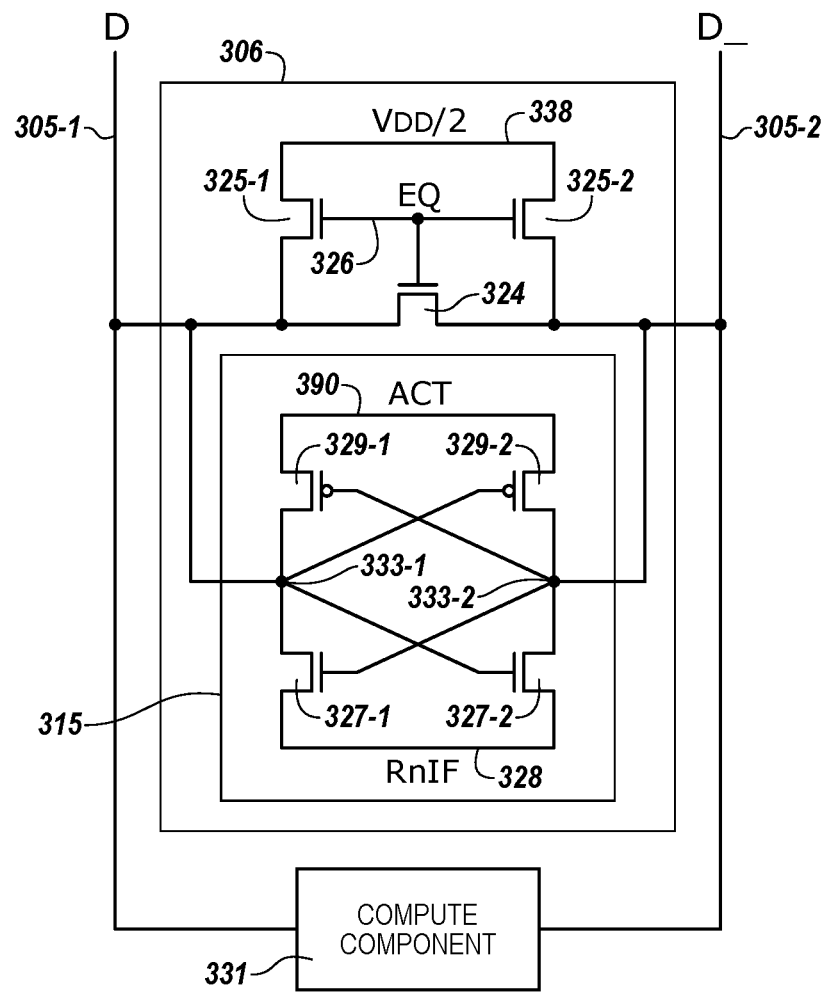
FIG. 3B illustrates a schematic diagram of a portion of a memory array in accordance with a number of embodiments of the present disclosure.

In this example, a second source/drain region of transistor 309-1 and 309-2 is commonly coupled to a negative control signal line 312-1 (e.g., ground (GND) or ACCUMB control signal similar to control signal RnIF shown in FIG. 3B with respect to the primary latch). A second source/drain region of transistors 308-1 and 308-2 is commonly coupled to a positive control signal line 312-2 (e.g., $V_{DD}$ or ACCUM control signal similar to control signal ACT shown in FIG. 3B with respect to the primary latch). The positive control signal 312-2 can provide a supply voltage (e.g., $V_{DD}$) and the negative control signal 312-1 can be a reference voltage (e.g., ground) to enable the cross coupled latch 364. According to some embodiments, the second source/drain region of transistors 308-1 and 308-2 are commonly coupled directly to the supply voltage (e.g., $V_{DD}$), and the second source/drain region of transistor 309-1 and 309-2 are commonly coupled directly to the reference voltage (e.g., ground) so as to continuously enable latch 364.

The enabled cross coupled latch 364 operates to amplify a differential voltage between latch input 317-1 (e.g., first common node) and latch input 317-2 (e.g., second common node) such that latch input 317-1 is driven to either the activated positive control signal voltage (e.g., $V_{DD}$) or the activated negative control signal voltage (e.g., ground), and latch input 317-2 is driven to the other of the activated positive control signal voltage (e.g., $V_{DD}$) or the activated negative control signal voltage (e.g., ground).

FIG. 3B is a schematic diagram illustrating a portion of sensing circuitry in accordance with a number of embodiments of the present disclosure. According to various embodiments, sense amplifier 306 can comprise a cross coupled latch. However, embodiments of the sense amplifier 306 are not limited to the a cross coupled latch. As an example, the sense amplifier 306 can be current-mode sense amplifier and/or single-ended sense amplifier (e.g., sense amplifier coupled to one data line). Also, embodiments of the present disclosure are not limited to a folded data line architecture.

In a number of embodiments, a sense amplifier (e.g., 306) can comprise a number of transistors formed on pitch with the transistors of the corresponding compute component 331 and/or the memory cells of an array (e.g., 330 shown in FIG. 3A) to which they are coupled, which may conform to a particular feature size (e.g., $4F^2$, $6F^2$, etc.). The sense amplifier 306 comprises a latch 315 including four transistors coupled to a pair of complementary data lines D 305-1 and D_ 305-2. The latch 315 can be a cross coupled latch (e.g., gates of a pair of transistors, such as n-channel transistors (e.g., NMOS transistors) 327-1 and 327-2 are cross coupled with the gates of another pair of transistors, such as p-channel transistors (e.g., PMOS transistors) 329-1 and 329-2). As described further herein, the latch 315 comprising transistors 327-1, 327-2, 329-1, and 329-2 can be referred to as a primary latch. However, embodiments are not limited to this example.

The voltages or currents on the respective data lines D and D_ can be provided to the respective latch inputs 333-1 and 333-2 of the cross coupled latch 315 (e.g., the input of the secondary latch). In this example, the latch input 333-1 is coupled to a first source/drain region of transistors 327-1 and 329-1 as well as to the gates of transistors 327-2 and 329-2. Similarly, the latch input 333-2 can be coupled to a first source/drain region of transistors 327-2 and 329-2 as well as to the gates of transistors 327-1 and 329-1. The compute component 333 (e.g., accumulator) can be coupled to latch inputs 333-1 and 333-2 of the cross coupled latch 315 as shown; however, embodiments are not limited to the example shown in FIG. 3B.

In this example, a second source/drain region of transistor 327-1 and 327-2 is commonly coupled to an active negative control signal 328 (RnIF). A second source/drain region of transistors 329-1 and 329-2 is commonly coupled to an active positive control signal 390 (ACT). The ACT signal 390 can be a supply voltage (e.g., $V_{DD}$) and the RnIF signal can be a reference voltage (e.g., ground). Activating signals 328 and 390 enables the cross coupled latch 315.

The enabled cross coupled latch 315 operates to amplify a differential voltage between latch input 333-1 (e.g., first common node) and latch input 333-2 (e.g., second common node) such that latch input 333-1 is driven to one of the ACT signal voltage and the RnIF signal voltage (e.g., to one of $V_{DD}$ and ground), and latch input 333-2 is driven to the other of the ACT signal voltage and the RnIF signal voltage.

The sense amplifier 306 can also include circuitry configured to equilibrate the data lines D and D_ (e.g., in association with preparing the sense amplifier for a sensing operation). In this example, the equilibration circuitry comprises a transistor 324 having a first source/drain region coupled to a first source/drain region of transistor 325-1 and data line D 305-1. A second source/drain region of transistor 324 can be coupled to a first source/drain region of transistor 325-2 and data line D_305-2. A gate of transistor 324 can be coupled to gates of transistors 325-1 and 325-2.

The second source drain regions of transistors 325-1 and 325-2 are coupled to an equilibration voltage 338 (e.g., $V_{DD}/2$), which can be equal to $V_{DD}/2$, where $V_{DD}$ is a supply voltage associated with the array. The gates of transistors 324, 325-1, and 325-2 can be coupled to control signal 325 (EQ). As such, activating EQ enables the transistors 324, 325-1, and 325-2, which effectively shorts data line D to data line D_ such that the data lines D and D_ are equilibrated to equilibration voltage $V_{DD}/2$. According to various embodiments of the present disclosure, a number of logical operations can be performed using the sense amplifier, and storing the result in the compute component (e.g., accumulator).

As shown in FIG. 3A, the sense amplifier 306 and the compute component 331 can be coupled to the array 330 via shift circuitry 323. In this example, the shift circuitry 323 comprises a pair of isolation devices (e.g., isolation transistors 321-1 and 321-2) coupled to data lines 305-1 (D) and 305-2 (D_), respectively). The isolation transistors 321-1 and 321-2 are coupled to a control signal 322 (NORM) that, when activated, enables (e.g., turns on) the isolation transistors 321-1 and 321-2 to couple the corresponding sense amplifier 306 and compute component 331 to a corresponding column of memory cells (e.g., to a corresponding pair of complementary data lines 305-1 (D) and 305-2 (D_)). According to various embodiments, conduction of isolation transistors 321-1 and 321-2 can be referred to as a "normal" configuration of the shift circuitry 323.

In the example illustrated in FIG. 3A, the shift circuitry 323 includes another (e.g., a second) pair of isolation devices (e.g., isolation transistors 321-3 and 321-4) coupled to a complementary control signal 319 (SHIFT), which can be activated, for example, when NORM is deactivated. The isolation transistors 321-3 and 321-4 can be operated (e.g., via control signal 319) such that a particular sense amplifier 306 and compute component 331 are coupled to a different pair of complementary data lines (e.g., a pair of complementary data lines different than the pair of complementary data lines to which isolation transistors 321-1 and 321-2 couple the particular sense amplifier 306 and compute component 331), or can couple a particular sense amplifier 306 and compute component 331 to another memory array (and isolate the particular sense amplifier 306 and compute component 331 from a first memory array). According to various embodiments, the shift circuitry 323 can be arranged as a portion of (e.g., within) the sense amplifier 306, for instance.

Although the shift circuitry 323 shown in FIG. 3A includes isolation transistors 321-1 and 321-2 used to couple particular sensing circuitry 350 (e.g., a particular sense amplifier 306 and corresponding compute component 331) to a particular pair of complementary data lines 305-1 (D) and 305-2 (D_) (e.g., DIGIT(n) and DIGIT(n)_) and isolation transistors 321-3 and 321-4 are arranged to couple the particular sensing circuitry 350 to an adjacent pair of complementary data lines in one particular direction (e.g., adjacent data lines DIGIT(n+1) and DIGIT(n+1)_ shown to the right in FIG. 3A), embodiments of the present disclosure are not so limited. For instance, shift circuitry can include isolation transistors 321-1 and 321-2 used to couple particular sensing circuitry to a particular pair of complementary data lines (e.g., DIGIT(n) and DIGIT(n)_and isolation transistors 321-3 and 321-4 arranged so as to be used to couple the particular sensing circuitry to an adjacent pair of complementary data lines in another particular direction (e.g., adjacent data lines DIGIT(n−1) and DIGIT(n−1)_shown to the left in FIG. 3A).

Embodiments of the present disclosure are not limited to the configuration of shift circuitry 323 shown in FIG. 3A. In a number of embodiments, shift circuitry 323 such as that shown in FIG. 3A can be operated (e.g., in conjunction with sense amplifiers 306 and compute components 331) in association with performing compute functions such as adding and subtracting functions without transferring data out of the sensing circuitry 350 via an I/O line (e.g., local I/O line (IO/IO_)), for instance.

Although not shown in FIG. 3A, each column of memory cells can be coupled to a column decode line that can be activated to transfer, via local I/O line, a data value from a corresponding sense amplifier 306 and/or compute component 331 to a control component external to the array such as an external processing resource (e.g., host processor and/or other functional unit circuitry). The column decode line can be coupled to a column decoder (e.g., column decoder). However, as described herein, in a number of embodiments, data need not be transferred via such I/O lines to perform logical operations in accordance with embodiments of the present disclosure. In a number of embodiments, shift circuitry 323 can be operated in conjunction with sense amplifiers 306 and compute components 331 to perform compute functions such as adding and subtracting functions without transferring data to a control component external to the array, for instance. The sensing circuitry 350 can be operated in several modes to perform logical operations, including a first mode in which a result of the logical operation is initially stored in the sense amplifier 306, and a second mode in which a result of the logical operation is initially stored in the compute component 331. Operation of the sensing circuitry 350 in the first mode is described below with respect to FIGS. 3 and 4, and operation of the sensing circuitry 350 in the second mode is described below with respect to FIGS. 10-13. Additionally with respect to the first operating mode, sensing circuitry 350 can be operated in both pre-sensing (e.g., sense amps fired before logical operation control signal active) and post-sensing (e.g., sense amps fired after logical operation control signal active) modes with a result of a logical operation being initially stored in the sense amplifier 306.

As described further below, the sense amplifier 306 can, in conjunction with the compute component 331, be operated to perform various logical operations using data from an array as input. In a number of embodiments, the result of a logical operation can be stored back to the array without transferring the data via a data line address access (e.g., without firing a column decode signal such that data is transferred to circuitry external from the array and sensing circuitry via local I/O lines). As such, a number of embodiments of the present disclosure can enable performing logical operations and compute functions associated therewith using less power than various previous approaches. Additionally, since a number of embodiments eliminate the need to transfer data across I/O lines in order to perform compute functions (e.g., between memory and discrete processor), a number of embodiments can enable an increased parallel processing capability as compared to previous approaches.

Figure 4:
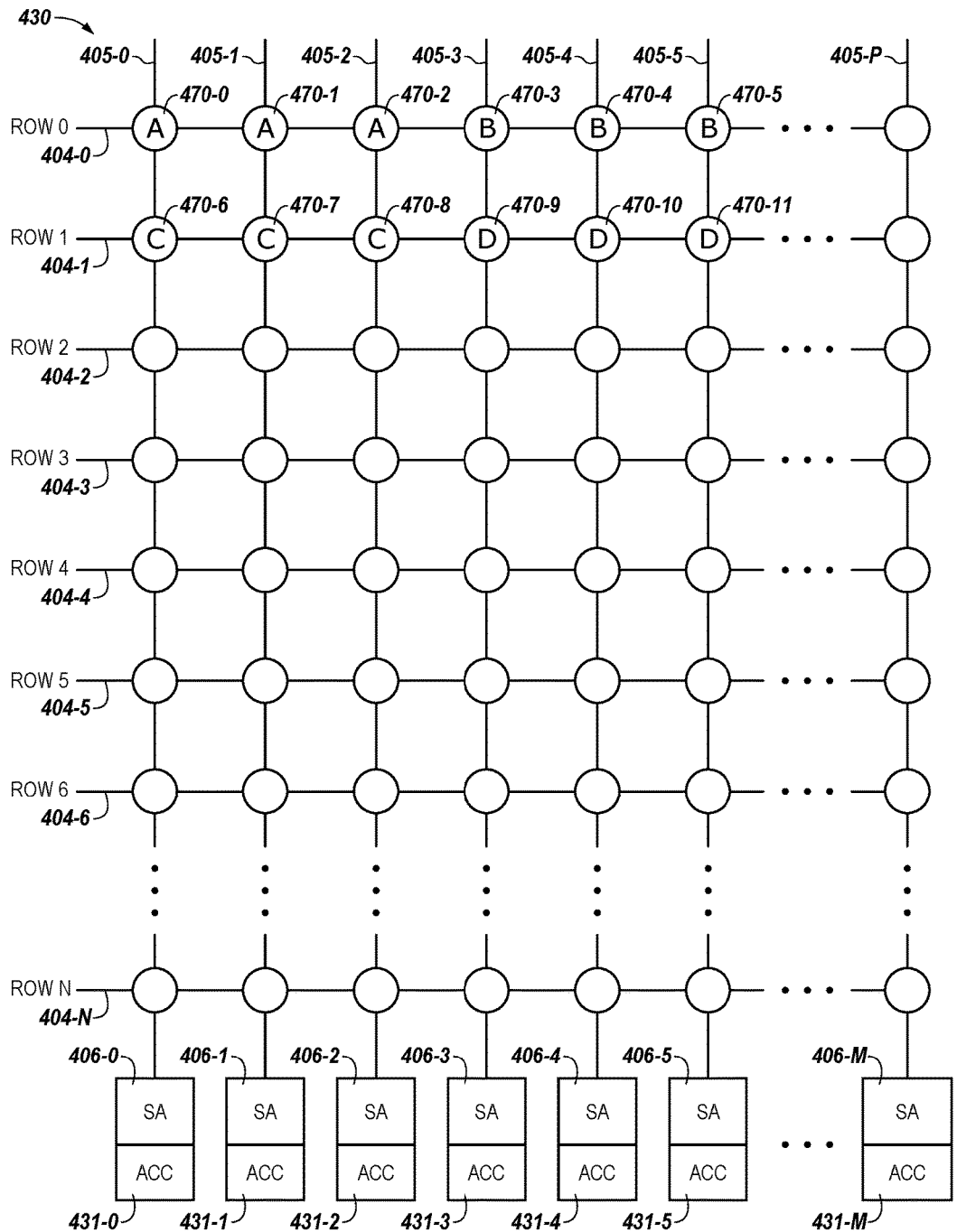
FIG. 4 illustrates a schematic diagram of a portion of a memory array having a horizontal storage layout in accordance with a number of embodiments of the present disclosure.

FIG. 4 illustrates a schematic diagram of a portion of a memory array having a horizontal storage layout in accordance with a number of embodiments of the present disclosure. FIG. 4 includes a plurality of memory cells that are coupled to select line 404-0, select line 404-1, select line 404-2, select line 404-3, select line 404-4, select line 404-5, select line 404-6, . . . , select line 404-N (e.g., referred to generally as select lines 404) and sense line 405-0, sense line 405-1, sense line 405-2, sense line 405-3, sense line 405-4, sense line 405-5, . . . , sense line 405-P (e.g., referred to generally as sense lines 405) in memory array 430. The select lines 404, sense lines 405, and memory array 430 are analogous to select lines 204, sense lines 205, and memory array 230 in FIG. 2, respectively. The sense lines 405 are coupled to sense amp 406-0, sense amp 406-1, sense amp 406-2, sense amp 406-3, sense amp 406-4, sense amp 406-5, . . . , sense amp 406-N (e.g., referred to generally as sense amps 406) and compute component 431-0, compute component 431-1, compute component 431-2, compute component 431-3, compute component 431-4, compute component 431-5, . . . , compute component 431-M, (e.g., referred to generally as compute components 431).

A horizontal storage layout can be used to store the data elements if the number of (L) logical oeprations to be performed in parallel is less than or equal to the quantity of the plurality of compute components divided by the quantity of bits that are a logical representation of a data element. For example, if there are 16,384 compute components and if each logical representation of data elements is made up of 64 bits, then a horizontal storage layout can be used to store the data elements if the number (L) of logical operations to be performed in parallel is less than or equal to 256.

Using a horizontal storage layout in this example can allow for more compute components to be used in parallel to perform the number of logical operations than if the data elements were stored in accordance with a vertical storage layout. For example, if there are 256 data elements that are represented using 64 bit-vectors, and if the 256 data elements have been stored in accordance with a horizontal storage layout, then all 16,384 compute components can be used at the same time to perform the 256 logical operations in parallel. In contrast, if a vertical storage layout as described in FIG. 5 has been used to store the 256 data elements, then only 256 of the 16,384 compute components can be used at the same time to perform the 256 logical operations in parallel.

FIG. 4 shows data elements in a horizontal storage layout. In a horizontal storage layout, each of a plurality of data elements can be stored along a select line. FIG. 4 includes two plurality of data elements. A first plurality of data elements can include data elements that are used as a first input to a logical operation. A second plurality of data elements can include data elements that are used as a second input to the logical operation. Logical operations that use more than two inputs or fewer than two inputs can have a corresponding quantity of plurality of data elements. For example, if a logical operation receives three inputs, then three plurality of data elements can be stored in accordance with a horizontal storage layout.

In FIG. 4, a logical representation of each data element consists of a three (3) bit-vector. A first plurality of data elements can include a first data element and a second data element. A second plurality of data elements can include a third data element and a fourth data element. A logical representation of a first data element can be stored in memory cell 470-0, memory cell 470-1, and memory cell 470-2. A logical representation of a second data element can be stored in memory cell 470-3, memory cell 470-4, and memory cell 470-5. A logical representation of a third data element can be stored in memory cell 470-6, memory cell 470-7, and memory cell 470-8. A logical representation of a fourth data element can be stored in memory cell 470-9, memory cell 470-10, and memory cell 470-11.

In FIG. 4, the memory cells that are associated with the first data element (e.g., memory cells 470-0, 470-1, 470-2) are marked with an "A" for ease of reference. The memory cells that are associated with the second data element (e.g., memory cells 470-3, 470-4, 470-5) are marked with a "B". The memory cells that are associated with the third data element (e.g., memory cells 470-6, 470-7, 470-8) are marked with a "C". The memory cells that are associated with the fourth data element (e.g., memory cells 470-9, 470-10, 470-11) are marked with a "D".

A horizontal storage layout can store logical representations of data elements along select lines 404. For example, logical representations of a first data element and a second data element can be stored in memory cells that are coupled to select line 404-0 while logical representations of the corresponding third data element and fourth data element are stored in memory cells that are coupled to select line 404-1.

Performing a number of logical operations in parallel on data stored in accordance with a horizontal storage layout can include using the compute components 431 that are associated with particular data elements to perform the logical operation. For example, if a first logical operation receives the first data element and the third data element as inputs, then the logical operation can be performed using compute component 431-0, compute component 431-1, and compute component 431-2. A compute component 431-2 can perform the logical operation using bits from memory cell 470-2 and memory cell 470-8. A compute component 431-1 can perform the logical operation using bits from memory cells 470-1 and memory cell 470-7. The compute component 431-0 can perform the logical operation using bits from memory cells 470-0 and memory cell 470-6. In a number of examples, the result of the first logical operation can be stored in memory cells coupled to select line 404-2 in accordance with a horizontal storage layout.

In a number of examples, storing the data elements in accordance with a horizontal storage layout can include determining an overhead cost associated with a particular logical operation. For example, if an addition operation is to be performed on the data elements, then a carry-bit overhead cost can be used to determine whether to use the horizontal storage layout or a different layout. For example, a carry-bit overhead can include moving a bit from a first accumulator in a compute component to a second accumulator in a different compute component. For example, adding the bits stored in memory cells 470-2 and 470-8 can result in a carry bit. The carry bit can be moved from an accumulator in compute component 431-2 to an accumulator in compute component 431-1 via an ISO device as shown in FIG. 3. The carry-bit overhead cost can be different depending on the storage layout used to store the data elements. For example, a carry-bit overhead cost associated with a horizontal storage layout can be greater than a carry-bit overhead cost associated with a vertical storage layout. The carry-bit overhead cost associated with the horizontal storage layout can include moving bits between compute components 431 while the carry-bit overhead cost associated with a vertical storage layout does not involve moving bits between compute components 431.

In a number of examples, performing the logical operation can include performing a number of logical operations in parallel (where the number of logical operations could be the same logical operation or different logical operations). For example, a first logical operation can be performed (using the first data element and the third data element) in parallel with a second logical operation (using the second data element and the fourth data element). Performing a number of logical operations in parallel can include only using a portion of the compute components 431 in parallel. For example, performing a logical operation on the first and third data elements in parallel with performing a logical operation on the second and fourth data elements can include performing a logical operation using the bits stored in memory cell 470-2 and memory cell 470-8 in parallel with performing a logical operation using the bits stored in memory cell 470-5 and memory cell 470-11. Performing a number of logical operations in parallel can include, but is not limited to, performing the same logical operation on a number of data elements in parallel.

Figure 5:
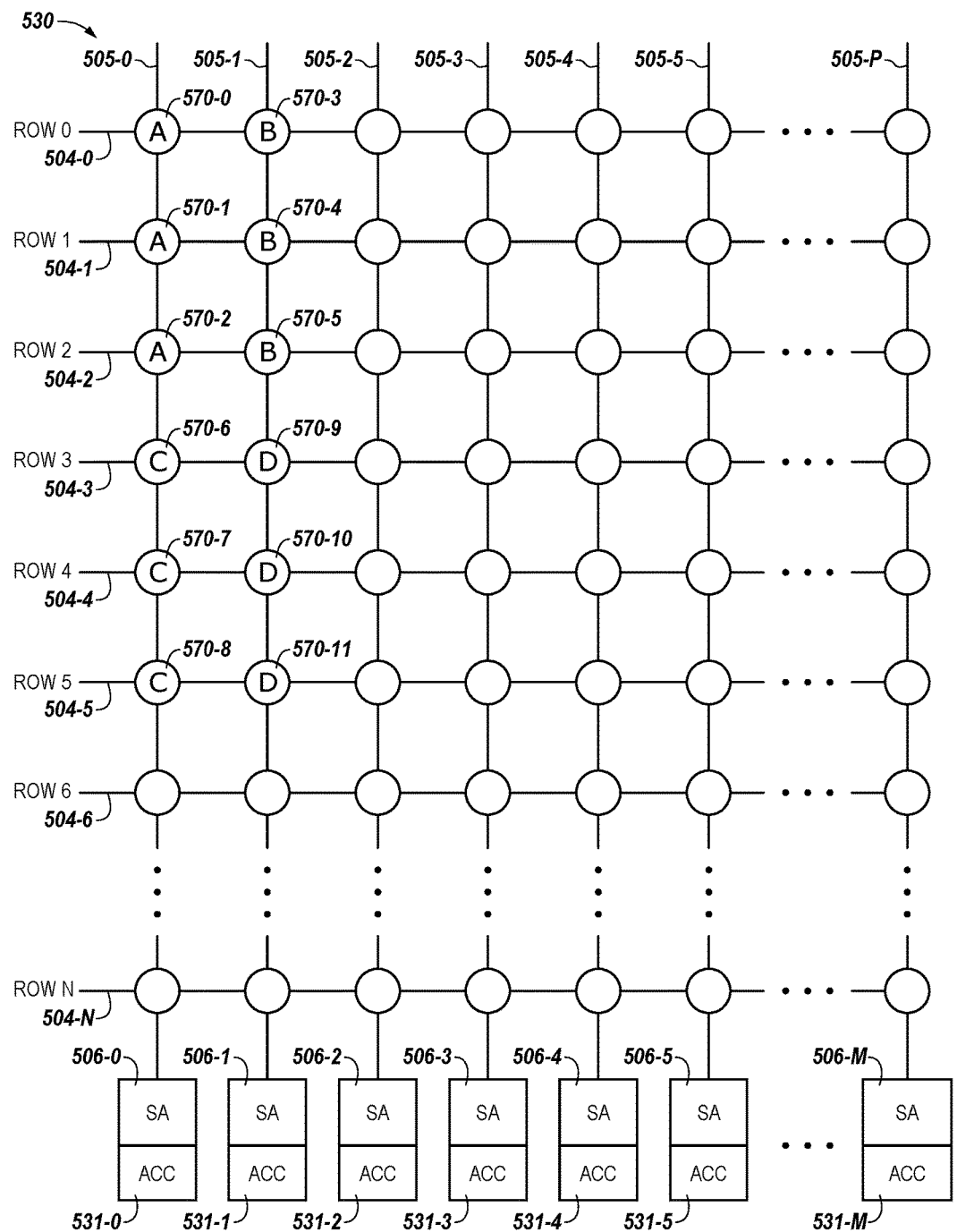
FIG. 5 illustrates a schematic diagram of a portion of a memory array having a vertical storage layout in accordance with a number of embodiments of the present disclosure.

FIG. 5 illustrates a schematic diagram of a portion of a memory array having a vertical storage layout in accordance with a number of embodiments of the present disclosure. FIG. 5 includes a plurality of memory cells that are coupled to select line 504-0, select line 504-1, select line 404-2, select line 504-3, select line 504-4, select line 504-5, select line 504-6, . . . , select line 504-N (e.g., referred to generally as select lines 504) and sense line 505-0, sense line 505-1, sense line 505-2, sense line 505-3, sense line 505-4, sense line 505-5, . . . , sense line 505-P (e.g., referred to generally as sense lines 505) in memory array 530. The select lines 504, sense lines 505, and memory array 530 are analogous to select lines 204, sense lines 205, and memory array 230 in FIG. 2 and select lines 404, sense lines 405, and memory array 430 in FIG. 4, respectively. The sense lines 505 are coupled to sense amp 506-0, sense amp 506-1, sense amp 506-2, sense amp 506-3, sense amp 506-4, sense amp 506-5, . . . , sense amp 506-N (e.g., referred to generally as sense amps 506) and compute component 531-0, compute component 531-1, compute component 531-2, compute component 531-3, compute component 531-4, compute component 531-5, . . . , compute component 531-M, (e.g., referred to generally as compute components 531).

A vertical storage layout can be used to store the data elements if the number of logical operations to be performed in parallel is greater than or equal to the quantity of the plurality of compute components. For example, if there are 16,384 compute components (e.g., if M=16,384) and if the number of logical operations to be performed in parallel is greater than or equal to 16,384, then a vertical storage layout can be used to store the data elements.

Using a vertical storage layout in the above example can allow for more compute components to be used at the same time to perform the 16,384 (or more) logic operations in parallel than if a horizontal storage layout were used. For example, if data elements are represented using 64 bit-vectors, and if the data elements have been stored in accordance with a vertical storage layout, then all 16,384 compute components can be used at the same time to perform the 16,384 (or more) logical operations in parallel. In contrast, if a horizontal storage layout as described in FIG. 4 has been used, then the 16,834 compute components can only be used to perform 256 logical operations in parallel at a time. Additional logical operations can be performed in parallel in intervals of 256 logical operations.

FIG. 5 shows data elements in a vertical storage layout. In a vertical storage layout, each of a plurality of data elements can be stored along a sense line. FIG. 5 includes two plurality of data elements. A first plurality of data elements can include data elements that are used as a first input to a logical operation. A second plurality of data elements can include data elements that are used as a second input to the logical operation. Logical operations that use more than two inputs or fewer than two inputs can have a corresponding quantity of plurality of data elements. For example, if a logical operation receives three inputs, then three plurality of data elements can be stored along each sense line.

In FIG. 5, a logical representation of each data element consist of a three (3) bit-vector. A first plurality of data elements can include a first data element and a second data element. A second plurality of data elements can include a third data element and a fourth data element. A logical representation of a first data element can be stored in memory cell 570-0, memory cell 570-1, and memory cell 570-2. A logical representation of a second data element can be stored in memory cell 570-3, memory cell 570-4, and memory cell 570-5. A logical representation of a third data element can be stored in memory cell 570-6, memory cell 570-7, and memory cell 570-8. A logical representation of a fourth data element can be stored in memory cell 570-9, memory cell 570-10, and memory cell 570-11.

In FIG. 5, the memory cells that are associated with the first data element (e.g., memory cells 570-0, 570-1, 570-2) are marked with an "A" for ease of reference. The memory cells that are associated with the second data element (e.g., memory cells 570-3, 570-4, 570-5) are marked with a "B". The memory cells that are associated with the third data element (e.g., memory cells 570-6, 570-7, 570-8) are marked with a "C". The memory cells that are associated with the fourth data element (e.g., memory cells 570-9, 570-10, 570-11) are marked with a "D".

A vertical storage layout can store logical representations of data elements along sense lines 505. For example, the logical representation of a first data element can be stored in memory cells that are coupled to sense line 505-0. A second data element can be stored in memory cells that are coupled to sense line 505-1. The third data element can be stored in memory cells that are coupled to sense line 505-0. The fourth data element can be stored in memory cells that are coupled to sense line 505-1.

Performing a logical operation using a vertical storage layout can include using the compute components 531 that are associated with particular data elements to perform the logical operation. For example, if a logical operation receives the first data element and the third data element as input, then the logical operation can be performed using compute component 531-0 because both the logical representations of the first data element and the third data element are stored in memory cells that are coupled to sense line 505-0. A compute component 531-0 can perform the logical operation using associated bits from the first data element and the third data element. Bits can be associated when they are a same index within their respective bit-vectors that are a logical representation of data values. For example, a bit stored in memory cell 570-2 can have a same index as a bit stored in memory cell 570-8. In a number of examples, the results of the logical operation can be stored in accordance with a vertical storage layout.

In a number of examples, performing the logical operation can include performing a number of logical operations in parallel. For example, a first logical operation can be performed (on the first data element and the third data element) in parallel with a second logical operation (on the second data element and the fourth data element). Performing a logical operation in parallel can include using all of the compute components 431 in parallel. For example, performing a logical operation on the first and third data elements and on the second and fourth data elements can include using the accumulators in compute component 531-0 and 531-1 in parallel. Furthermore, if 16,834 or more logical operations are to be performed in parallel, then storing the data elements in accordance with a vertical layout can maximize the number of compute components 531 used at the same time to perform the logical operations in parallel.

Figure 6:
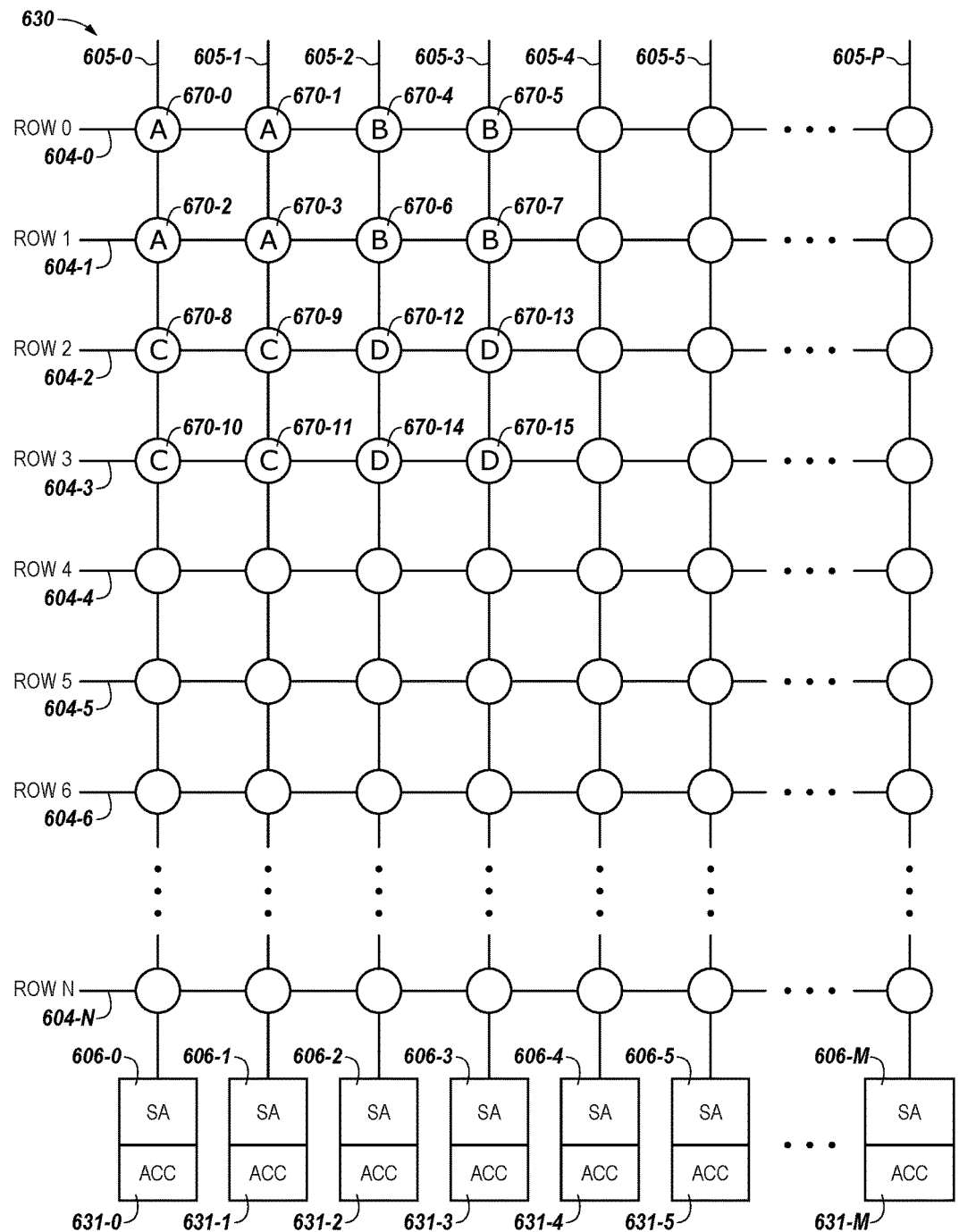
FIG. 6 illustrates a schematic diagram of a portion of a memory array having a hybrid storage layout in accordance with a number of embodiments of the present disclosure.

FIG. 6 illustrates a schematic diagram of a portion of a memory array having a hybrid storage layout in accordance with a number of embodiments of the present disclosure. FIG. 6 includes a plurality of memory cells that are coupled to select line 604-0, select line 604-1, select line 604-2, select line 604-3, select line 604-4, select line 604-5, select line 604-6, . . . , select line 604-N (e.g., referred to generally as select lines 604) and sense line 605-0, sense line 605-1, sense line 605-2, sense line 605-3, sense line 605-4, sense line 605-5, . . . , sense line 605-P (e.g., referred to generally as sense lines 605) in memory array 630. The select lines 604, sense lines 605, and memory array 630 are analogous to select lines 204, sense lines 205, and memory array 230 in FIG. 2, select lines 404, sense lines 405, and memory array 430 in FIG. 4, and select lines 504, sense lines 505, and memory array 530 in FIG. 5, respectively. The sense lines 605 are coupled to sense amp 606-0, sense amp 606-1, sense amp 606-2, sense amp 606-3, sense amp 606-4, sense amp 606-5, . . . , sense amp 606-N (e.g., referred to generally as sense amps 606) and compute component 631-0, compute component 631-1, compute component 631-2, compute component 631-3, compute component 631-4, compute component 631-5, . . . , compute component 631-M, (e.g., referred to generally as compute components 631).

A hybrid storage layout can be used to store the data elements if the number of logical operations to be performed in parallel is less than the quantity of the plurality of compute components, but greater than the quantity of the plurality of compute components divided by the quantity of bits that are a logical representation of a data element. For example, if there 16,384 compute components (e.g., if M=16,384) and if the number of logical operations to be performed in parallel is less than 16,384 and greater than 256, then a hybrid storage layout can be used to store the data elements.

Using a hybrid storage layout in the above example can allow for more compute components to be used at the same time than if the data elements were stored in accordance with either a horizontal storage layout or a vertical storage layout. For example, if fewer than 16,834, but more than 256 logical operations are to be performed in parallel on data elements that are represented using 64 bit-vectors, and if the data elements have been stored in accordance with a hybrid storage layout, then performing that number of logical operations in parallel can use more compute components at the same time than if the data elements had been stored in accordance with either a vertical or horizontal storage layout.

Figure 7:
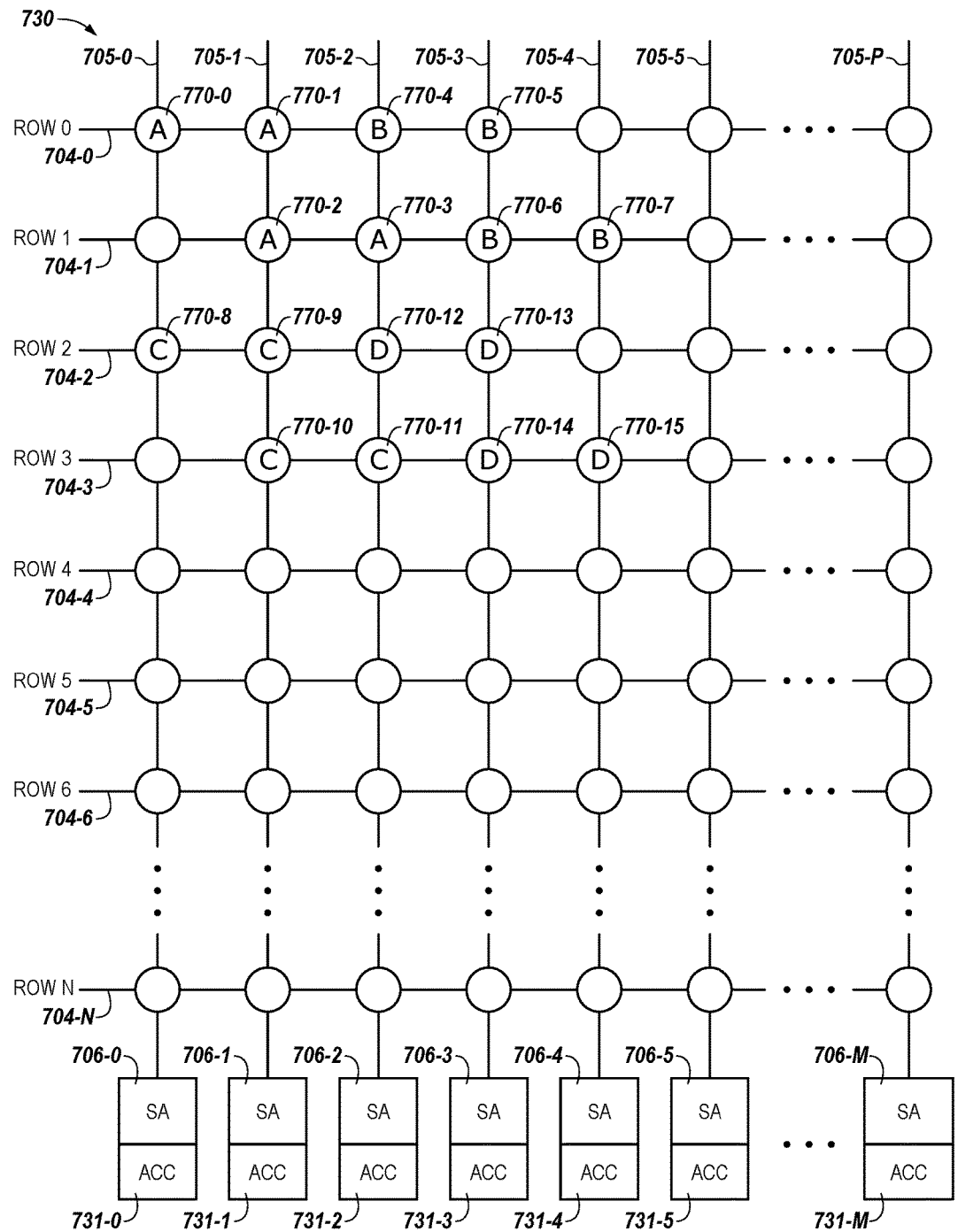
FIG. 7 illustrates a schematic diagram of a portion of a memory array having a hybrid storage layout in accordance with a number of embodiments of the present disclosure.

FIG. 6 and FIG. 7 show data elements in different types of hybrid storage layout. In a hybrid storage layout each of a plurality of data elements can be stored along a sense line and a select line. FIG. 6 includes two plurality of data elements. A first plurality of data elements can include data elements that are used as a first input to a logical operation. A second plurality of data elements can include data elements that are used as a second input to the logical operation.

In FIG. 6, a logical representation of each data element consist of a four (4) bit-vector. A first plurality of data elements can include a first data element and a second data element. A second plurality of data elements can include a third data element and a fourth data element. A logical representation of a first data element can be stored in memory cell 670-0, memory cell 670-1, memory cell 670-2, and memory cell 670-3. A logical representation of a second data element can be stored in memory cell 670-4, memory cell 670-5, memory cell 670-6, and memory cell 670-7. A logical representation of a third data element can be stored in memory cell 670-8, memory cell 670-9, memory cell 670-10, and memory cell 670-11. A logical representation of a fourth data element can be stored in memory cell 670-12, memory cell 670-13, memory cell 670-14, and memory cell 670-15.

In FIG. 6, the memory cells that are associated with the first data element (e.g., memory cells 670-0, 670-1, 670-2, 670-3) are marked with an "A" for ease of reference. The memory cells that are associated with the second data element (e.g., memory cells 670-4, 670-5, 670-6, 670-7) are marked with a "B". The memory cells that are associated with the third data element (e.g., memory cells 670-8, 670-9, 670-10, 670-11) are marked with a "C". The memory cells that are associated with the fourth data element (e.g., memory cells 670-12, 670-13, 670-14, 670-15) are marked with a "D".

The logical representation of a first data element can be stored in memory cells that are coupled to sense line 605-0, sense line 605-1, select line 604-0, and select line 604-1. A second data element can be stored in memory cells that are coupled to sense line 605-2, sense line 605-3, select line 604-0, and select line 604-1. The third data element can be stored in memory cells that are coupled to sense line 605-0, sense line 605-1, select line 604-2, and select line 604-3. The fourth data element can be stored in memory cells that are coupled to sense line 605-2, sense line 605-3, select line 604-2, and select line 604-3.

Performing a number of logical operations in parallel on data elements stored in accordance with a hybrid storage layout can include using the compute components 631 that are associated with particular data elements to perform the logical operation. For example, if a logical operation receives the first data element and the third data element as input, then the logical operation can be performed using compute component 631-0 and compute component 631-1 because both the logical representations of the first data element and the third data element are stored in memory cells that are coupled to sense line 605-0 and sense line 605-1. A compute component 631-0 can perform the logical operation using associated bits from the first data element and the third data element. Bits can be associated when they are a same index within their respective bit-vectors that are a logical representation of data values. For example, a bit stored in memory cell 670-0 can have a same index as a bit stored in memory cell 670-8. In a number of examples, the results of the logical operation can be stored in accordance with a hybrid storage layout.

In a number of examples, storing the data elements in accordance with a hybrid storage layout can include determining an overhead cost associated with a particular logical operation. For example, if an addition logical operation is performed on the data elements using a hybrid storage layout, then a carry-bit overhead cost can be used to determine whether to use the hybrid storage layout or a different storage layout. For example, a carry-bit overhead in a hybrid storage layout can include moving a bit from a first compute component to a second (e.g., different) compute component and then moving a bit from the second compute component to the first compute component. For example, adding the bits stored in memory cell 670-3 and memory cell 670-11 can result in a carry bit. The carry bit can be moved from compute component 631-1 to compute component 631-0. Adding the bits stored in memory cell 670-2 and memory cell 670-10 can further include adding the carry bit that was moved from the compute component 631-1 to the compute component 631-0. Adding the bits stored in memory cell 670-2 and memory cell 670-10 can also result in a carry bit. However, the carry bit can be moved from compute component 631-0 to compute component 631-1 to align with the addition of a bit stored in memory cell 670-1 and a bit stored in memory cell 670-9. In a number of examples, the carry-bit cost associated with a hybrid storage layout can be greater than a carry-bit cost associated with a vertical storage layout and/or a horizontal storage layout.

In FIG. 6, the hybrid storage layout uses powers of two (e.g., groupings of two) to store bits that are a logical representation of the data elements. For example, in FIG. 6, two bits that are associated with a data element are stored in memory cell 670-0 and memory cell 670-1 that are coupled to select line 604-0 and two different bits that are associated with the data element are stored in memory cell 670-2 and memory cell 670-3 that are coupled to select line 604-1. In a number of examples, a hybrid storage layout can use other groupings to store data elements. A hybrid storage layout can store bits from a data element in groupings of four (4), eight (8), and/or sixteen (16), among other possible groupings. That is, a hybrid storage layout can store a data element by storing Q bits along each of X select lines.

In FIG. 6, a logical representation of each data element is stored in memory cells that are coupled a quantity of sense lines that is equal to the size of the groupings. For example, if a data element is stored in groupings of two then the memory cells that store the logical representation of the data elements can be coupled to two sense lines. That is, memory cell 670-0 and memory cell 670-2 are coupled to the same sense line and memory cell 670-1 and memory cell 670-3 are coupled to the same sense line. However, in FIG. 7, a logical representation of each data element can be stored in memory cells that are coupled to a quantity of sense lines that is greater than the size of the groupings.

FIG. 7 illustrates a schematic diagram of a portion of a memory array having a hybrid storage layout in accordance with a number of embodiments of the present disclosure. FIG. 7 includes a memory array 730 that is analogous to memory array 630 in FIG. 6.

In FIG. 7, the logical representation of a first data element can be stored in memory cells 770-0, 770-1, 770-2, 770-3 that are coupled to sense line 705-0, sense line 705-1, sense line 705-2, select line 704-0, and select line 704-1. A second data element can be stored in memory cells 770-4, 770-5, 770-6, 770-7 that are coupled to sense line 705-2, sense line 705-3, sense line 705-4, select line 704-0, and select line 704-1. The third data element can be stored in memory 770-8, 770-9, 770-10, 770-11 cells that are coupled to sense line 705-0, sense line 705-1, sense line 705-2, select line 704-2, and select line 704-3. The fourth data element can be stored in memory cells 770-12, 770-13, 770-14, 770-15 that are coupled to sense line 705-2, sense line 705-3, sense line 705-4, select line 704-2, and select line 704-3.

In FIG. 7, the memory cells that are associated with the first data element (e.g., memory cells 770-0, 770-1, 770-2, 770-3) are marked with an "A" for ease of reference. The memory cells that are associated with the second data element (e.g., memory cells 770-4, 770-5, 770-6, 770-7) are marked with a "B". The memory cells that are associated with the third data element (e.g., memory cells 770-8, 770-9, 770-10, 770-11) are marked with a "C". The memory cells that are associated with the fourth data element (e.g., memory cells 770-12, 770-13, 770-14, 770-15) are marked with a "D".

In FIG. 7, a logical representation of each data elements is composed of a first portion and a second portion. For example, a first portion of a logical representation of the first data element is stored in memory cell 770-0 and memory cell 770-1 and a second portion of the logical representation of the first data element is stored in memory cell 770-2 and memory cell 770-3. The first portion of the logical representation of the first data element is stored in memory cells that are coupled to a sense line 705-0 and a sense line 705-1. The second portion of the logical representation of the first data element is stored in memory cells that are coupled to sense line 705-1 and sense line 705-2. That is, the logical representation of the first data element is stored in memory cells that are coupled to a quantity of sense lines that is greater than the size of the groupings. The size of the groupings used in FIG. 7 is two and the quantity of sense lines used to store any of the portions of the data element is three.

In a number of examples, storing data elements in accordance with a hybrid storage layout can incur additional costs. In storing the data elements in accordance with a hybrid storage layout, a number of memory cells may not be used to store data elements that may have been used in either a vertical storage layout and/or a horizontal storage layout. The memory cells may not be used to store data elements due to the diagonal nature of the hybrid storage layout. That is, as data elements are stored along a diagonal then the memory cells either above and/or below may not be able to store data elements because there may not be sufficient memory cells along a diagonal.

In a number of examples, storing data elements in accordance with a hybrid storage layout can reduce the overhead associated with a carry bit. For example, a logical operation that is performed on the bits stored in memory cell 770-2 and memory cell 770-10 may result in a carry bit. However, the carry bit may be latched in the compute component 731-1. The compute component 731-1 may also be the compute component used to perform the logical operation on the bits stored in memory cell 770-1 and memory cell 770-9. As a result, there may be a reduced need to move the carry bit from one compute component to a different compute component due to the alignment of the memory cell 770-1, memory cell 770-2, memory cell 770-9, and memory cell 770-10. The overhead associated with a carry bit in a hybrid layout may be smaller than the overhead associated with a carry bit in a horizontal layout. However, the overhead associated with a carry bit in the hybrid layout may be larger than the overhead associated with a carry bit in the vertical layout.

The functionality of the sensing circuitry 350 of FIG. 3A is described below and summarized in Table 1 below with respect to performing logical operations and initially storing a result in the sense amplifier 306. Initially storing the result of a particular logical operation in the primary latch of sense amplifier 306 can provide improved versatility as compared to previous approaches in which the result may initially reside in compute component 331 (e.g., in a secondary latch) and then be subsequently transferred to the sense amplifier 306, for instance.

TABLE 1

| Operation | Accumulator | Sense Amp |
|---|---|---|
| AND | Unchanged | Result |
| OR | Unchanged | Result |
| NOT | Unchanged | Result |
| SHIFT | Unchanged | Shifted Data |

Initially storing the result of a particular operation in the sense amplifier 306 (e.g., without having to perform an additional operation to move the result from the compute component 331 (e.g., accumulator) to the sense amplifier 306) is advantageous because, for instance, the result can be written to a row (of the array of memory cells) or back into the accumulator without performing a precharge cycle (e.g., on the complementary data lines 305-1 (D) and/or 305-2 (D_)).

Figure 8:
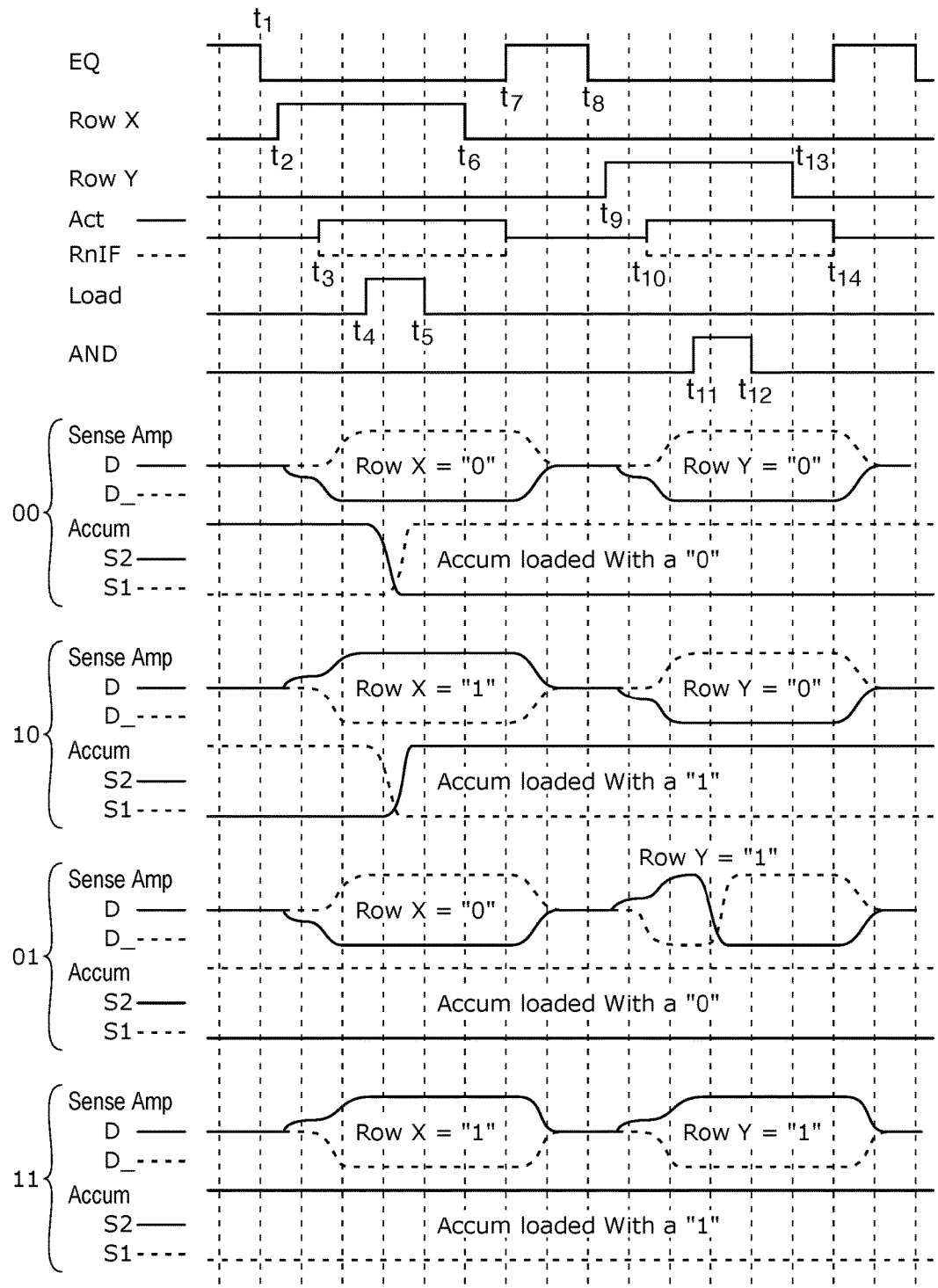
FIG. 8 illustrate a timing diagram associated with performing a number of logical operations using sensing circuitry in accordance with a number of embodiments of the present disclosure.

FIG. 8 illustrates a timing diagram associated with performing a number of logical operations using sensing circuitry in accordance with a number of embodiments of the present disclosure. FIG. 8 illustrates a timing diagram associated with initiating an AND logical operation on a first operand and a second operand. In this example, the first operand is stored in a memory cell coupled to a first access line (e.g., ROW X) and the second operand is stored in a memory cell coupled to a second access line (e.g., ROW Y). Although the example refers to performing an AND on data stored in cells corresponding to one particular column, embodiments are not so limited. For instance, an entire row of data values can be ANDed, in parallel, with a different row of data values. For example, if an array comprises 2,048 columns, then 2,048 AND operations could be performed in parallel.

FIG. 8 illustrates a number of control signals associated with operating sensing circuitry (e.g., 350) to perform the AND logical operation. "EQ" corresponds to an equilibrate signal applied to the sense amp 306, "ROW X" corresponds to an activation signal applied to access line 304-X, "ROW Y" corresponds to an activation signal applied to access line 304-Y, "Act" and "RnIF"correspond to a respective active positive and negative control signal applied to the sense amp 306, "LOAD" corresponds to a load control signal (e.g., LOAD/PASSD and LOAD/PASSDb shown in FIG. 3A), and "AND" corresponds to the AND control signal shown in FIG. 3A. FIG. 8 also illustrates the waveform diagrams showing the signals (e.g., voltage signals) on the digit lines D and D_ corresponding to sense amp 306 and on the nodes S1 and S2 corresponding to the compute component 331 (e.g., Accum) during an AND logical operation for the various data value combinations of the Row X and Row Y data values (e.g., diagrams correspond to respective data value combinations 00, 10, 01, 11). The particular timing diagram waveforms are discussed below with respect to the pseudo code associated with an AND operation of the circuit shown in FIG. 3A.

An example of pseudo code associated with loading (e.g., copying) a first data value stored in a cell coupled to row 304-X into the accumulator can be summarized as follows:
Copy Row X into the Accumulator:
  Deactivate EQ
  Open Row X
  Fire Sense Amps (after which Row X data resides in the sense amps)
  Activate LOAD (sense amplifier data (Row X) is transferred to nodes
  S1 and S2 of the Accumulator and resides there dynamically)
  Deactivate LOAD
  Close Row X
  Precharge In the pseudo code above, "Deactivate EQ" indicates that an equilibration signal (EQ signal shown in FIG. 8) corresponding to the sense amplifier 306 is disabled at $t_1$ as shown in FIG. 8 (e.g., such that the complementary data lines (e.g., 305-1 (D) and 305-2 (D_) are no longer shorted to $V_{DD}/2$). After equilibration is disabled, a selected row (e.g., ROW X) is enabled (e.g., selected, opened such as by activating a signal to select a particular row) as indicated by "Open Row X" in the pseudo code and shown at $t_2$ for signal Row X in FIG. 8. When the voltage signal applied to ROW X reaches the threshold voltage (Vt) of the access transistor (e.g., 302-2) corresponding to the selected cell, the access transistor turns on and couples the data line (e.g., 305-2 (D_) to the selected cell (e.g., to capacitor 303-2) which creates a differential voltage signal between the data lines.

After Row X is enabled (e.g., activated), in the pseudo code above, "Fire Sense Amps" indicates that the sense amplifier 306 is enabled to set the primary latch and subsequently disabled. For example, as shown at $t_3$ in FIG. 8, the ACT positive control signal (e.g., 390 shown in FIG. 3B) goes high and the RnIF negative control signal (e.g., 328 shown in FIG. 3B) goes low, which amplifies the differential signal between 305-1 (D) and D_ 305-2, resulting in a voltage (e.g., $V_{DD}$) corresponding to a logic 1 or a voltage (e.g., GND) corresponding to a logic 0 being on data line 305-1 (D) (and the voltage corresponding to the other logic state being on complementary data line 305-2 (D_)). The sensed data value is stored in the primary latch of sense amplifier 306. The primary energy consumption occurs in charging the data lines (e.g., 305-1 (D) or 305-2 (D_)) from the equilibration voltage $V_{DD}/2$ to the rail voltage $V_{DD}$.

The four sets of possible sense amplifier and accumulator signals illustrated in FIG. 8 (e.g., one for each combination of Row X and Row Y data values) shows the behavior of signals on data lines D and D_. The Row X data value is stored in the primary latch of the sense amp. It should be noted that FIG. 3A shows that the memory cell including storage element 302-2, corresponding to Row X, is coupled to the complementary data line D_, while the memory cell including storage element 302-1, corresponding to Row Y, is coupled to data line D. However, as can be seen in FIG. 3A, the charge stored in memory cell 302-2 (corresponding to Row X) corresponding to a "0" data value causes the voltage on data line D_ (to which memory cell 302-2 is coupled) to go high and the charge stored in memory cell 302-2 corresponding to a "1" data value causes the voltage on data line D_ to go low, which is opposite correspondence between data states and charge stored in memory cell 302-2, corresponding to Row Y, that is coupled to data line D. These differences in storing charge in memory cells coupled to different data lines is appropriately accounted for when writing data values to the respective memory cells.

After firing the sense amps, in the pseudo code above, "Activate LOAD" indicates that the LOAD control signal goes high as shown at $t_4$ in FIG. 8, causing load/pass transistors 318-1 and 318-2 to conduct. In this manner, activating the LOAD control signal enables the secondary latch in the accumulator of the compute component 331. The sensed data value stored in the sense amplifier 306 is transferred (e.g., copied) to the secondary latch. As shown for each of the four sets of possible sense amplifier and accumulator signals illustrated in FIG. 8, the behavior at inputs of the secondary latch of the accumulator indicates the secondary latch is loaded with the Row X data value. As shown in FIG. 8, the secondary latch of the accumulator may flip (e.g., see accumulator signals for Row X="0" and Row Y="0" and for Row X="1" and Row Y="0"), or not flip (e.g., see accumulator signals for Row X="0" and Row Y="1" and for Row X="1" and Row Y="1"), depending on the data value previously stored in the dynamic latch.

After setting the secondary latch from the data values stored in the sense amplifier (and present on the data lines 305-1 (D) and 305-2 (D_), in the pseudo code above, "Deactivate LOAD" indicates that the LOAD control signal goes back low as shown at $t_5$ in FIG. 8 to cause the load/pass transistors 318-1 and 318-2 to stop conducting and thereby isolate the dynamic latch from the complementary data lines. However, the data value remains dynamically stored in secondary latch of the accumulator.

After storing the data value on the secondary latch, the selected row (e.g., ROW X) is disabled (e.g., deselected, closed such as by deactivating a select signal for a particular row) as indicated by "Close Row X" and indicated at $t_6$ in FIG. 8, which can be accomplished by the access transistor turning off to decouple the selected cell from the corresponding data line. Once the selected row is closed and the memory cell is isolated from the data lines, the data lines can be precharged as indicated by the "Precharge" in the pseudo code above. A precharge of the data lines can be accomplished by an equilibrate operation, as indicated in FIG. 8 by the EQ signal going high at $t_7$. As shown in each of the four sets of possible sense amplifier and accumulator signals illustrated in FIG. 8 at $t_7$, the equilibrate operation causes the voltage on data lines D and D_ to each return to $V_{DD}/2$.

Equilibration can occur, for instance, prior to a memory cell sensing operation or the logical operations (described below).

A subsequent operation phase associated with performing the AND or the OR operation on the first data value (now stored in the sense amplifier 306 and the secondary latch of the compute component 331) and the second data value (stored in a memory cell 302-1 coupled to Row Y 304-Y) includes performing particular steps which depend on the whether an AND or an OR is to be performed. Examples of pseudo code associated with "ANDing" and "ORing" the data value residing in the accumulator (e.g., the first data value stored in the memory cell 302-2 coupled to Row X 304-X) and the second data value (e.g., the data value stored in the memory cell 302-1 coupled to Row Y 304-Y) are summarized below. Example pseudo code associated with "ANDing" the data values can include:

---

Deactivate EQ
Open Row Y
Fire Sense Amps (after which Row Y data resides in the sense amps)
Close Row Y
　The result of the logic operation, in the next operation, will be placed on the sense amp, which will overwrite any row that is active.
　Even when Row Y is closed, the sense amplifier still contains the Row Y data value.
Activate AND
　This results in the sense amplifier being written to the value of the function (e.g., Row X AND Row Y)
　If the accumulator contains a "0" (i.e., a voltage corresponding to a "0" on node S2 and a voltage corresponding to a "1" on node S1), the sense amplifier data is written to a "0"
　If the accumulator contains a "1" (i.e., a voltage corresponding to a "1" on node S2 and a voltage corresponding to a "0" on node S1), the sense amplifier data remains unchanged (Row Y data)
　This operation leaves the data in the accumulator unchanged.
Deactivate AND
Precharge

---

In the pseudo code above, "Deactivate EQ" indicates that an equilibration signal corresponding to the sense amplifier 306 is disabled (e.g., such that the complementary data lines 305-1 (D) and 305-2 (D_) are no longer shorted to $V_{DD}/2$), which is illustrated in FIG. 8 at $t_8$. After equilibration is disabled, a selected row (e.g., ROW Y) is enabled as indicated in the pseudo code above by "Open Row Y" and shown in FIG. 8 at $t_9$. When the voltage signal applied to ROW Y reaches the threshold voltage (Vt) of the access transistor (e.g., 302-1) corresponding to the selected cell, the access transistor turns on and couples the data line (e.g., D_ 305-1) to the selected cell (e.g., to capacitor 303-1) which creates a differential voltage signal between the data lines.

After Row Y is enabled, in the pseudo code above, "Fire Sense Amps" indicates that the sense amplifier 306 is enabled to amplify the differential signal between 305-1 (D) and 305-2 (D_), resulting in a voltage (e.g., $V_{DD}$) corresponding to a logic 1 or a voltage (e.g., GND) corresponding to a logic 0 being on data line 305-1 (D) (and the voltage corresponding to the other logic state being on complementary data line 305-2 (D_)). As shown at $t_{10}$ in FIG. 8, the ACT positive control signal (e.g., 390 shown in FIG. 3B) goes high and the RnIF negative control signal (e.g., 328 shown in FIG. 3B) goes low to fire the sense amps. The sensed data value from memory cell 302-1 is stored in the primary latch of sense amplifier 306, as previously described. The secondary latch still corresponds to the data value from memory cell 302-2 since the dynamic latch is unchanged.

After the second data value sensed from the memory cell 302-1 coupled to Row Y is stored in the primary latch of sense amplifier 306, in the pseudo code above, "Close Row Y" indicates that the selected row (e.g., ROW Y) can be disabled if it is not desired to store the result of the AND logical operation back in the memory cell corresponding to Row Y. However, FIG. 8 shows that Row Y is left enabled such that the result of the logical operation can be stored back in the memory cell corresponding to Row Y. Isolating the memory cell corresponding to Row Y can be accomplished by the access transistor turning off to decouple the selected cell 302-1 from the data line 305-1 (D). After the selected Row Y is configured (e.g., to isolate the memory cell or not isolate the memory cell), "Activate AND" in the pseudo code above indicates that the AND control signal goes high as shown in FIG. 8 at $t_{11}$, causing pass transistor 307-1 to conduct. In this manner, activating the AND control signal causes the value of the function (e.g., Row X AND Row Y) to be written to the sense amp.

With the first data value (e.g., Row X) stored in the dynamic latch of the accumulator 331 and the second data value (e.g., Row Y) stored in the sense amplifier 306, if the dynamic latch of the compute component 331 contains a "0" (i.e., a voltage corresponding to a "0" on node S2 and a voltage corresponding to a "1" on node S1), the sense amplifier data is written to a "0" (regardless of the data value previously stored in the sense amp) since the voltage corresponding to a "1" on node S1 causes transistor 309-1 to conduct thereby coupling the sense amplifier 306 to ground through transistor 309-1, pass transistor 307-1 and data line 305-1 (D). When either data value of an AND operation is "0," the result is a "0." Here, when the second data value (in the dynamic latch) is a "0," the result of the AND operation is a "0" regardless of the state of the first data value, and so the configuration of the sensing circuitry causes the "0" result to be written and initially stored in the sense amplifier 306. This operation leaves the data value in the accumulator unchanged (e.g., from Row X).

If the secondary latch of the accumulator contains a "1" (e.g., from Row X), then the result of the AND operation depends on the data value stored in the sense amplifier 306 (e.g., from Row Y). The result of the AND operation should be a "1" if the data value stored in the sense amplifier 306 (e.g., from Row Y) is also a "1," but the result of the AND operation should be a "0" if the data value stored in the sense amplifier 306 (e.g., from Row Y) is also a "0." The sensing circuitry 350 is configured such that if the dynamic latch of the accumulator contains a "1" (i.e., a voltage corresponding to a "1" on node S2 and a voltage corresponding to a "0" on node S1), transistor 309-1 does not conduct, the sense amplifier is not coupled to ground (as described above), and the data value previously stored in the sense amplifier 306 remains unchanged (e.g., Row Y data value so the AND operation result is a "1" if the Row Y data value is a "1" and the AND operation result is a "0" if the Row Y data value is a "0"). This operation leaves the data value in the accumulator unchanged (e.g., from Row X).

After the result of the AND operation is initially stored in the sense amplifier 306, "Deactivate AND" in the pseudo code above indicates that the AND control signal goes low as shown at $t_{12}$ in FIG. 8, causing pass transistor 307-1 to stop conducting to isolate the sense amplifier 306 (and data line 305-1 (D)) from ground. If not previously done, Row Y can be closed (as shown at $t_{13}$ in FIG. 8) and the sense amplifier can be disabled (as shown at $t_{14}$ in FIG. 8 by the ACT positive control signal going low and the RnIF negative control signal goes high). With the data lines isolated, "Precharge" in the pseudo code above can cause a precharge of the data lines by an equilibrate operation, as described previously (e.g., commencing at $t_{14}$ shown in FIG. 8).

FIG. 8 shows, in the alternative, the behavior of voltage signals on the data lines (e.g., 305-1 (D) and 305-2 (D_) shown in FIG. 3A) coupled to the sense amplifier (e.g., 306 shown in FIG. 3A) and the behavior of voltage signals on nodes S1 and S1 of the secondary latch of the compute component (e.g., 331 shown in FIG. 3A) for an AND logical operation involving each of the possible combination of operands (e.g., Row X/Row Y data values 00, 10, 01, and 11).

Although the timing diagrams illustrated in FIG. 8 and the pseudo code described above indicate initiating the AND logical operation after starting to load the second operand (e.g., Row Y data value) into the sense amplifier, the circuit shown in FIG. 3A can be successfully operated by initiating the AND logical operation before starting to load the second operand (e.g., Row Y data value) into the sense amplifier.

Figure 9:
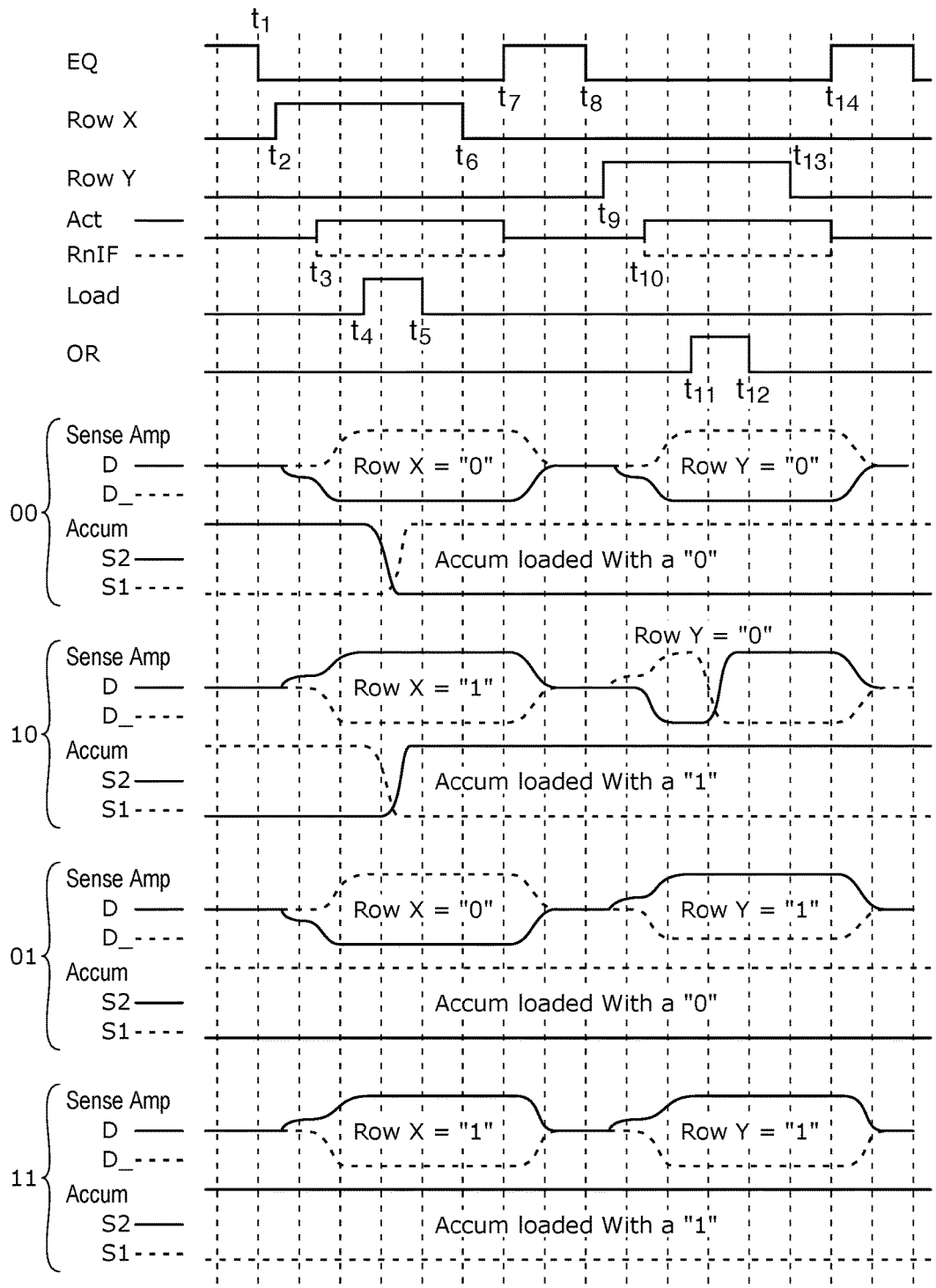
FIG. 9 illustrate a timing diagram associated with performing a number of logical operations using sensing circuitry in accordance with a number of embodiments of the present disclosure.

FIG. 9 illustrates a timing diagram associated with performing a number of logical operations using sensing circuitry in accordance with a number of embodiments of the present disclosure. FIG. 9 illustrates a timing diagram associated with initiating an OR logical operation after starting to load the second operand (e.g., Row Y data value) into the sense amplifier. FIG. 9 illustrates the sense amplifier and accumulator signals for various combinations of first and second operand data values. The particular timing diagram signals are discussed below with respect to the pseudo code associated with an AND logical operation of the circuit shown in FIG. 3A.

A subsequent operation phase can alternately be associated with performing the OR operation on the first data value (now stored in the sense amplifier 306 and the secondary latch of the compute component 331) and the second data value (stored in a memory cell 302-1 coupled to Row Y 304-Y). The operations to load the Row X data into the sense amplifier and accumulator that were previously described with respect to times $t_1$-$t_7$ shown in FIG. 8 are not repeated with respect to FIG. 9. Example pseudo code associated with "ORing" the data values can include:

---

Deactivate EQ
Open Row Y
Fire Sense Amps (after which Row Y data resides in the sense amps)
Close Row Y
   When Row Y is closed, the sense amplifier still contains the Row Y data value.
Activate OR
   This results in the sense amplifier being written to the value of the function (e.g., Row X OR Row Y), which may overwrite the data value from Row Y previously stored in the sense amplifier as follows:
   If the accumulator contains a "0" (i.e., a voltage corresponding to a "0" on node S2 and a voltage corresponding to a "1" on node S1), the sense amplifier data remains unchanged (Row Y data)
   If the accumulator contains a "1" (i.e., a voltage corresponding to a "1" on node S2 and a voltage corresponding to a "0" on node S1), the sense amplifier data is written to a "1"
   This operation leaves the data in the accumulator unchanged.
Deactivate OR
Precharge

---

The "Deactivate EQ" (shown at is in FIG. 9), "Open Row Y" (shown at $t_9$ in FIG. 9), "Fire Sense Amps" (shown at $t_{10}$ in FIG. 9), and "Close Row Y" (shown at $t_{13}$ in FIG. 9, and which may occur prior to initiating the particular logical function control signal), shown in the pseudo code above indicate the same functionality as previously described with respect to the AND operation pseudo code. Once the configuration of selected Row Y is appropriately configured (e.g., enabled if logical operation result is to be stored in memory cell corresponding to Row Y or closed to isolate memory cell if result if logical operation result is not to be stored in memory cell corresponding to Row Y), "Activate OR" in the pseudo code above indicates that the OR control signal goes high as shown at $t_{11}$ in FIG. 9, which causes pass transistor 307-2 to conduct. In this manner, activating the OR control signal causes the value of the function (e.g., Row X OR Row Y) to be written to the sense amp.

With the first data value (e.g., Row X) stored in the secondary latch of the compute component 331 and the second data value (e.g., Row Y) stored in the sense amplifier 306, if the dynamic latch of the accumulator contains a "0" (i.e., a voltage corresponding to a "0" on node S2 and a voltage corresponding to a "1" on node S1), then the result of the OR operation depends on the data value stored in the sense amplifier 306 (e.g., from Row Y). The result of the OR operation should be a "1" if the data value stored in the sense amplifier 306 (e.g., from Row Y) is a "1," but the result of the OR operation should be a "0" if the data value stored in the sense amplifier 306 (e.g., from Row Y) is also a "0." The sensing circuitry 350 is configured such that if the dynamic latch of the accumulator contains a "0," with the voltage corresponding to a "0" on node S2, transistor 309-2 is off and does not conduct (and pass transistor 307-1 is also off since the AND control signal is not asserted) so the sense amplifier 306 is not coupled to ground (either side), and the data value previously stored in the sense amplifier 306 remains unchanged (e.g., Row Y data value such that the OR operation result is a "1" if the Row Y data value is a "1" and the OR operation result is a "0" if the Row Y data value is a "0").

If the dynamic latch of the accumulator contains a "1" (i.e., a voltage corresponding to a "1" on node S2 and a voltage corresponding to a "0" on node S1), transistor 309-2 does conduct (as does pass transistor 307-2 since the OR control signal is asserted), and the sense amplifier 306 input coupled to data line 305-2 (D_) is coupled to ground since the voltage corresponding to a "1" on node S2 causes transistor 309-2 to conduct along with pass transistor 307-2 (which also conducts since the OR control signal is asserted). In this manner, a "1" is initially stored in the sense amplifier 306 as a result of the OR operation when the secondary latch of the accumulator contains a "1" regardless of the data value previously stored in the sense amp. This operation leaves the data in the accumulator unchanged. FIG. 9 shows, in the alternative, the behavior of voltage signals on the data lines (e.g., 305-1 (D) and 305-2 (D_) shown in FIG. 3A) coupled to the sense amplifier (e.g., 306 shown in FIG. 3A) and the behavior of voltage signals on nodes S1 and S2 of the secondary latch of the compute component 331 for an OR logical operation involving each of the possible combination of operands (e.g., Row X/Row Y data values 00, 10, 01, and 11).

After the result of the OR operation is initially stored in the sense amplifier 306, "Deactivate OR" in the pseudo code above indicates that the OR control signal goes low as shown at $t_{12}$ in FIG. 9, causing pass transistor 307-2 to stop conducting to isolate the sense amplifier 306 (and data line D 305-2) from ground. If not previously done, Row Y can be closed (as shown at $t_{13}$ in FIG. 9) and the sense amplifier can be disabled (as shown at $t_{14}$ in FIG. 9 by the ACT positive control signal going low and the RnIF negative control signal going high). With the data lines isolated, "Precharge" in the pseudo code above can cause a precharge of the data lines by an equilibrate operation, as described previously and shown at $t_{14}$ in FIG. 9.

The sensing circuitry 350 illustrated in FIG. 3A can provide additional logical operations flexibility as follows. By substituting operation of the ANDinv control signal for operation of the AND control signal, and/or substituting operation of the ORinv control signal for operation of the OR control signal in the AND and OR operations described above, the logical operations can be changed from {Row X AND Row Y} to {~Row X AND Row Y} (where "~Row X" indicates an opposite of the Row X data value, e.g., NOT Row X) and can be changed from {Row X OR Row Y} to {~Row X OR Row Y}. For example, during an AND operation involving the inverted data values, the ANDinv control signal can be asserted instead of the AND control signal, and during an OR operation involving the inverted data values, the ORinv control signal can be asserted instead of the OR control signal. Activating the ORinv control signal causes transistor 314-1 to conduct and activating the ANDinv control signal causes transistor 314-2 to conduct. In each case, asserting the appropriate inverted control signal can flip the sense amplifier and cause the result initially stored in the sense amplifier 306 to be that of the AND operation using inverted Row X and true Row Y data values or that of the OR operation using the inverted Row X and true Row Y data values. A true or compliment version of one data value can be used in the accumulator to perform the logical operation (e.g., AND, OR), for example, by loading a data value to be inverted first and a data value that is not to be inverted second.

In a similar approach to that described above with respect to inverting the data values for the AND and OR operations described above, the sensing circuitry shown in FIG. 3A can perform a NOT (e.g., invert) operation by putting the non-inverted data value into the dynamic latch of the accumulator and using that data to invert the data value in the sense amplifier 306. As previously mentioned, activating the ORinv control signal causes transistor 314-1 to conduct and activating the ANDinv control signal causes transistor 314-2 to conduct. The ORinv and/or ANDinv control signals are used in implementing the NOT function, as described further below:

---

Copy Row X into the Accumulator
  Deactivate EQ
  Open Row X
  Fire Sense Amps (after which Row X data resides in the sense amps)
  Activate LOAD (sense amplifier data (Row X) is transferred to nodes
    S1 and S2 of the Accumulator and resides there dynamically
  Deactivate LOAD
  Activate ANDinv and ORinv (which puts the compliment data value
    on the data lines)
    This results in the data value in the sense amplifier being inverted
      (e.g., the sense amplifier latch is flipped)
    This operation leaves the data in the accumulator unchanged
  Deactivate ANDinv and ORinv
  Close Row X
  Precharge

---

The "Deactivate EQ," "Open Row X," "Fire Sense Amps," "Activate LOAD," and "Deactivate LOAD" shown in the pseudo code above indicate the same functionality as the same operations in the pseudo code for the "Copy Row X into the Accumulator" initial operation phase described above prior to pseudo code for the AND operation and OR operation. However, rather than closing the Row X and Precharging after the Row X data is loaded into the sense amplifier 306 and copied into the dynamic latch, a compliment version of the data value in the dynamic latch of the accumulator can be placed on the data line and thus transferred to the sense amplifier 306 by enabling (e.g., causing transistor to conduct) and disabling the invert transistors (e.g., ANDinv and ORinv). This results in the sense amplifier 306 being flipped from the true data value that was previously stored in the sense amplifier to a compliment data value (e.g., inverted data value) stored in the sense amp. That is, a true or compliment version of the data value in the accumulator can be transferred to the sense amplifier by activating and deactivating ANDinv and ORinv. This operation leaves the data in the accumulator unchanged.

Because the sensing circuitry 350 shown in FIG. 3A initially stores the result of the AND, OR, and NOT logical operations in the sense amplifier 306 (e.g., on the sense amplifier nodes), these logical operation results can be communicated easily and quickly to any enabled row, any row activated after the logical operation is complete, and/or into the secondary latch of the compute component 331. The sense amplifier 306 and sequencing for the AND, OR, and/or NOT logical operations can also be interchanged by appropriate firing of the AND, OR, ANDinv, and/or ORinv control signals (and operation of corresponding transistors having a gate coupled to the particular control signal) before the sense amplifier 306 fires.

When performing logical operations in this manner, the sense amplifier 306 can be pre-seeded with a data value from the dynamic latch of the accumulator to reduce overall current utilized because the sense amps 306 are not at full rail voltages (e.g., supply voltage or ground/reference voltage) when accumulator function is copied to the sense amplifier 306. An operation sequence with a pre-seeded sense amplifier 306 either forces one of the data lines to the reference voltage (leaving the complementary data line at $V_{DD}/2$, or leaves the complementary data lines unchanged. The sense amplifier 306 pulls the respective data lines to full rails when the sense amplifier 306 fires. Using this sequence of operations will overwrite data in an enabled row.

A SHIFT operation can be accomplished by multiplexing ("muxing") two neighboring data line complementary pairs using a traditional DRAM isolation (ISO) scheme. According to embodiments of the present disclosure, the shift circuitry 323 can be used for shifting data values stored in memory cells coupled to a particular pair of complementary data lines to the sensing circuitry 350 (e.g., sense amplifier 306) corresponding to a different pair of complementary data lines (e.g., such as a sense amplifier 306 corresponding to a left or right adjacent pair of complementary data lines. As used herein, a sense amplifier 306 corresponds to the pair of complementary data lines to which the sense amplifier is coupled when isolation transistors 321-1 and 321-2 are conducting. The SHIFT operations (right or left) do not pre-copy the Row X data value into the accumulator. Operations to shift right Row X can be summarized as follows:

---

Deactivate Norm and Activate Shift
Deactivate EQ
Open Row X
Fire Sense Amps (after which shifted Row
  X data resides in the sense amps)
Activate Norm and Deactivate Shift
Close Row X
Precharge

---

In the pseudo code above, "Deactivate Norm and Activate Shift" indicates that a NORM control signal goes low causing isolation transistors 321-1 and 321-2 of the shift circuitry 323 to not conduct (e.g., isolate the sense amplifier from the corresponding pair of complementary data lines). The SHIFT control signal goes high causing isolation transistors 321-3 and 321-4 to conduct, thereby coupling the sense amplifier 306 to the left adjacent pair of complementary data lines (e.g., on the memory array side of non-conducting isolation transistors 321-1 and 321-2 for the left adjacent pair of complementary data lines).

After the shift circuitry 323 is configured, the "Deactivate EQ," "Open Row X," and "Fire Sense Amps" shown in the pseudo code above indicate the same functionality as the same operations in the pseudo code for the "Copy Row X into the Accumulator" initial operation phase described above prior to pseudo code for the AND operation and OR operation. After these operations, the Row X data value for the memory cell coupled to the left adjacent pair of complementary data lines is shifted right and stored in the sense amplifier 306.

In the pseudo code above, "Activate Norm and Deactivate Shift" indicates that a NORM control signal goes high causing isolation transistors 321-1 and 321-2 of the shift circuitry 323 to conduct (e.g., coupling the sense amplifier to the corresponding pair of complementary data lines), and the SHIFT control signal goes low causing isolation transistors 321-3 and 321-4 to not conduct and isolating the sense amplifier 306 from the left adjacent pair of complementary data lines (e.g., on the memory array side of non-conducting isolation transistors 321-1 and 321-2 for the left adjacent pair of complementary data lines). Since Row X is still active, the Row X data value that has been shifted right is transferred to Row X of the corresponding pair of complementary data lines through isolation transistors 321-1 and 321-2.

After the Row X data values are shifted right to the corresponding pair of complementary data lines, the selected row (e.g., ROW X) is disabled as indicated by "Close Row X" in the pseudo code above, which can be accomplished by the access transistor turning off to decouple the selected cell from the corresponding data line. Once the selected row is closed and the memory cell is isolated from the data lines, the data lines can be precharged as indicated by the "Precharge" in the pseudo code above. A precharge of the data lines can be accomplished by an equilibrate operation, as described above.

Operations to shift left Row X can be summarized as follows:

---
Activate Norm and Deactivate Shift
Deactivate EQ
Open Row X
Fire Sense Amps (after which Row X data resides in the sense amps)
Deactivate Norm and Activate Shift
  Sense amplifier data (shifted left Row X) is transferred to Row X
Close Row X
Precharge

---

In the pseudo code above, "Activate Norm and Deactivate Shift" indicates that a NORM control signal goes high causing isolation transistors 321-1 and 321-2 of the shift circuitry 323 to conduct, and the SHIFT control signal goes low causing isolation transistors 321-3 and 321-4 to not conduct. This configuration couples the sense amplifier 306 to a corresponding pair of complementary data lines and isolates the sense amplifier from the right adjacent pair of complementary data lines.

After the shift circuitry is configured, the "Deactivate EQ," "Open Row X," and "Fire Sense Amps" shown in the pseudo code above indicate the same functionality as the same operations in the pseudo code for the "Copy Row X into the Accumulator" initial operation phase described above prior to pseudo code for the AND operation and OR operation. After these operations, the Row X data value for the memory cell coupled to the pair of complementary data lines corresponding to the sense circuitry 350 is stored in the sense amplifier 306.

In the pseudo code above, "Deactivate Norm and Activate Shift" indicates that a NORM control signal goes low causing isolation transistors 321-1 and 321-2 of the shift circuitry 323 to not conduct (e.g., isolate the sense amplifier from the corresponding pair of complementary data lines), and the SHIFT control signal goes high causing isolation transistors 321-3 and 321-4 to conduct coupling the sense amplifier to the left adjacent pair of complementary data lines (e.g., on the memory array side of non-conducting isolation transistors 321-1 and 321-2 for the left adjacent pair of complementary data lines. Since Row X is still active, the Row X data value that has been shifted left is transferred to Row X of the left adjacent pair of complementary data lines.

After the Row X data values are shifted left to the left adjacent pair of complementary data lines, the selected row (e.g., ROW X) is disabled as indicated by "Close Row X," which can be accomplished by the access transistor turning off to decouple the selected cell from the corresponding data line. Once the selected row is closed and the memory cell is isolated from the data lines, the data lines can be precharged as indicated by the "Precharge" in the pseudo code above. A precharge of the data lines can be accomplished by an equilibrate operation, as described above.

According to various embodiments, general computing can be enabled in a memory array core of a processor-in-memory (PIM) device such as a DRAM one transistor per memory cell (e.g., 1T1C) configuration at 6F^2 or 4F^2 memory cell sizes, for example. The advantage of the apparatuses and methods described herein is not realized in terms of single instruction speed, but rather the cumulative speed that can be achieved by an entire bank of data being computed in parallel without ever transferring data out of the memory array (e.g., DRAM) or firing a column decode. In other words, data transfer time can be eliminated. For example, apparatus of the present disclosure can perform ANDs or ORs simultaneously using data values in memory cells coupled to a data line (e.g., a column of 16K memory cells).

In previous approach sensing circuits where data is moved out for logical operation processing (e.g., using 32 or 64 bit registers), fewer operations can be performed in parallel compared to the apparatus of the present disclosure. In this manner, significantly higher throughput is effectively provided in contrast to conventional configurations involving a central processing unit (CPU) discrete from the memory such that data must be transferred therebetween. An apparatus and/or methods according to the present disclosure can also use less energy/area than configurations where the CPU is discrete from the memory. Furthermore, an apparatus and/or methods of the present disclosure can improve upon the smaller energy/area advantages since the in-memory-array logical operations save energy by eliminating certain data value transfers.

Figure 10:
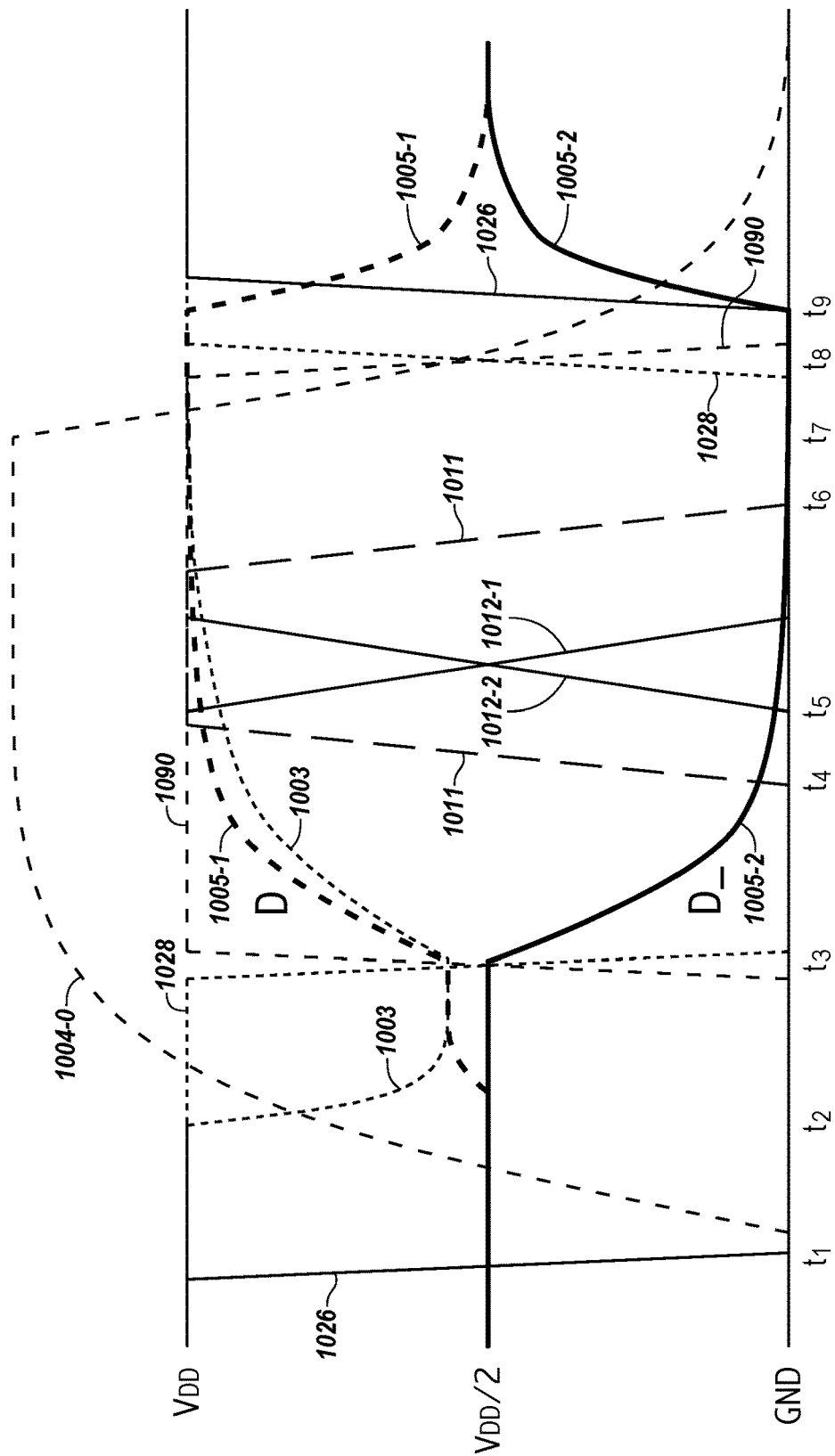
FIG. 10 illustrate a timing diagram associated with performing a number of logical operations using sensing circuitry in accordance with a number of embodiments of the present disclosure.

FIG. 10 illustrates a timing diagram associated with performing a number of logical operations using sensing circuitry in accordance with a number of embodiments of the present disclosure. The functionality of the sensing circuitry 350 of FIG. 3A is described below with respect to performing logical operations and initially storing a result in the compute component 331 (e.g., secondary latch of the accumulator). The timing diagram shown in FIG. 10 illustrates signals (e.g., voltage signals) associated with performing a first operation phase of a logical operation (e.g., an R-input logical operation) using the sensing circuitry illustrated in FIG. 3A. The first operation phase described with respect to FIG. 10 can be a first operation phase of an AND, NAND, OR, or NOR operation, for instance. Performing the operation phase illustrated in FIG. 10 can involve consuming significantly less energy (e.g., about half) than previous processing approaches that may involve providing a full swing between voltage rails (e.g., between a supply and ground).

In the example illustrated in FIG. 10, the voltage rails corresponding to complementary logic values (e.g., "1" and "0") are a supply voltage ($V_{DD}$) and a reference voltage (e.g., ground (Gnd)). Prior to performing a logical operation, an equilibration can occur such that the complementary data lines D and D_ are shorted together at an equilibration voltage ($V_{DD}/2$), as previously described.

The first operation phase of a logical operation described below involves loading a first operand of the logical operation into the accumulator. The time references (e.g., $t_1$, etc.) shown in FIG. 10 do not necessarily represent a same absolute or relative time as similar time references in other timing diagrams.

At time $t_1$, the equilibration signal 1026 is deactivated, and then a selected row is enabled (e.g., the row corresponding to a memory cell whose data value is to be sensed and used as a first input). Signal 1004-0 represents the voltage signal applied to the selected row (e.g., Row Y 304-Y shown in FIG. 3A). When row signal 1004-0 reaches the threshold voltage (Vt) of the access transistor (e.g., 302-1 shown in FIG. 3A) corresponding to the selected cell, the access transistor turns on and couples the data line D to the selected memory cell (e.g., to the capacitor 303-1 shown in FIG. 3A if the cell is a 1T1C DRAM cell), which creates a differential voltage signal between the data lines D and D_ (e.g., as indicated by signals 1005-1 and 1005-2 on the data lines, respectively) between times $t_2$ and $t_3$. The voltage of the selected cell is represented by signal 1003. Due to conservation of energy, creating the differential signal between data lines D and D_ (e.g., by coupling the cell to data line D) does not consume energy, since the energy associated with enabling/disabling the row signal 1004-0 can be amortized over the plurality of memory cells coupled to the row.

At time $t_3$, the sense amplifier (e.g., 306 shown in FIG. 3A) is activated (e.g., a positive control signal 1090 (e.g., corresponding to ACT 390 shown in FIG. 3B) goes high and the negative control signal 1028 (e.g., corresponding to RnIF 328 shown in FIG. 3B) goes low), which amplifies the differential signal between data lines D and D_, resulting in a voltage (e.g., $V_{DD}$) corresponding to a logic "1" or a voltage (e.g., ground) corresponding to a logic "0" being on data line D (and the other voltage being on complementary data line D_), such that the sensed data value is stored in the primary latch of sense amplifier 306. The primary energy consumption occurs in charging the data line D (305-1) from the equilibration voltage $V_{DD}/2$ to the rail voltage $V_{DD}$. FIG. 10 shows, in example, the data line voltages 1005-1 and 1005-2 that correspond to a logic "1" being on data line D.

According to some embodiments, the primary latch of sense amplifier 306 can be coupled to the complementary data lines D and D_ through respective pass transistors (not shown in FIG. 3B but in a similar configuration as the manner in which latch 364 is coupled to the data lines D and D_ through load/pass transistors 318-1 and 318-2 shown in FIG. 3A). The Passd control signal 1011 controls one pass transistor. The Passdb control signal controls the other pass transistor, and here the Passdb control signal can behave here the same as the Passd control signal.

At time $t_4$, the pass transistors (if present) can be enabled (e.g., via respective Passd and Passdb control signals 1011 applied to control lines coupled to the respective gates of the pass transistors going high). At time $t_5$, the accumulator positive control signal 1012-1 (e.g., Accumb) and the accumulator positive control signal 1012-2 (e.g., Accum) are activated via respective control lines 312-1 and 312-2 shown in FIG. 3A. As described below, the accumulator control signals ACCUMB 1012-1 and ACCUM 1012-2 may remain activated for subsequent operation phases. As such, in this example, activating the control signals ACCUMB 1012-1 and ACCUM 1012-2 enables the secondary latch (e.g., accumulator) of compute component 331-6 shown in FIG. 3A. The sensed data value stored in sense amplifier 306 is transferred (e.g., copied) to the secondary latch, including the dynamic latch and latch 364.

At time $t_6$, the Passd control signal 1011 (and the Passdb control signal) goes low thereby turning off the pass transistors (if present). However, since the accumulator control signals ACCUMB 1012-1 and ACCUM 1012-2 remain activated, an accumulated result is stored (e.g., latched) in the secondary latches (e.g., accumulator). At time $t_7$, the row signal 1004-0 is deactivated, and the array sense amps are disabled at time $t_8$ (e.g., sense amplifier control signals 1028 and 1090 are deactivated).

At time $t_9$, the data lines D and D_ are equilibrated (e.g., equilibration signal 1026 is activated), as illustrated by data line voltage signals 1005-1 and 1005-2 moving from their respective rail values to the equilibration voltage ($V_{DD}/2$). The equilibration consumes little energy due to the law of conservation of energy. As described below in association with FIG. 3B, equilibration can involve shorting the complementary data lines D and D_ together at an equilibration voltage, which is $V_{DD}/2$, in this example. Equilibration can occur, for instance, prior to a memory cell sensing operation.

Figure 11:
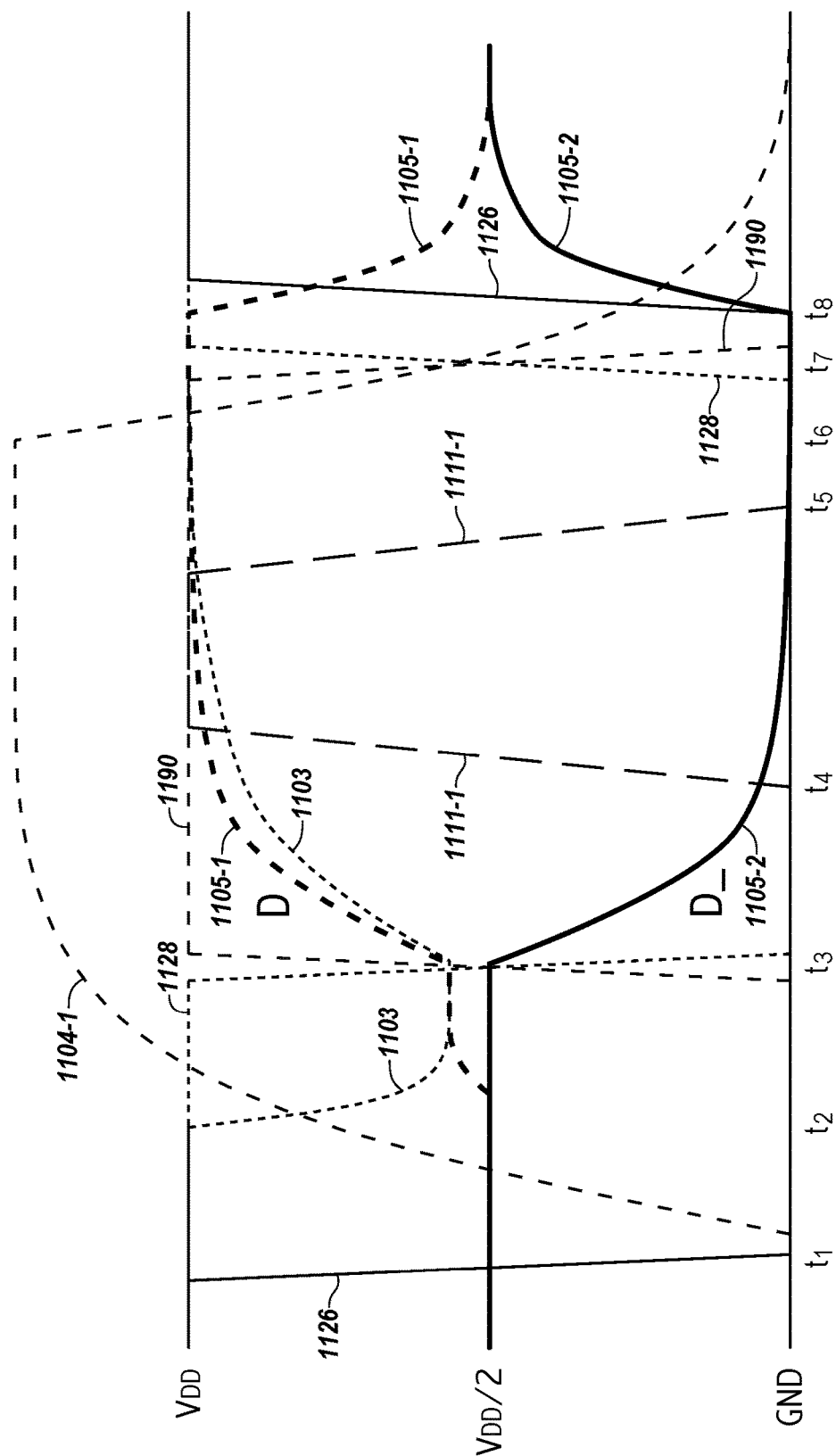
FIG. 11 illustrate a timing diagram associated with performing a number of logical operations using sensing circuitry in accordance with a number of embodiments of the present disclosure.
Figure 12:
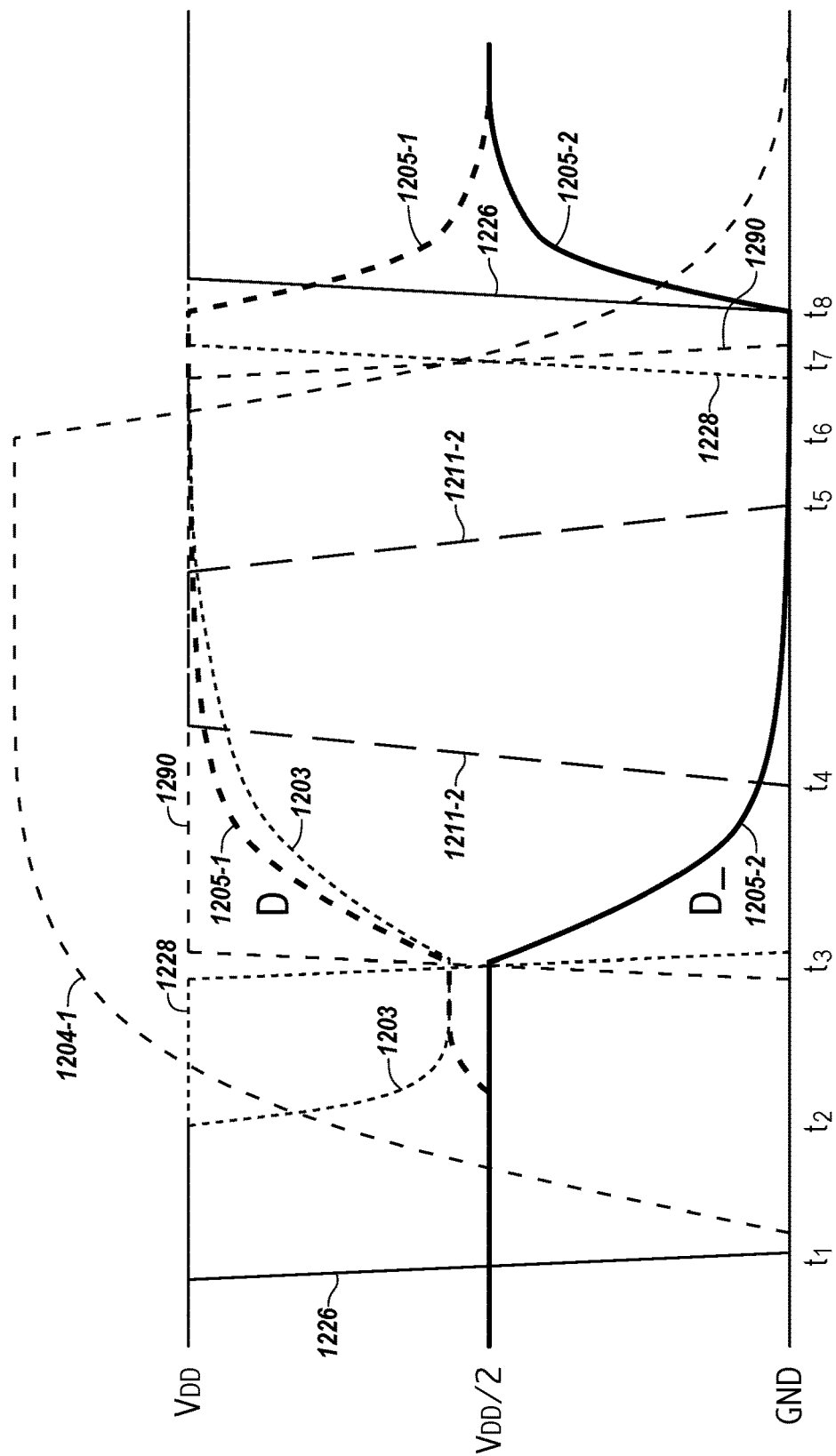
FIG. 12 illustrate a timing diagram associated with performing a number of logical operations using sensing circuitry in accordance with a number of embodiments of the present disclosure.

FIGS. 11 and 12 respectively illustrate timing diagrams associated with performing a number of logical operations using sensing circuitry in accordance with a number of embodiments of the present disclosure. Timing diagrams shown in FIGS. 11 and 12 illustrate signals (e.g., voltage signals) associated with performing a number of intermediate operation phases of a logical operation (e.g., an R-input logical operation). For instance, timing diagram shown in FIG. 11 corresponds to a number of intermediate operation phases of an R-input NAND operation or an R-input AND operation, and timing diagram shown in FIG. 12 corresponds to a number of intermediate operation phases of an R-input NOR operation or an R-input OR operation. For example, performing an AND or NAND operation can include performing the operation phase shown in FIG. 11 one or more times subsequent to an initial operation phase such as that described with respect to FIG. 10. Similarly, performing an OR or NOR operation can include performing the operation phase shown and described with respect to FIG. 12 one or more times subsequent to an initial operation phase such as that described with respect to FIG. 10.

As shown in the timing diagrams illustrated in FIGS. 11 and 12, at time $t_1$, equilibration is disabled (e.g., the equilibration signal 1126/1226 is deactivated), and then a selected row is enabled (e.g., the row corresponding to a memory cell whose data value is to be sensed and used as an input such as a second input, third input, etc.). Signal 1104-1/1204-1 represents the voltage signal applied to the selected row (e.g., Row Y 304-Y shown in FIG. 3A). When row signal 1104-1 reaches the threshold voltage (Vt) of the access transistor (e.g., 302-1 shown in FIG. 3A) corresponding to the selected cell, the access transistor turns on and couples the data line D to the selected memory cell (e.g., to the capacitor 303-1 if the cell is a 1T1C DRAM cell), which creates a differential voltage signal between the data lines D and D_ (e.g., as indicated by signals 1105-1/1305-1 and 1105-2/1305-2, respectively) between times $t_2$ and $t_3$. The voltage of the selected cell is represented by signal 1103/1203. Due to conservation of energy, creating the differential signal between D and D_ (e.g., by coupling the cell to data line D) does not consume energy, since the energy associated with activating/deactivating the row signal 1104-1/1204-1 can be amortized over the plurality of memory cells coupled to the row.

At time $t_3$, the sense amplifier (e.g., 306 shown in FIG. 3A) is enabled (e.g., a positive control signal 1190/1290 (e.g., corresponding to ACT 333 shown in FIG. 3B) goes high, and the negative control signal 1128/1228 (e.g., RnIF 328 shown in FIG. 3B) goes low), which amplifies the differential signal between D and D_, resulting in a voltage (e.g., $V_{DD}$) corresponding to a logic 1 or a voltage (e.g., ground) corresponding to a logic 0 being on data line D (and the other voltage being on complementary data line D_), such that the sensed data value is stored in the primary latch of sense amplifier 306. The primary energy consumption occurs in charging the data line D (305-1) from the equilibration voltage $V_{DD}/2$ to the rail voltage $V_{DD}$.

As shown in timing diagrams illustrated in FIGS. 11 and 12, at time $t_4$ (e.g., after the selected cell is sensed), only one of control signals 1111-1 (Passd) shown in FIGS. 11 and 1211-2 (Passdb) shown in FIG. 12 is activated (e.g., only one of pass transistors (if present) is enabled), depending on the particular logic operation. For example, since the timing diagram illustrated in FIG. 11 corresponds to an intermediate phase of a NAND or AND operation, control signal 1111-1 (Passd) is activated at time $t_4$ to turn on the pass transistor coupling the primary latch to data line D and the Passdb control signal remains deactivated leaving the pass transistor coupling the primary latch to data line D_ turned off. Conversely, since the timing diagram illustrated in FIG. 12 corresponds to an intermediate phase of a NOR or OR operation, control signal 1211-2 (Passdb) is activated at time $t_4$ to turn on the pass transistor coupling the primary latch to data line D_ and control signal Passd remains deactivated leaving the pass transistor coupling the primary latch to data line D turned off. Recall from above that the accumulator control signals 1012-1 (Accumb) and 1012-2 (Accum) were activated during the initial operation phase described with respect to FIG. 10, and they remain activated during the intermediate operation phase(s).

Since the accumulator was previously enabled, activating only Passd (1111-1 as shown in FIG. 11) results in accumulating the data value corresponding to the voltage signal 1105-1 shown in FIG. 11 corresponding to data line D. Similarly, activating only Passdb (1211-2 as shown in FIG. 12) results in accumulating the data value corresponding to the voltage signal 1205-2 corresponding to data line D_. For instance, in an example AND/NAND operation shown in the timing diagram illustrated in FIG. 11 in which only Passd (1111-1) is activated, if the data value stored in the second selected memory cell is a logic "0," then the accumulated value associated with the secondary latch is asserted low such that the secondary latch stores logic "0." If the data value stored in the second selected memory cell is not a logic "0," then the secondary latch retains its stored first selected memory cell data value (e.g., a logic "1" or a logic "0"). As such, in this AND/NAND operation example, the secondary latch is serving as a zeroes (0s) accumulator.

Similarly, in an example OR/NOR operation shown in the timing diagram illustrated in FIG. 12 in which only Passdb 1211-2 is activated, if the data value stored in the second selected memory cell is a logic "1," then the accumulated value associated with the secondary latch is asserted high such that the secondary latch stores logic "1." If the data value stored in the second selected memory cell is not a logic "1," then the secondary latch retains its stored first selected memory cell data value (e.g., a logic "1" or a logic "0"). As such, in this OR/NOR operation example, the secondary latch is effectively serving as a ones (1s) accumulator since voltage signal 1205-2 on D_ is setting the true data value of the accumulator.

At the conclusion of an intermediate operation phase such as that shown in FIG. 11 or 12, the Passd signal 1111-1 (e.g., for AND/NAND) or the Passdb signal 1211-2 (e.g., for OR/NOR) is deactivated (e.g., at time t5), the selected row is disabled (e.g., at time t6), the sense amplifier is disabled (e.g., at time t7), and equilibration occurs (e.g., at time t8). An intermediate operation phase such as that illustrated in FIG. 11 or 12 can be repeated in order to accumulate results from a number of additional rows. As an example, the sequence of timing diagram illustrated in FIGS. 11 and/or 12 can be performed a subsequent (e.g., second) time for a third memory cell, a subsequent (e.g., third) time for a fourth memory cell, etc. For instance, for a 10-input NOR operation, the intermediate phase shown in FIG. 12 can occur 9 times to provide 9 inputs of the 10-input logical operation, with the tenth input being determined during the initial operation phase (e.g., as described with respect to FIG. 10).

Figure 13:
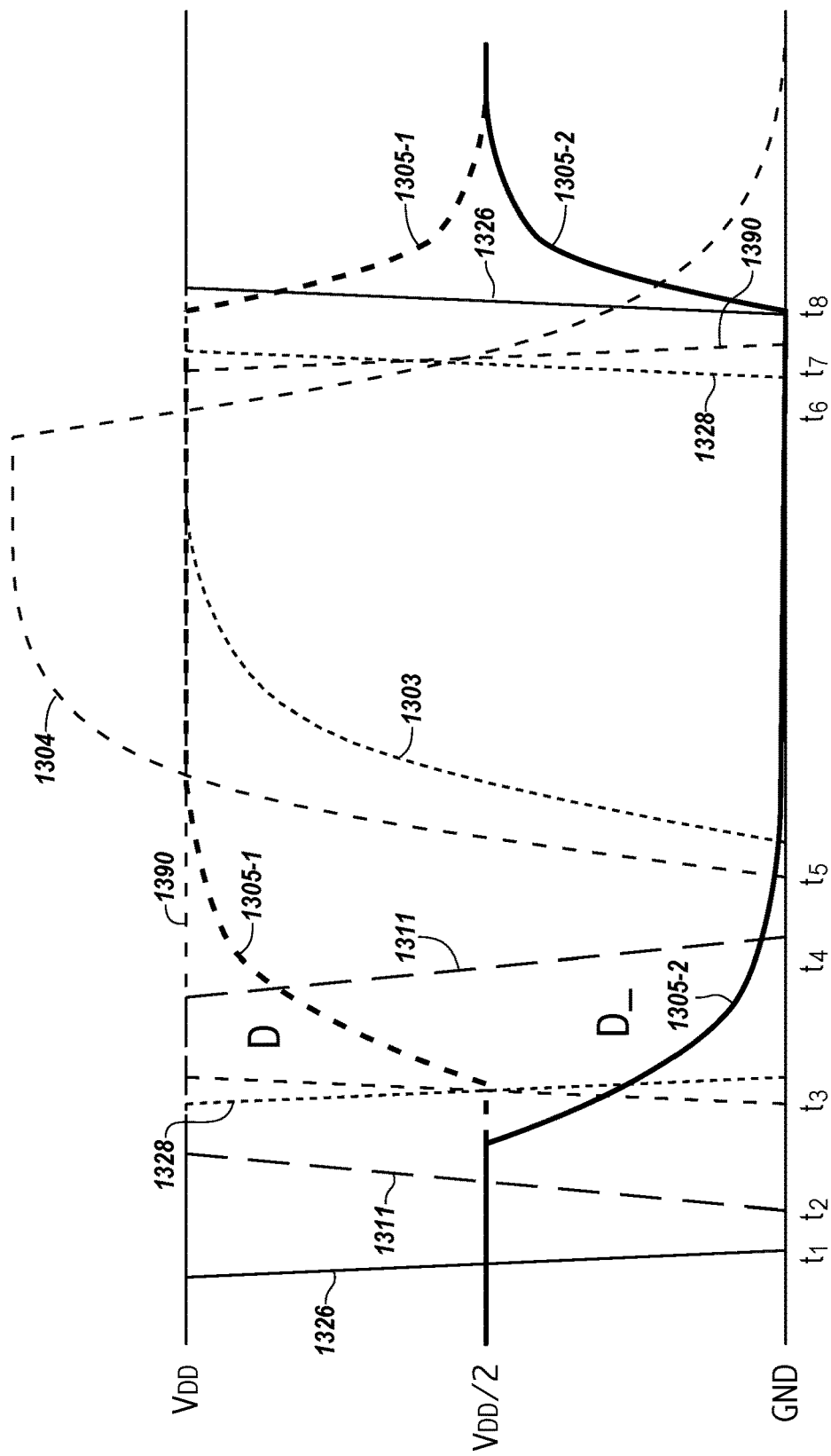
FIG. 13 illustrate a timing diagram associated with performing a number of logical operations using sensing circuitry in accordance with a number of embodiments of the present disclosure.

FIG. 13 illustrates a timing diagram associated with performing a number of logical operations using sensing circuitry in accordance with a number of embodiments of the present disclosure. The timing diagram illustrated in FIG. 13 shows signals (e.g., voltage signals) associated with performing a last operation phase of a logical operation (e.g., an R-input logical operation). For instance, the timing diagram illustrated in FIG. 13 corresponds to a last operation phase of an R-input AND operation or an R-input OR operation.

For example, performing a last operation phase of an R-input can include performing the operation phase shown in FIG. 13 subsequent to a number of iterations of the intermediate operation phase(s) described in association with FIGS. 11 and/or 12. Table 2 shown below indicates the Figures corresponding to the sequence of operation phases associated with performing a number of R-input logical operations in accordance with a number of embodiments described herein.

TABLE 2

| Operation | FIG. 10 | FIG. 11 | FIG. 12 | FIG. 13 |
|---|---|---|---|---|
| AND | First phase | R-1 iterations | | Last phase |
| NAND | First phase | R-1 iterations | | |
| OR | First phase | | R-1 iterations | Last phase |
| NOR | First phase | | R-1 iterations | |

A NAND operation can be implemented, for example, by storing the result of the R-1 iterations for an AND operation in the sense amplifier, then inverting the sense amplifier before conducting the last operation phase to store the result (described below). A NOR operation can be implemented, for example, by storing the result of the R-1 iterations for an OR operation in the sense amplifier, then inverting the sense amplifier before conducting the last operation phase to store the result (described below).

The last operation phase illustrated in the timing diagram of FIG. 13 is described in association with storing a result of an R-input logical operation to a row of the array (e.g., array 330 shown in FIG. 3A). However, as described above, in a number of embodiments, the result can be stored to a suitable location other than back to the array (e.g., to an external register associated with a controller and/or host processor, to a memory array of a different memory device, etc., via I/O lines).

As shown in timing diagram illustrated in FIG. 13, at time $t_1$, equilibration is disabled (e.g., the equilibration signal 1326 is deactivated) such that data lines D and D_ are floating. At time t2, the Passd control signal 1311 (and Passdb signal) is activated for an AND or OR operation.

Activating the Passd control signal 1311 (and Passdb signal) (e.g., in association with an AND or OR operation) transfers the accumulated output stored in the secondary latch of compute component 331-6 shown in FIG. 3A to the primary latch of sense amplifier 306. For instance, for an AND operation, if any of the memory cells sensed in the prior operation phases (e.g., the first operation phase illustrated in FIG. 10 and one or more iterations of the intermediate operation phase illustrated in FIG. 11) stored a logic "0" (e.g., if any of the R-inputs of the AND operation were a logic "0"), then the data line D_ will carry a voltage corresponding to logic "1" (e.g., $V_{DD}$) and data line D will carry a voltage corresponding to logic "0" (e.g., ground). For this AND operation example, if all of the memory cells sensed in the prior operation phases stored a logic "1" (e.g., all of the R-inputs of the AND operation were logic "1"), then the data line D_ will carry a voltage corresponding to logic "0" and data line D will carry a voltage corresponding to logic "1". At time t3, the primary latch of sense amplifier 306 is then enabled (e.g., a positive control signal 1390 (e.g., corresponding to ACT 390 shown in FIG. 3B) goes high and the negative control signal 1328 (e.g., corresponding to RnIF 328 shown in FIG. 3B) goes low), which amplifies the differential signal between data lines D and D_such that the data line D now carries the ANDed result of the respective input data values as determined from the memory cells sensed during the prior operation phases. As such, data line D will be at ground if any of the input data values are a logic "0" and data line D will be at $V_{DD}$ if all of the input data values are a logic "1."

For an OR operation, if any of the memory cells sensed in the prior operation phases (e.g., the first operation phase of FIG. 10 and one or more iterations of the intermediate operation phase shown in FIG. 12) stored a logic "1" (e.g., if any of the R-inputs of the OR operation were a logic "1"), then the data line D_ will carry a voltage corresponding to logic "0" (e.g., ground) and data line D will carry a voltage corresponding to logic "1" (e.g., $V_{DD}$). For this OR example, if all of the memory cells sensed in the prior operation phases stored a logic "0" (e.g., all of the R-inputs of the OR operation were logic "0"), then the data line D will carry a voltage corresponding to logic "0" and data line D_ will carry a voltage corresponding to logic "1." At time t3, the primary latch of sense amplifier 306 is then enabled and the data line D now carries the ORed result of the respective input data values as determined from the memory cells sensed during the prior operation phases. As such, data line D will be at $V_{DD}$ if any of the input data values are a logic "1" and data line D will be at ground if all of the input data values are a logic "0."

The result of the R-input AND or OR logical operations can then be stored back to a memory cell of array 330 shown in FIG. 3A. In the examples shown in FIG. 13, the result of the R-input logical operation is stored to a memory cell coupled to the last row enabled (e.g., row of the last logical operation operand). Storing the result of the logical operation to a memory cell simply involves enabling the associated row access transistor by enabling the particular row. The capacitor of the memory cell will be driven to a voltage corresponding to the data value on the data line D (e.g., logic "1" or logic "0"), which essentially overwrites whatever data value was previously stored in the selected memory cell. It is noted that the selected memory cell can be a same memory cell that stored a data value used as an input for the logical operation. For instance, the result of the logical operation can be stored back to a memory cell that stored an operand of the logical operation.

The timing diagram illustrated in FIG. 13 show, at time t3, the positive control signal 1390 and the negative control signal 1328 being deactivated (e.g., signal 1390 goes high and signal 1328 goes low) to disable the sense amplifier 306 shown in FIG. 3A. At time t4 the Passd control signal 1311 (and Passdb signal) that was activated at time t2 is deactivated. Embodiments are not limited to this example. For instance, in a number of embodiments, the sense amplifier 306 shown in FIG. 3A may be enabled subsequent to time t4 (e.g., after the Passd control signal 1311 (and Passdb signal) are deactivated).

As shown in FIG. 13, at time t5, a selected row is enabled (e.g., by row activation signal 1304 going high, which drives the capacitor of the selected cell to the voltage corresponding to the logic value stored in the accumulator. At time t6 the selected row is disabled. At time t7 the sense amplifier 306 shown in FIG. 3A is disabled (e.g., positive control signal 1328 and negative control signal 1390 are deactivated), and at time t8 equilibration occurs (e.g., signal 1326 is activated and the voltages on the complementary data lines 1305-1 (D) and 1305-2 (D_) are brought to the equilibration voltage).

Although the example of performing a last operation phase of an R-input was discussed above with respect to FIG. 13 for performing AND and OR logical operations, embodiments are not limited to these logical operations. For example, the NAND and NOR operations can also involve a last operation phase of an R-input that is stored back to a memory cell of array 330 using control signals to operate the sensing circuitry illustrated in FIG. 3A.

Figure 14:
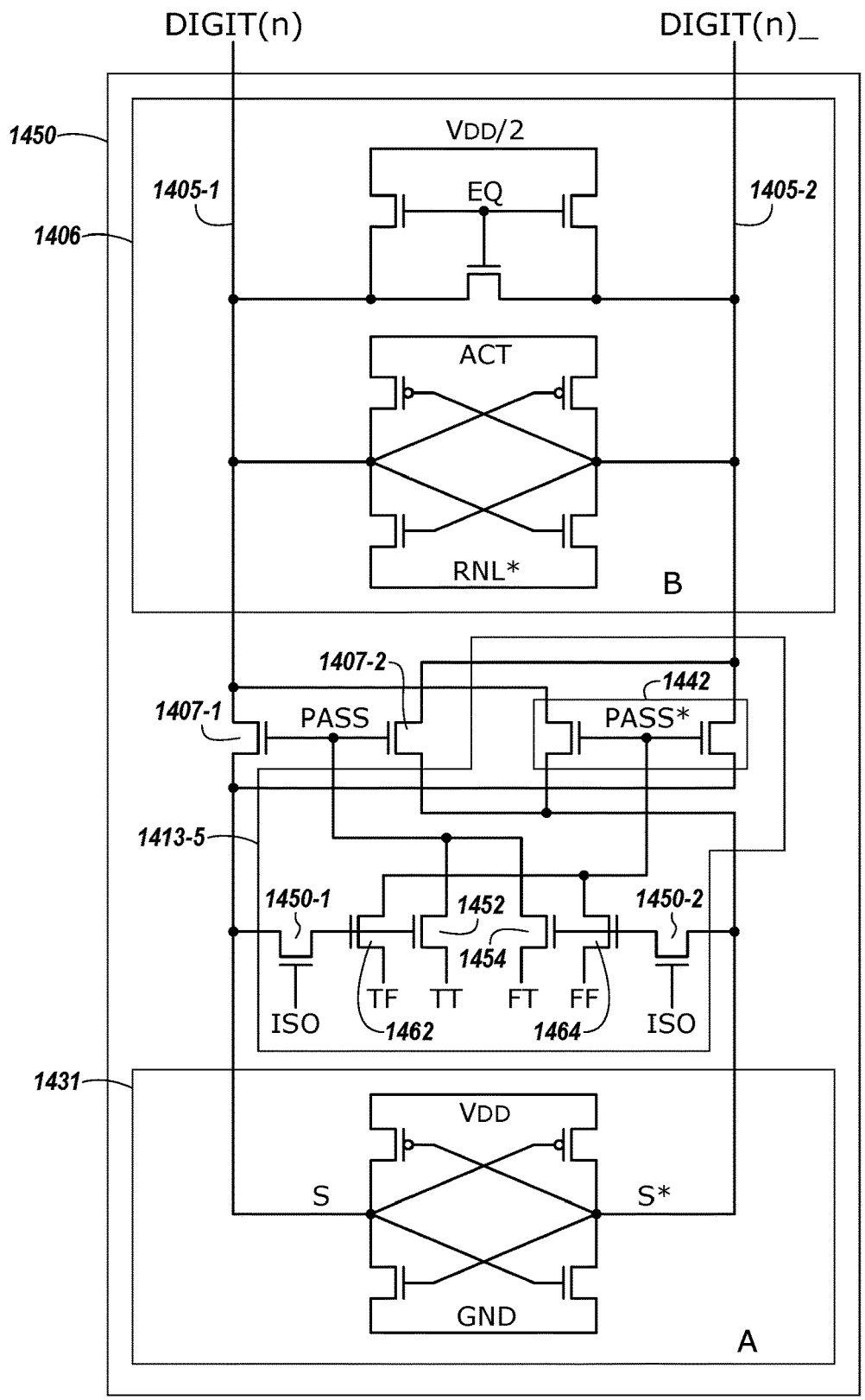
FIG. 14 is a schematic diagram illustrating sensing circuitry having selectable logical operation selection logic in accordance with a number of embodiments of the present disclosure.

FIG. 14 is a schematic diagram illustrating sensing circuitry having selectable logical operation selection logic in accordance with a number of embodiments of the present disclosure. FIG. 14 shows a sense amplifier 1406 coupled to a pair of complementary sense lines 1405-1 and 1405-2, and a compute component 1431 coupled to the sense amplifier 1406 via pass gates 1407-1 and 1407-2. The gates of the pass gates 1407-1 and 1407-2 can be controlled by a logical operation selection logic signal, PASS, which can be output from logical operation selection logic 1413-5. FIG. 14 shows the compute component 1431 labeled "A" and the sense amplifier 1406 labeled "B" to indicate that the data value stored in the compute component 1431 is the "A" data value and the data value stored in the sense amplifier 1406 is the "B" data value shown in the logic tables illustrated with respect to FIG. 15.

The sensing circuitry 1450 illustrated in FIG. 14 includes logical operation selection logic 1413-5. In this example, the logic 1413-5 comprises swap gates 1442 controlled by a logical operation selection logic signal PASS*. The logical operation selection logic 1413-5 also comprises four logic selection transistors: logic selection transistor 1462 coupled between the gates of the swap transistors 1442 and a TF signal control line, logic selection transistor 1452 coupled between the gates of the pass gates 1407-1 and 1407-2 and a TT signal control line, logic selection transistor 1454 coupled between the gates of the pass gates 1407-1 and 1407-2 and a FT signal control line, and logic selection transistor 1464 coupled between the gates of the swap transistors 1442 and a FF signal control line. Gates of logic selection transistors 1462 and 1452 are coupled to the true sense line (e.g., 1405-1) through isolation transistor 1481-1 (having a gate coupled to an ISO signal control line), and gates of logic selection transistors 1464 and 1454 are coupled to the complementary sense line (e.g., 1405-2) through isolation transistor 1481-2 (also having a gate coupled to an ISO signal control line).

Logic selection transistors 1452 and 1454 are arranged similarly to transistor 307-1 (coupled to an AND signal control line) and transistor 307-2 (coupled to an OR signal control line) respectively, as shown in FIG. 3A. Operation of logic selection transistors 1452 and 1454 are similar based on the state of the TT and FT selection signals and the data values on the respective complementary sense lines at the time the ISO signal is asserted. Logic selection transistors 1462 and 1464 also operate in a similar manner to control continuity of the swap transistors 1442. That is, to OPEN (e.g., turn on) the swap transistors 1442, either the TF control signal is activated (e.g., high) with data value on the true sense line being "1," or the FF control signal is activated (e.g., high) with the data value on the complement sense line being "1." If either the respective control signal or the data value on the corresponding sense line (e.g., sense line to which the gate of the particular logic selection transistor is coupled) is not high, then the swap transistors 1442 will not be OPENed by a particular logic selection transistor.

The PASS* control signal is not necessarily complementary to the PASS control signal. For instance, it is possible for the PASS and PASS* control signals to both be activated or both be deactivated at the same time. However, activation of both the PASS and PASS* control signals at the same time shorts the pair of complementary sense lines together, which may be a disruptive configuration to be avoided. Logical operations results for the sensing circuitry illustrated in FIG. 14 are summarized in the logic table illustrated in FIG. 15.

FIG. 15 is a logic table illustrating selectable logic operation results implementable by the sensing circuitry shown in FIG. 14 in accordance with a number of embodiments of the present disclosure. The four logic selection control signals (e.g., TF, TT, FT, and FF), in conjunction with a particular data value present on the complementary sense lines, can be used to select one of plural logical operations to implement involving the starting data values stored in the sense amplifier 1406 and compute component 1431. The four control signals, in conjunction with a particular data value present on the complementary sense lines, controls the continuity of the pass gates 1407-1 and 1407-2 and swap transistors 1442, which in turn affects the data value in the compute component 1431 and/or sense amplifier 1406 before/after firing. The capability to selectably control continuity of the swap transistors 1442 facilitates implementing logical operations involving inverse data values (e.g., inverse operands and/or inverse result), among others.

The logic table illustrated in FIG. 15 shows the starting data value stored in the compute component 1431 shown in column A at 1544, and the starting data value stored in the sense amplifier 1406 shown in column B at 1545. The other 3 top column headings (NOT OPEN, OPEN TRUE, and OPEN INVERT) in the logic table of FIG. 15 refer to the continuity of the pass gates 1407-1 and 1407-2, and the swap transistors 1442, which can respectively be controlled to be OPEN or CLOSED depending on the state of the four logic selection control signals (e.g., TF, TT, FT, and FF), in conjunction with a particular data value present on the pair of complementary sense lines 1405-1 and 1405-2 when the ISO control signal is asserted. The "Not Open" column corresponds to the pass gates 1407-1 and 1407-2 and the swap transistors 1442 both being in a non-conducting condition, the "Open True" corresponds to the pass gates 1407-1 and 1407-2 being in a conducting condition, and the "Open Invert" corresponds to the swap transistors 1442 being in a conducting condition. The configuration corresponding to the pass gates 1407-1 and 1407-2 and the swap transistors 1442 both being in a conducting condition is not reflected in the logic table of FIG. 15 since this results in the sense lines being shorted together.

Via selective control of the continuity of the pass gates 1407-1 and 1407-2 and the swap transistors 1442, each of the three columns of the first set of two rows of the upper portion of the logic table of FIG. 15 can be combined with each of the three columns of the second set of two rows below the first set to provide 3×3=9 different result combinations, corresponding to nine different logical operations, as indicated by the various connecting paths shown at 1575. The nine different selectable logical operations that can be implemented by the sensing circuitry 1450 are summarized in the logic table illustrated in FIG. 15.

The columns of the lower portion of the logic table illustrated in FIG. 15 show a heading 1580 that includes the state of logic selection control signals. For example, the state of a first logic selection control signal is provided in row 1576, the state of a second logic selection control signal is provided in row 1577, the state of a third logic selection control signal is provided in row 1578, and the state of a fourth logic selection control signal is provided in row 1579. The particular logical operation corresponding to the results is summarized in row 1547.

As such, the sensing circuitry shown in FIG. 14 can be used to perform various logical operations as shown in FIG. 15. For example, the sensing circuitry 1450 can be operated to perform various logical operations (e.g., AND and OR logical operations) in association with comparing data patterns in memory in accordance with a number of embodiments of the present disclosure.

The present disclosure includes devices and methods for determining a data storage layout. An example apparatus comprising a first address space of a memory array comprising a first number of memory cells coupled to a plurality of sense lines and to a first select line, the first address space storing a logical representation of a first portion of a first value. The example apparatus also comprising a second address space of the memory array comprising a second number of memory cells coupled to the plurality of sense lines and to a second select line, the second address space storing a logical representation of a second portion of the first value. The example apparatus also comprising sensing circuitry configured to receive the first value and perform a logical operation using the first value without performing a sense line address access.

Although specific embodiments have been illustrated and described herein, those of ordinary skill in the art will appreciate that an arrangement calculated to achieve the same results can be substituted for the specific embodiments shown. This disclosure is intended to cover adaptations or variations of one or more embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the one or more embodiments of the present disclosure includes other applications in which the above structures and methods are used. Therefore, the scope of one or more embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A system for storing data elements comprising:
    a memory device configured to execute instructions to store a plurality (M) of data elements in a memory array in accordance with a determined particular data element storage layout;
    wherein the determination of the particular data element storage layout is based, at least partially, on:
        a type of a quantity (L) of logical operations to be performed, in parallel, on the plurality (M) of data elements; and
        a quantity of compute components coupled to the memory array; and
        wherein each of the plurality (M) of data elements is a data value represented by a number of bits.

2. The system of claim 1, wherein the determination of the particular data element storage layout is based, at least partially, on a quantity (N) of bits of each of the plurality (M) of data elements.

3. The system of claim 2, wherein the determination of the particular data element storage layout is made by one of:
    the memory device; and
    a host coupled to the memory device; and
    wherein the particular data element storage layout is determined to be a horizontal data element layout in response to the quantity (L) of logical operations being less than or equal to the quantity of compute components divided by the quantity (N) of bits of each of the plurality (M) of data elements.

4. The system of claim 2, wherein the determination of the particular data element storage layout is made by one of:
    the memory device; and
    a host coupled to the memory device; and
    wherein the particular data element storage layout is determined to be a vertical data element layout in response to the quantity (L) of logical operations being greater than the quantity of compute components.

5. The system of claim 1, wherein the memory device is further configured to perform the logical operations in parallel without performing a sense line address access, and wherein the particular data element layout maximizes a quantity of the compute components used in performing the logical operations.

6. The system of claim 1, wherein the memory device is further configured to determine the particular data element storage layout based, at least partially, on a direction of data movement associated with performing the type of the quantity (L) of logical operations.

7. The system of claim 6, wherein the memory device is coupled to a host comprising one or more processors.

8. A system comprising:
    a first address space of a memory array comprising a first number of memory cells coupled to a plurality of sense lines and to a first select line, wherein the first address space is configured to store a logical representation of a first portion of a data element, wherein the data element is a data value represented by a number of bits;
    a second address space of the memory array comprising a second number of memory cells coupled to the plurality of sense lines and to a second select line, wherein the second address space is configured to store a logical representation of a second portion of the data element; and
    a controller configured to control sensing circuitry coupled to the memory array to perform a logical operation using the logical representations of the first and second portions of the data element, wherein the logical representations of the first and second portions of the data element are each a quantity of bits of the data element.

9. The system of claim 8, wherein the data element comprises a first data element and the memory array further comprises:
    a third address space of the memory array comprising a third number of memory cells coupled to the plurality of sense lines and a third select line, wherein the third address space is configured to store a logical representation of a first portion of a second data element; and
    a fourth address space of the memory array comprising a fourth number of memory cells coupled to the plurality of sense lines and a fourth select line, wherein the fourth address space is configured to store a logical representation of a second portion of the second data element.

10. The system of claim 9, wherein the sensing circuitry is further controlled to perform the logical operation by:
    performing a first portion of the logical operation using the logical representation of the second portion of the first data element and the logical representation of the second portion of the second data element; and
    performing a second portion of the logical operation using the logical representation of the first portion of the first data element, the logical representation of the first portion of the second data element, and a result of the first portion of the logical operation.

11. The system of claim 10, wherein the sensing circuitry is further controlled to perform the logical operation by:
    performing the first portion of the logical operation using, as input, each of a first number of bits from the logical representation of the second portion of the first data element and an associated second number of bits from the logical representation of the second portion of the second data element; and performing the second portion of the logical operation using, as input, each of a third number of bits from the logical representation of the first portion of the first data element and an associated fourth number of bits from the logical representation of the first portion of the second data element, and the result of the first portion of the logical operation.

12. The system of claim 11, wherein the first number of bits are associated with the second number of bits and the third number of bits are associated with the fourth number of bits when the first number of bits and the second number of bits are stored in memory cells that are coupled to a same sense line from the plurality of sense lines.

13. The system of claim 10, wherein the controller is located on a memory device coupled to a host of the system.

14. The system of claim 13, wherein a result of the first portion of the logical operation includes a carry but, and wherein the carry bit is moved from a first compute component associated with the second portion of the logical operation to a second compute component associated with the first portion of the logical operation.

15. A method, comprising:
   determining a data element storage layout for a plurality (M) of data elements to be stored in a memory array, wherein each data element is a bit-vector and wherein the data storage layout is based, at least partially, on:
      a quantity of logical operations to be performed in parallel;
      a quantity of compute components coupled to the memory array; and
      a bit length (N) of the bit vector;
   responsive to determining the data element storage layout is of a first type, storing a logical representation of each of the M data elements in memory cells of the memory array that are coupled to a sense line and to a number of select lines;
   responsive to determining the data element storage layout is of a second type, storing the logical representation of each of the M data elements in memory cells of the memory array that are coupled to a number of sense lines and to a select line;
   responsive to determining the data element storage layout is of a third type, storing the logical representation of each of the M data elements in memory cells of the memory array that are coupled to the number of sense lines and to the number of select lines; and
   wherein each of the plurality (M) of data elements is a data value represented by a number of bits.

16. The method of claim 15, wherein the first type of data element storage layout is a vertical data element storage layout, the second type of data element storage layout is a horizontal data element storage layout, and the third type of data element storage layout is a hybrid data element storage layout.

17. The method of claim 15, further comprising determining first and second threshold quantities of logical operations to be performed in parallel based on:
   the bit length (N); and
   the quantity of compute components coupled to the memory array.

18. The method of claim 17, wherein determining the first threshold quantity of logical operations includes:
   dividing the quantity of compute components coupled to the memory array by the bit length (N);
   setting the first threshold quantity of logical operations equal to a result of the division.

19. The method of claim 17, wherein determining the first threshold quantity of logical operations includes:
   dividing the quantity of compute components coupled to the memory array by the bit length (N);
   setting the first threshold quantity of logical operations equal to a result of the division.

20. The method of claim 15, wherein the method includes:
   determining the data element storage layout on a host coupled to a memory device comprising the memory array; and
   providing the determined data element storage layout to a controller of the memory device.

* * * * *